US006908728B2

(12) United States Patent
Endo et al.

(10) Patent No.: US 6,908,728 B2
(45) Date of Patent: Jun. 21, 2005

(54) LASER MARKING ON PHOTOSENSITIVE MATERIAL AND PHOTOSENSITIVE MATERIAL INCLUDING THE MARKING

(75) Inventors: Keisuke Endo, Shizuoka-ken (JP); Hiroyuki Nishida, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 42 days.

(21) Appl. No.: 10/413,584

(22) Filed: Apr. 15, 2003

(65) Prior Publication Data

US 2003/0224256 A1 Dec. 4, 2003

(30) Foreign Application Priority Data

| | | |
|---|---|---|
| Apr. 15, 2002 | (JP) | 2002-111938 |
| Jul. 18, 2002 | (JP) | 2002-209155 |
| Aug. 29, 2002 | (JP) | 2002-250202 |
| Sep. 3, 2002 | (JP) | 2002-257534 |
| Sep. 5, 2002 | (JP) | 2002-259750 |

(51) Int. Cl.[7] ................ G03F 7/004

(52) U.S. Cl. ................ 430/292; 430/9; 430/270.1; 430/271.1; 430/945

(58) Field of Search ................ 430/9, 801, 945, 430/270.1, 271.1, 292

(56) References Cited

U.S. PATENT DOCUMENTS 4,847,183 A * 7/1989 Kruger ................ 430/322

FOREIGN PATENT DOCUMENTS

| | | |
|---|---|---|
| JP | 59-5097 | 1/1984 |
| JP | 59-19253 | 1/1984 |
| JP | 10-305377 | 11/1998 |
| JP | 3191201 | 5/2001 |

* cited by examiner

*Primary Examiner*—Amanda Walke
(74) *Attorney, Agent, or Firm*—Sughrue Mion, PLLC

(57) ABSTRACT

By irradiating a laser beam onto an X-ray film that includes a support layer having disposed thereon an emulsion layer, the emulsion layer is melted, numerous minute air bubbles are generated in the emulsion layer, and the emulsion layer becomes convex, whereby a visible dot pattern is formed. The irradiation time and wavelength of the laser beam are selected so that separation is not generated between the support layer and the emulsion layer. By defocusing and irradiating the laser beam, the X-ray film may substantially uniformly receives energy of the laser beam. Moreover, an undersurface layer may also be formed, and the laser beam may be irradiated onto the undersurface layer to form a dot pattern on the undersurface layer. A device and a method for forming a marking pattern representing identification information on a rolled photosensitive material and cutting the photosensitive material into sheets are disclosed.

29 Claims, 30 Drawing Sheets

| IRRADIATION TIME (μsec) | IRRADIATION OF LASER WITH 9.3 μm TO 9.6 μm WAVELENGTH | EVALUATION OF VISIBILITY | IRRADIATION TIME (μsec) | IRRADIATION OF LASER WITH 10.6 μm WAVELENGTH | EVALUATION OF VISIBILITY |
|---|---|---|---|---|---|
| 1~5 |   | ○ | 1~5 |   | × |
| 6~10 |   | ◎ | 5~8 |   | ○ |
| 11~15 |   | ◎ | 9~18 |   | ◎ |
| 16~ |   | × | 19~ |   | × |

| IRRADIATION TIME (μsec) | IRRADIATION OF LASER WITH 9.3 μm TO 9.6 μm WAVELENGTH | EVALUATION OF VISIBILITY | IRRADIATION TIME (μsec) | IRRADIATION OF LASER WITH 10.6 μm WAVELENGTH | EVALUATION OF VISIBILITY |
|---|---|---|---|---|---|
| 1~5 |  | ○ | 1~5 |  | × |
| 6~10 |  | ◎ | 5~8 |  | ○ |
| 11~15 |  | × | 9~18 |  | × |
| 16~ |  | × | 19~ |  | × |

12
16
14
16A
16A
WD<WDo
WD = WDo
WD > WDo

FIG. 27A
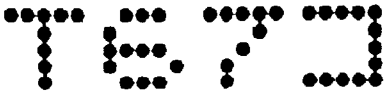
MPa(MP)
FIG. 27B
MPb(MP)
FIG. 27C
MPc(MP)
FIG. 27D
MPd(MP)

LASER MARKING ON PHOTOSENSITIVE MATERIAL AND PHOTOSENSITIVE MATERIAL INCLUDING THE MARKING

BACKGROUND OF THE INVENTION

1. Field of the Invention

The present invention relates to a laser marking method for irradiating a laser beam onto a photosensitive material, i.e., a photographic photosensitive material such as an X-ray film or a thermally-developed photosensitive material, to form thereon a marking pattern, such as characters and symbols.

The present invention also relates to a photosensitive material having a marking pattern formed thereon and to a laser marking method for irradiating a laser beam from a laser onto an emulsion layer of a photosensitive material, in which an emulsion layer is formed on a surface of a base layer, to form thereon dot patterns in which the emulsion layer is thermally melted and deformed, whereby a marking pattern including visible characters or symbols is formed by a combination of the dot patterns.

The present invention also relates to a laser marking method that enables a one-dimensional barcode to be formed as a marking pattern.

The present invention also relates to a laser marking method for forming a marking pattern on a one-sided type photosensitive film, in which a surface layer including an emulsion layer is formed on one side of a support, such as PET, and an undersurface layer is formed on the other side.

Moreover, the present invention relates to a photosensitive material processing method for processing a photosensitive material from a roll into sheets of a predetermined size, and to a processed photosensitive material.

2. Description of the Related Art

As technology for marking characters and symbols onto a surface of a material using laser light, there is, for example, the technology disclosed in Japanese Patent Application Laid-Open Publication (JP-A) No. 10-305377. Also, in Japanese Patent No. 3191201 (referred to below as "prior art"), marking technology has been proposed in which a laser beam is irradiated onto a photosensitive material such as an X-ray film, dots are formed by causing fogging and deformation in a surface of the photosensitive material, and characters and symbols are formed by the dot arrangement.

In this prior art, the laser irradiation time (pulse width) per dot is set to at least 30 $\mu$sec or more in order to cause deformation or thermal fogging in order to raise visibility.

However, in relation to dot plotting, there exist no guidelines for dot forms and processing methods in order to obtain marking (characters or symbols) with good visibility. With respect to laser beam irradiation conditions, it has been necessary to experimentally determine irradiation target materials, laser types, and oscillation wavelengths as parameters.

There are also variations in the results of these experiments depending on the person judging visibility, management of conditions of laser irradiation devices cannot be done quantitatively (numerically), and it has been difficult to conduct stable marking.

In the case of an X-ray film, the original quality of the X-ray film is sometimes compromised by laser irradiation, in that the emulsion layer that has been scattered on the surrounding area by laser irradiation adheres to the film surface, the film is burned by the laser being irradiated again onto the portions to which the emulsion layer adheres, thermal fogging and light fogging are generated, and an image is formed while adhering to the emulsion layer surface, whereby those portions are whitely omitted (so-called white spots).

In order to eliminate these problems, it is best to conduct irradiation so that the emulsion layer does not scatter. However, even when scattering cannot be seen immediately after marking by laser irradiation, sometimes emulsion layer portions are separated in subsequent steps such as development. This is a phenomenon that can occur in a state in which a space has been generated between the emulsion layer and the base layer. Such separation exerts an enormous influence on visibility and leads to differences in evaluation, in which the film is deemed to be improper in an evaluation of visibility by a user, regardless of whether the film was deemed to be proper in an evaluation of visibility at the manufacturing stage.

Also, when characters and symbols are marked on a photosensitive material such as an X-ray film, a spot laser beam is irradiated onto the emulsion layer of the photosensitive material. Thus, minute air bubbles are generated in a process in which gelatin included in the emulsion layer and the like is melted by energy of the laser beam, whereby convex portions are formed. These convex portions become dots that are visible due to reflection of light being varied by numerous boundary films between the air bubbles, and characters and symbols are formed as a marking pattern by the arrangement of these dots.

In a photosensitive material such as X-ray film, sometimes the emulsion layer melted by the laser beam scatters on the area surrounding the irradiation position of the laser beam. When the scattered emulsion layer adheres to the surface of the photosensitive material, sometimes so-called white spots are generated when an image is formed at the portion to which the scattered emulsion layer adheres.

Also, when the laser beam is continuously irradiated, sometimes the scattered emulsion layer is burned by the laser beam and generates fogging. Such fogging lowers the product quality of the photosensitive material.

Moreover, in an X-ray film in which a PET support is used as a base layer and an emulsion layer is formed on the base layer, sometimes it becomes easy for the emulsion layer to separate from the base layer when the laser beam is irradiated and dots are formed. When it becomes easy for the emulsion layer to separate from the base layer, although visibility of the dots becomes high immediately after the dots have been formed, the emulsion layer separates and drops away from the base layer and visibility becomes extremely low when the film is developed. That is, when it becomes easy for the emulsion layer to separate from the base layer due to irradiation of the laser beam, sometimes the visibility of the characters and symbols formed on the X-ray film varies prior to and after development.

Although the aforementioned prior art proposes to secure visibility by limiting the irradiation conditions of the laser beam per dot, it offers no proposals for preventing troubles in quality resulting from irradiating the laser beam onto the photosensitive material and preventing variations in visibility prior to and after development.

Also, in the prior art, a laser beam oscillated at a low output is used in order to impart to the photosensitive material energy for forming proper dots. However, when a low-output laser is used, it takes time to impart the energy necessary to form the dots. That is, sometimes it becomes necessary to irradiate the laser beam for a long time, and when the laser beam is irradiated for a long time, sometimes heat is transmitted to the interior of the photosensitive material and causes the emulsion layer to separate from the base layer. Thus, sometimes variations in the visibility of the characters and symbols prior to and after development are caused.

When highly visible dots are formed on the X-ray film, it is necessary for the diameter of the dots to be of a predetermined value or higher. Thus, the prior art proposes forming highly visible dots by appropriately controlling the irradiation time of the laser beam. Also, setting the intervals between the dots to be within a predetermined range, it is possible to raise the visibility of the characters and symbols formed by the dot arrangement.

When the laser beam is irradiated onto the X-ray film and dots are formed, sometimes a space is generated between the base layer and the emulsion layer. Although this space improves the visibility of the dots immediately after the dots (marking pattern) have been formed on the X-ray film, the emulsion layer above the space separates from the base layer and the visibility of the dots is lowered. That is, the space generated between the base layer and the emulsion layer lowers the visibility of the dots at the stage when the film is used by a user.

Thus, when a laser beam is irradiated onto a photosensitive material such as an X-ray film and a marking pattern is formed, dot forms in which there are no variations in visibility between the stage when the dots are formed and from subsequent processing steps on are preferable.

Configurations in which various information is imparted by a marking pattern formed on a photosensitive material such as an X-ray film by a dot arrangement have been variously proposed.

An example of a symbol representing various information in place of characters and symbols is the barcode. So-called one-dimensional barcodes, which represent characters and symbols by a combination of lines of varying thickness and spaces, are common. By using this barcode, a large amount of information can be recorded in a limited space. Moreover, by automatically reading this information using a barcode reader in processing steps of the X-ray film, appropriate processing of the X-ray film based on the information recorded as a marking pattern becomes possible.

When a barcode is recorded on a photosensitive material such as an X-ray film using a spot laser beam emitted from a marking head, it is necessary to stop the conveyance of the X-ray film or to move the marking head to match the conveyance speed of the X-ray film.

That is, when a bar (line), and not dots, is formed on the X-ray film using a spot laser beam, it is necessary to irradiate the laser beam in a state in which the X-ray film has been relatively stopped with respect to the marking head.

However, when a barcode is recorded as the marking pattern at predetermined intervals on a rolled X-ray film, problems arise in that the time necessary to record the marking pattern becomes long when the conveyance of the X-ray film is stopped, processing time of the photosensitive material such as the X-ray film becomes long, and processing efficiency drops.

Also, when characters and symbols are marked on a photosensitive material such as an X-ray film, a spot laser beam is irradiated onto the side of the photosensitive material disposed with the emulsion layer. In this instance, it is possible to form highly visible dots by properly controlling the irradiation time of the laser beam.

When a laser beam is irradiated onto a photosensitive material and marking is conducted, sometimes dust generated at the time of processing and emulsion layer separated by irradiating the laser beam onto the photosensitive material adheres to the surface of the photosensitive material. When the laser beam is irradiated onto the photosensitive material in a state in which dust and separated emulsion layer (emulsion waste) adhere to the surface of the photosensitive material, the dust and the emulsion layer are burned by the energy of the laser beam and cause fogging in the photosensitive material. Also, when an image is exposed on the photosensitive material in a state in which the emulsion layer and the like adhere to the photosensitive material, so-called white spots are generated when the photosensitive material is developed.

However, it is necessary to conduct marking in an environment in which a high degree of cleanliness is maintained in order to prevent dust in the air from adhering to the surface of the photosensitive material at the time of marking, and this is extremely difficult in terms of cost and the environment in which the device is disposed.

Also, in the field of medicine, reducing the amount of processing fluid waste are desired from the standpoints of environmental safety and space efficiency. Thus, light photosensitive thermally-developed photosensitive materials for medical diagnoses and photographic technology in which a clear black color image having high resolution and sharpness can be formed by efficiently exposing the photosensitive material using a laser image setter or a laser imager have been proposed, and thermal-development systems that are simple and do not harm the environment have attracted attention.

Such light photosensitive thermally-developed photosensitive materials are photosensitive films in which layer that includes a photosensitive silver halide, a non-photosensitive organic silver salt, a thermal developing agent, and a binder is formed as a so-called emulsion layer on one side of a PET support, and have the property that the side disposed with the emulsion layer is easily damaged.

Thus, when laser processing is conducted and dust generated at the time of the laser processing and emulsion waste adheres to light photosensitive thermally-developed materials, there are problems in that, not only is fogging easily generated, but the surface is easily damaged by the dust and the emulsion waste.

With respect to sheets of photosensitive material such as an X-ray film, the photosensitive material is formed into sheets of a size that becomes a final mode by slitting and cutting a roll in which a wide and long photosensitive material is wound in a roll. Numerous sheets of the photosensitive material that has been processed into the sheets, which is the final mode, are stacked and packaged by a packaging material or accommodated in a magazine and packaged.

As a method of identifying sheets of the image recording material such as photosensitive material, proposals for adding identification information to each package unit have been made, such as affixing labels on which identification information is recorded to the packages in which the image recording material is packaged or to the magazine, or recording identification information on the image recording material of the bottommost layer among the stacked image recording material. Thus, it becomes easy to identify (specify) the image recording material in a single package unit and to grasp various information, and by automatic reading of the identification information, it becomes possible to clearly verify whether or not the image recording material is suited for the purpose of its use when the image recording material is to be used.

However, in these proposals, the labor for affixing the labels on which the identification information is recorded to the packaging material or to the magazine relies upon manual labor. Thus, there is the potential for a laborer to forget to affix the labels or erroneously affix the labels. When a laborer forgets to affix the labels or erroneously affixes the labels, it becomes impossible to judge whether or not the image recording material is of a type suited for the purpose of its use. Particularly when the identification information is automatically read and a laborer has forgotten to affix the labels or erroneously affixed the labels, sometimes the image recording material in a package unit is wasted. That is, when trouble arises with the image recording material, it becomes difficult to specify the image recording material, and it also becomes impossible to investigate the cause of the trouble without being able to trace the processing history.

Also, when identification information is burned in advance on the bottommost layer of the stacked image recording material, it is necessary to leave the image recording material on which the identification information is recorded until the very last. Because the identification information is not recorded on the other image recording material, identification becomes difficult when the image recording material on which the identification information is not recorded is removed from the package unit.

SUMMARY OF THE INVENTION

In consideration of the above-described facts, it is an object of the invention to obtain a photosensitive material and a laser marking method with which visibility can be quantitatively judged, that can maintain original improvements in image quality of a photosensitive material, and that can improve visibility of a dot pattern.

It is another object of the invention to propose a laser marking method that can form a marking pattern that has high visibility on a photosensitive material such as an X-ray film and in which there are no changes in visibility in processing in subsequent steps, i.e., no changes in visibility prior to and after development.

It is yet another object of the invention to propose a laser marking method that can efficiently form a barcode as a marking pattern on a photosensitive material.

It is yet another object of the invention to propose a laser marking method that prevents finished image quality of a photosensitive film, such as a thermally-developed photosensitive material and an X-ray film, from being lowered by dust or emulsion waste when conducting marking with a laser beam.

It is still another object of the invention to propose a photosensitive material and a photosensitive material processing method with which brand (product class) information and processing information are clear when a photosensitive material are processed into sheets of a predetermined size from a roll.

A first aspect of the invention is a laser marking method for forming a visible marking pattern on a photosensitive material, the method comprising the steps of: supplying a photosensitive material comprising a base layer having formed on a surface thereof an emulsion layer; irradiating a laser beam onto the emulsion layer to thereby generate air bubbles inside the emulsion layer; and stopping the irradiation of the laser beam at a point in time when the emulsion layer has become convex due to the generation of the air bubbles, whereby a convex dot pattern including plural minute air bubbles inside the emulsion layer is formed on the photosensitive material.

According to the first aspect of the invention, an irradiation time of the laser is set so that the dot pattern is formed, the emulsion layer becomes convex, and minute air bubbles are formed inside the convex dot pattern. The air bubbles may be independent air bubbles or continuous air bubbles, and the basic boundary portions (partition walls) thereof caused diffuse reflection so that a highly visible dot pattern can be formed.

The above aspect may include a step for controlling the irradiation time of the laser beam so that a height of the convex dot pattern formed on the surface of the emulsion layer of the photosensitive material is 10 $\mu$m or less from the surface and the minute air bubbles numerously formed inside the convex dot pattern have a diameter of 1 to 5 $\mu$m.

In the above aspect, the convex dot pattern is formed on the emulsion layer, and the degree of convexity is 10 $\mu$m or less using the upper surface of the emulsion layer of the photosensitive material as a reference. Also, the plural minute air bubbles are formed inside the convex dot pattern. Because each air bubble has a diameter of 1 to 5 $\mu$m and is generated in a process in which the emulsion layer expands due to the irradiation time of the laser beam, the irradiation time of the laser beam may be set using the above numerical value as a reference. Boundary portions (partition walls) between the air bubbles cause diffuse reflection so that a highly visible dot pattern can be formed.

In the above aspect, the dot pattern can be formed so that a space is not generated at a boundary between the base layer and the emulsion layer in which the convex dot pattern is formed.

After the air bubbles have been formed in the process of irradiation of the laser beam by the laser, the emulsion layer is likely to separate from the base layer and a space is generated between the base layer and the emulsion layer. Although this space causes diffuse reflection similar to the minute air bubbles, whereby visibility is improved immediately after the formation of the dot pattern, the convex dot pattern itself is separated in post-processing (e.g., when the photosensitive material is developed, etc.), which results in visibility being lowered when a user uses the photosensitive material. Thus, the irradiation time of the laser beam is controlled (i.e., thermal energy is not excessively imparted) so that there is no space at the boundary between the base layer and the emulsion layer in which the convex dot pattern is formed, whereby changes in visibility prior to and after post-processing are prevented. Also, by preventing the convex dot pattern from separating, the emulsion layer does not adhere to the surface of the photosensitive material, and an image quality that is the original quality of the photosensitive material can also be prevented from lowering.

In an embodiment of the above aspect, it is preferable to set an oscillation wavelength of the laser beam to be from 9.2 $\mu$m to 9.8 $\mu$m.

The 9.2 $\mu$m to 9.8 $\mu$m oscillation wavelength of the laser beam is, in contrast to the oscillation wavelength of commercially available $CO_2$ lasers (about 10.6 $\mu$m), not a commonly used wavelength band. However, by selecting this wavelength band, a desired dot pattern form can be formed in an irradiation time of a relatively wide range, and control of the laser beam can be simplified.

A second aspect of the invention is a photosensitive material including a base layer and an emulsion layer disposed on a surface of the base layer, wherein a visible dot pattern is formed on the emulsion layer by irradiating a laser beam onto the emulsion layer, the dot pattern being convexly formed with a height of 10 $\mu$m or less from a surface of the emulsion layer and minute air bubbles having a diameter of 1 to 5 μm being numerously formed therein.

According to the second aspect of the invention, the dot pattern is the convexly formed emulsion layer, and the degree of convexity thereof is the thickness of the photosensitive material +10 μm or less. Also, the plural minute air bubbles are formed inside the dot pattern. Because each air bubble has a diameter of 1 to 5 μm and is generated in a process in which the emulsion layer expands due to the irradiation of the laser beam, the irradiation time of the laser beam is set using the above numerical value as a reference. Boundary portions (partition walls) between the air bubbles cause diffuse reflection so that a highly visible dot pattern can be formed.

In the second aspect, with respect to the photosensitive material, the dot pattern may be formed so that a space is not generated at the boundary between the base layer and the emulsion layer in which the convex dot pattern is formed.

After the air bubbles have been formed in the process of irradiation of the laser beam by the laser, the emulsion layer separates from the base layer and a space is generated between the base layer and the emulsion layer. Although this space causes diffuse reflection similar to the minute air bubbles, whereby visibility is improved immediately after the formation of the dot pattern, the convex dot pattern itself is separated in subsequent processing (e.g., when the photosensitive material is developed, etc.), which results in visibility being lowered when a user uses the photosensitive material. Thus, the irradiation time of the laser beam is controlled (i.e., thermal energy is not excessively imparted) so that there is no space at the boundary between the base layer and the emulsion layer in which the convex dot pattern is formed, whereby changes in visibility prior to and after subsequent processing are prevented. Also, by preventing the convex dot pattern from separating, the emulsion layer does not adhere to the surface of the photosensitive material, and lowering of image quality can also be prevented.

A third aspect of the invention is a laser marking method for forming a visible marking pattern comprising a dot arrangement on a photosensitive material, the method comprising the steps of: supplying a photosensitive material comprising a support having formed on at least one side thereof an emulsion layer; setting a laser oscillator so that it is capable of irradiating a laser beam onto the emulsion layer; using the laser oscillator to irradiate the laser beam in a spot onto the emulsion layer to impart a predetermined amount of energy to the photosensitive material, wherein numerous air bubbles are generated inside the emulsion layer by the predetermined amount of energy being imparted within a predetermined time, to thereby form visible dots.

According to the above aspect, the laser beam is irradiated in a spot onto the photosensitive material, whereby the dots are formed by the minute air bubbles generated by the process by which the emulsion layer of the photosensitive material melts, and the marking pattern is formed by the dot arrangement. Also, in the invention, a marking pattern in which there are no changes in visibility resulting from development of the photosensitive material is formed by imparting, to the photosensitive material with the laser beam, energy with which proper dots that have high visibility and in which there is little change in visibility prior to and after development of the photosensitive material can be formed.

The energy imparted to the photosensitive material by the laser beam varies due to the oscillation output of the laser oscillator and the irradiation time of the laser beam. Also, by lengthening the irradiation time of the laser beam, the heat of the laser beam is transmitted to the interior of the photosensitive material and a space that causes the emulsion layer to separate when the photosensitive material is developed is generated between the support and the emulsion layer.

Thus, the irradiation time of the laser beam is set to a time in which the space is not generated between the support and the emulsion layer, and laser oscillator of an oscillation output that can impart a predetermined energy to the photosensitive material within this time is used.

That is, the irradiation time of the laser beam is shortened using laser oscillator of a high output.

Thus, dots whose visibility is high and in which there is little change in visibility resulting from development of the photosensitive material, and a marking pattern resulting from the dot arrangement, can be formed on the photosensitive material.

The predetermined time that is the irradiation time of the laser beam in the invention is set on the basis of the photosensitive material and the wavelength of the laser beam oscillated by the laser oscillator.

That is, the energy of the laser beam than can form proper dots on the photosensitive material differs according to the oscillation wavelength of the laser beam and differs according to the photosensitive material.

Thus, the irradiation time is set on the basis of the photosensitive material and the oscillation wavelength of the laser beam, and laser oscillator of a high output is used so that the actual irradiation time becomes shorter than this time.

The third aspect is also characterized in that the laser beam is scanned by the scanning system and irradiated onto the photosensitive material to form the dot arrangement of the marking pattern.

According to the third aspect, the oscillation output of the laser oscillator is increased and the irradiation time of the laser beam for forming one dot is shortened, whereby it becomes possible to form numerous dots in a short time.

Thus, the laser beam is scanned by the scanning system, and numerous dots are formed using one laser oscillator.

Thus, the marking pattern can be formed by the dot arrangement without using numerous laser oscillator, and it becomes possible to make the marking device compact.

A fourth aspect of the invention for achieving the above-described objects is a laser marking method for forming a marking pattern on a photosensitive material by irradiating a laser beam onto the photosensitive material, the method comprising the steps of: conveying a photosensitive material in a predetermined conveyance direction; disposing a laser oscillator and a condenser so as to condense a laser beam emitted from the laser oscillator into a spot on a surface of the conveyed photosensitive material; and irradiating the laser beam through the condenser onto the photosensitive material so that the surface of the photosensitive material is positioned further away from the laser oscillator than a focal point of the laser beam converged by the condenser, whereby the marking pattern is formed on the photosensitive material.

According to the fourth aspect, the photosensitive material is defocused and disposed with respect to the focal position of the laser beam, and the laser beam is irradiated. By defocusing the laser beam, the energy in the spot when the laser beam is irradiated onto the photosensitive material becomes substantially even. Thus, it is possible to prevent the energy from being transmitted to the interior due to the energy of the laser beam partially increased and generating a space between the base layer and the emulsion layer.

Thus, visibility is high, and it is possible to prevent visibility from being greatly lowered even in processing steps such as development with respect to the photosensitive material.

The fourth aspect is also characterized in that, while the photosensitive material is conveyed at a predetermined speed so as to pass a predetermined position further distanced from the laser oscillator than the focal position of the laser beam resulting from the condenser, the laser beam is irradiated while being scanned by the scanning mechanism along a width direction substantially orthogonal to the conveyance direction of the photosensitive material, to thereby form the marking pattern.

According to the fourth aspect, the photosensitive material is defocused and disposed so as to be distanced from the focal position of the laser beam, and the laser beam is irradiated onto the photosensitive material. By defocusing the laser beam towards a direction distanced from the focal position thereof, the dot diameter formed on the photosensitive material is widened, whereby it is possible to form the dots continuously in a bar by forming the dots at predetermined intervals.

At this time, because the dots can be formed in a long oval shape along the conveyance direction of the photosensitive material by irradiating the laser beam while the photosensitive material is conveyed, the fatness of the dots when the dots are formed continuously in a bar can be made fatter.

Thus, it becomes possible to form a bar of a barcode as the marking pattern on the photosensitive material.

The fourth aspect is also characterized in that the laser oscillator irradiates the laser beam onto the photosensitive material at predetermined intervals along the conveyance direction of the photosensitive material.

In the fourth aspect, bar-like dots can be formed at predetermined intervals along the conveyance direction of the photosensitive material.

Thus, the fatness of each bar, such as in a custom code and PostNet, is the same, and it becomes possible to form on the photosensitive material barcodes whose length and read positions are different.

A fifth aspect of the invention is a laser marking method for forming a marking pattern on a photosensitive material, the method comprising the steps of: supplying a photosensitive material comprising a support, a surface layer including an emulsion layer formed on one side of the support, and an undersurface layer formed on another side of the support to prevent diffuse reflection of light transmitted through the emulsion layer; and irradiating a laser beam in a sport onto the undersurface layer of the photosensitive material to generate air bubbles in the undersurface layer, whereby the marking pattern is formed on the undersurface layer of the photosensitive material.

According to the fifth aspect, when the laser beam is irradiated onto the photosensitive film, which is a one-sided photosensitive material, and the dots or the marking pattern resulting from the dot arrangement is formed, the laser beam is irradiated onto the undersurface layer and not onto the surface layer on which the emulsion layer is formed.

The one-sided photosensitive film comprises the support, the surface layer on which the emulsion layer is formed and that is disposed on one side of the support, and the undersurface layer that is formed on the other side of the support and is formed by a layer that prevents diffuse reflection of light and layer that protects this layer. Similar to the emulsion layer, the undersurface layer includes gelatin, and the undersurface layer is also melted by the laser beam by the laser beam being irradiated. The dots are formed in the undersurface layer by the numerous air bubbles generated in the melting process of the undersurface layer, whereby it is possible to form dots having the same visibility as those formed on the surface layer in which the emulsion layer is included.

Also, because the laser beam is irradiated onto the undersurface layer and not the surface layer when the photosensitive film is marked, emulsion waste is not scattered by the laser beam and does not adhere to the surface layer, fogging is not generated even when dust and the like is burned by the laser beam, and the finished quality of the product is not lowered.

Moreover, although the emulsion layer of the surface layer is often different in photosensitive films, the undersurface layer often has the same configuration. Thus, proper marking is possible with the same irradiation time even when it is conducted with respect to brands of photosensitive films in which the emulsion layer of the surface layer is different.

In the fifth aspect, the marking pattern formed on the undersurface layer may be a mirror image of an intended pattern.

According to the fifth aspect, the laser beam is irradiated so that a mirror image of the marking pattern is formed on the undersurface layer when characters and symbols are formed as the marking pattern.

Thus, because a normal image of the marking pattern is obtained when seen from the surface layer of the photosensitive film, it becomes possible to precisely identify whether or not the side viewed is the surface layer on which the emulsion layer is formed.

In the fifth aspect, it is preferable to use a laser beam having a wavelength that has low transmittance at the undersurface layer. Thus, because the efficiency of the absorption of energy at the undersurface layer becomes high, the irradiation time of the laser beam can be shortened and marking can be conducted efficiently.

A sixth aspect of the invention is a photosensitive material processing method for cutting a photosensitive material wound in a roll into a predetermined size to make sheets, the method comprising the steps of: pulling the photosensitive material out from a roll of the photosensitive material and conveying the photosensitive material along a predetermined path; irradiating a laser beam onto a recording position that is a predetermined distance from a position at which the conveyed photosensitive material is to be cut, to thereby form, on the photosensitive material, a marking pattern including identification information specifying the photosensitive material; and cutting the photosensitive material to a predetermined length along the conveyance path.

In this method, the photosensitive material may be cut per conveyance of a predetermined length along the conveyance path. Moreover, this method may also include the step of cutting the photosensitive material to a predetermined width with respect to a width direction orthogonal to a conveyance direction. The recording position is also a predetermined distance from a position at which the photosensitive material is to be cut in the width direction. The method can also include the step of measuring a conveyance amount of the photosensitive material, with the recording position being calculated on the basis of the measurement result. The conveyance amount is measured based on conveyance of the photosensitive material after cutting.

Another aspect of the invention is a photosensitive material processing device for cutting a photosensitive material wound in a roll into a predetermined size to make sheets, the device comprising: a conveyance mechanism for pulling the photosensitive material out from a roll of the photosensitive material and conveying the photosensitive material along a predetermined path; a laser beam oscillator for irradiating a laser beam onto the photosensitive material, the laser beam oscillator being disposed at a predetermined position on the conveyance path and forming, on the photosensitive material, a marking pattern including identification information specifying the photosensitive material by irradiating the laser beam onto a recording position that is a predetermined distance from a position at which the conveyed photosensitive material is to be cut; and a cutter for cutting the photosensitive material to a predetermined length along the conveyance path.

This device may also include a slitter for slitting the photosensitive material to a predetermined width with respect to a width direction orthogonal to a conveyance direction. The recording position is also a predetermined distance from a position at which the photosensitive material is to be cut in the width direction.

The photosensitive material processing device may also include a measuring instrument for measuring a conveyance amount of the photosensitive material, with the recording position being calculated on the basis of the measurement result.

Still another aspect of the invention is a photosensitive material, in which a photosensitive material wound in a roll is cut into a predetermined size and processed into sheets, the photosensitive material including a marking pattern formed by a laser beam being irradiated onto a constant position at a peripheral portion of the sheet, the marking pattern including identification information with which the photosensitive material can be specified.

According to this aspect, the rolled photosensitive material is processed into sheets of a predetermined size by cutting the rolled photosensitive material to a predetermined length. Also, the laser beam oscillator that is the marking means irradiates the laser beam onto a constant position on the photosensitive material, whereby the marking pattern is formed on the photosensitive material so that a marking pattern appears at a constant position on each photosensitive material that has been processed into a sheet.

The emulsion layer of the photosensitive material is melted, evaporates, and is deformed by the laser beam being irradiated. Thus, it becomes possible to recognize the irradiation position of the laser beam, and the laser beam is irradiated onto the photosensitive material so that the irradiation position of the laser beam is dot-like or continuous, whereby desired symbols, characters, and marks can be formed as the marking pattern on the photosensitive material.

The marking pattern is set, on the basis of the photosensitive material information or the processing information, as identification information with which it is possible to specify the brand of the photosensitive material or the roll serving as the source. The identification information when this kind of marking pattern is formed may include a brand name, a slit number, and a cutting order number. By including, in the identification information, processing information when the photosensitive material is processed and information that specifies a packaging device, it becomes possible to determine the processing history. Moreover, the identification information may include a stacking order when the photosensitive material is stacked and packaged and the cutting order number. Thus, it becomes possible to grasp the remaining amount of photosensitive material in a package when the photosensitive material is used.

The identification information may include characteristic marks such as characters, numbers, and a symbol following a rule that is preset between the photosensitive material and a developing device used when the photosensitive material is developed after the photosensitive material has been exposed. Thus, proper development of the photosensitive material can be made possible from identification information. That is, it becomes possible to select the developing device according to the photosensitive material.

Moreover, the identification information may be compressed by coding or encryption as the marking pattern. Thus, it is possible to record numerous information in a narrow range. The coding or encryption in this instance may be encryption that can be decrypted using a public key or encryption that is decrypted using a secret key. The invention is not limited to these. Conventionally well-known coding or encryption can be used.

Moreover, by forming the marking pattern on the photosensitive material, it becomes possible to determine whether or not the side seen is the emulsion layer, i.e., automatic determination of the surface and undersurface sides becomes possible. Automatization of sensitivity correction when image-exposure is conducted with respect to the photosensitive material also becomes possible from the photosensitive material information included in the marking pattern. That is, by using the marking pattern recorded on each photosensitive material, precise handling of the photosensitive material can be made possible.

The photosensitive material processing device is characterized in that it includes the measuring instrument for measuring the conveyance amount of the photosensitive material, and the marking pattern is formed on the basis of the conveyance amount of the photosensitive material measured by the measuring instrument after the photosensitive material is cut by the cutter.

According to this device, the marking position on the photosensitive material is determined on the basis of the position at which the photosensitive material is cut by the cutter when the photosensitive material is cut by the cutter and formed into sheets.

Thus, it is possible to obtain sheets of the photosensitive material in which the marking pattern is formed at a constant position with respect to the position at which the photosensitive material is cut by the cutter, and automatization of the reading of the marking pattern formed on each photosensitive material becomes possible.

When the device includes a slitter for slitting the photosensitive material to a predetermined width prior to the cutting of the photosensitive material by the cutter, the marking means forms the marking pattern, at a predetermined position with respect to the position at which the photosensitive material is slit by the slitter, each time the conveyance amount of the photosensitive material reaches a predetermined length.

According to this device, the photosensitive material is slit to a predetermined width by the slitter prior to the cutting of the photosensitive material by the cutter, and photosensitive material of a predetermined size is processed.

When conducting such processing, the marking means forms the marking pattern at a predetermined position with respect to the cutting position of the cutter, at intervals corresponding to the intervals at which the photosensitive material is cut by the cutter. Thus, when the photosensitive material is cut and formed, it is possible for the marking pattern to appear at a constant position on each photosensitive material.

BRIEF DESCRIPTION OF THE DRAWINGS

FIGS. 27A to 27D are schematic diagrams showing applicable examples of marking patterns;

DESCRIPTION OF THE PREFERRED EMBODIMENTS

First Embodiment

Embodiments of the invention will be described below with reference to the drawings.

Figure 1:
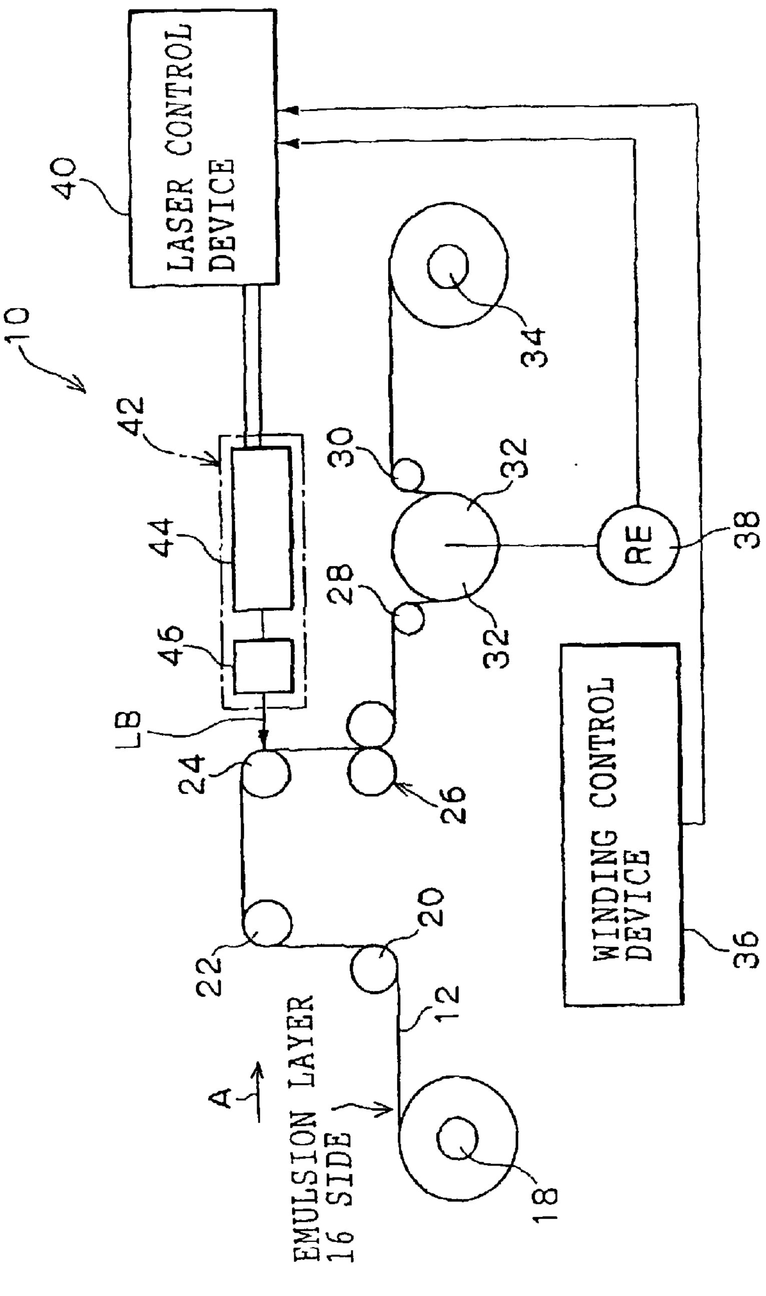
FIG. 1 is a schematic structural diagram of a marking device pertaining to first, second and third embodiments.

FIG. 1 shows the schematic configuration of a marking device 10 used in the present embodiment. In the marking device 10, a long X-ray film (photosensitive material) 12 that is wound in a roll is used as a printed body and, in a process in which the X-ray film 12 is conveyed, the X-ray film 12 is marked by irradiating laser beams LB onto a surface of the X-ray film to form a marking pattern, such as characters and symbols.

Figure 2A:
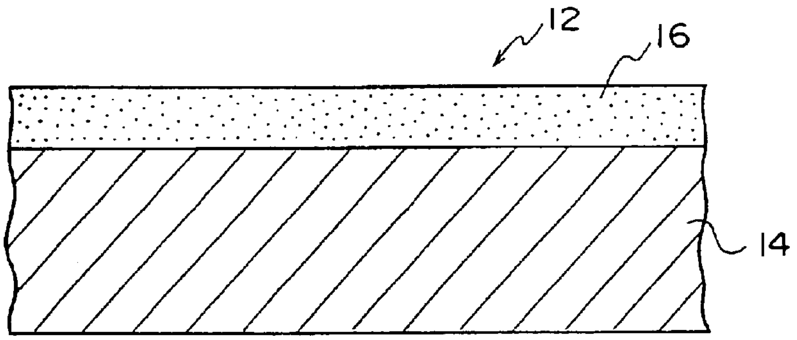
FIGS. 2A and 2B are cross-sectional diagrams of a photosensitive material, with FIG. 2A showing the photosensitive material prior to dot pattern formation and FIG. 2B showing the photosensitive material after dot pattern formation.

As shown in FIG. 2A, the X-ray film 12, which is used as a photosensitive material in the present embodiment, is one in which PET (polyethylene terephthalate) is used for a base layer 14, which is a support, and an emulsion is coated on at least one side of the base layer 14 to form an emulsion layer 16.

As shown in FIG. 1, the X-ray film 12 is wound in a roll around a roll core 18, with the emulsion layer 16 facing outward. The marking device 10 pulls the X-ray film 12 out from the outermost layer.

The X-ray film 12 that has been pulled out from the outermost layer is wound around a pass roll 20, the conveyance direction of the X-ray film 12 is changed at a substantial right angle upward (upward with respect to the page of FIG. 1) from a traveling direction (the direction of arrow A in FIG. 1), and the X-ray film 12 is wound around a pass roll 22. The X-ray film 12 is wound around the pass roll 22, the conveyance direction of the X-ray film 12 is changed at a substantial right angle to the traveling direction, and the X-ray film 12 is conveyed to a print roll 24.

In the marking device 10, the position at which the X-ray film 12 is wound around the print roll 24 is set as an irradiation position of the laser beam LB. The X-ray film 12, whose direction has been changed at a substantial right angle downward from the traveling direction by the print roll 24, is nipped between rolls 26 that are disposed in a pair, the conveyance direction of the X-ray film 12 is changed at a substantial right angle to the traveling direction, and the X-ray film 12 is sent toward small rolls 28 and 30.

A suction drum 32 is disposed between the small rolls 28 and 30, a substantially U-shaped conveyance path is formed between the small rolls 28 and 30, and the X-ray film 12 is wound around the suction drum 32 between the small rolls 28 and 30.

Plural small holes (not shown) are disposed in an outer peripheral surface of the suction drum 32. The X-ray film 12 wound around the peripheral surface of the suction drum 32 is sucked and retained thereon by air suction, and the suction drum 32 is movable downward (with respect to the page of FIG. 1) by its own weight or by an urging force of unillustrated urging means. Thus, because back tension is imparted to the X-ray film 12, a state in which the X-ray film 12 is closely adhered to the print roll 24 is maintained when the X-ray film 24 passes around the print roll 24.

The X-ray film 12 that is sent from the rolls 26 is conveyed in a substantial U shape between the pair of small rolls 28 and 30 and sent from the small roll 30. The X-ray film 12 that has passed around the small roll 30 is wound around a roll core 34.

A winding control device 36 is disposed in the marking device 10. The roll cores 18 and 34 and the suction drum 32 are rotatingly driven by a driving force of drive means (not shown), such as a rotating motor, at a predetermined rotational speed by a drive signal from the winding control device 36, to thereby convey the X-ray film 12.

In the marking device 10, because the roll cores 18 and 34 are basically rotatingly driven at the same linear velocity to convey the X-ray film 12, and because the suction drum 32 is rotated while it sucks and retains the X-ray film 12, the rotational speed of the suction drum 32 is the same as the speed (linear velocity) at which the X-ray film 12 is conveyed at the print roll 24.

A rotary encoder 38 is attached to the suction drum 32 and outputs a pulse signal corresponding to the rotation angle of the suction drum 32. In the marking device 10, it becomes possible to monitor the conveyance length and the conveyance speed of the X-ray film 12 from the pulse signal outputted from the rotary encoder 38.

A marking head 42 that emits the laser beams LB and a laser control device 40 that controls the emission of the laser beams LB are disposed as marking means in the marking device 10. The rotary encoder 38 is connected to the laser control device 40, and a pulse signal corresponding to the conveyance of the X-ray film 12 is inputted to the laser control device 40.

Figure 3:
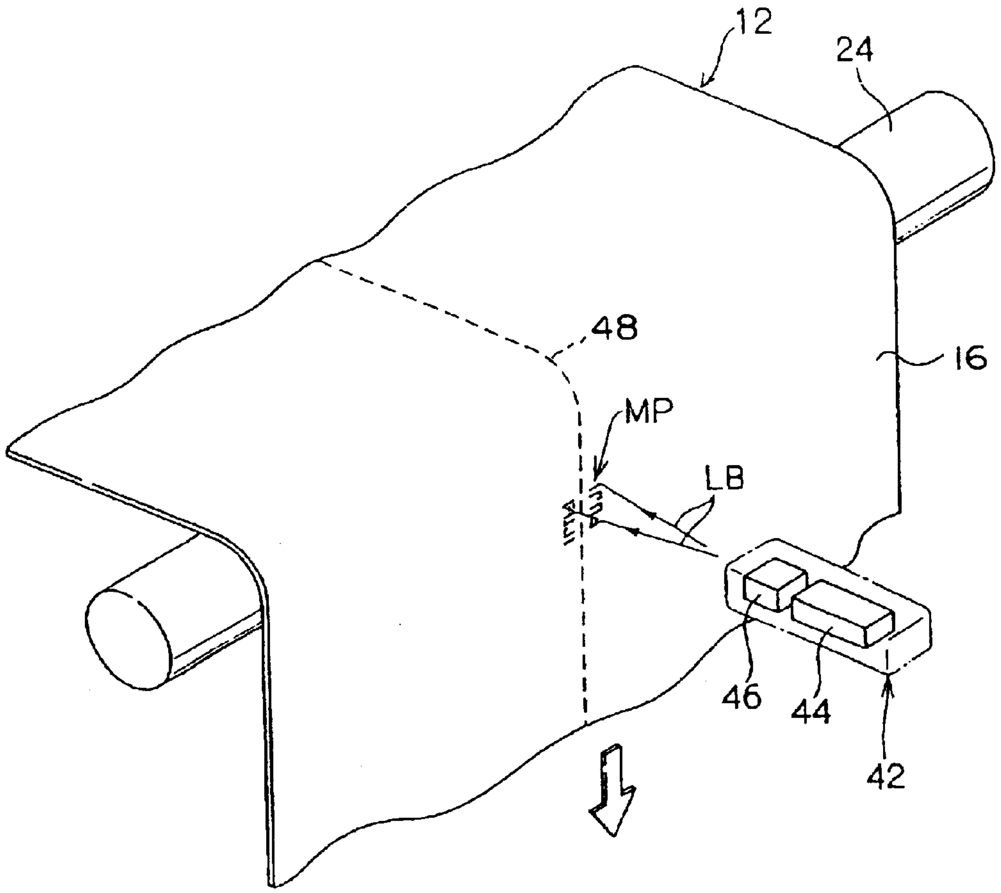
FIG. 3 is an enlarged perspective diagram of a vicinity of a print roll and shows a state in which a marking pattern resulting from a dot pattern is formed.

As shown in FIGS. 1 and 3, the marking head 42 is disposed so that an emission aperture of the laser beams LB, which emission aperture is a tip portion of the marking head 42, faces the X-ray film 12 wound around the print roll 24. The marking head 42 includes a laser oscillator 44 and a beam deflector 46 that includes an unillustrated condenser lens, and emits the laser beams LB emitted from the laser oscillator 44 toward the X-ray film 12 wound around the print roll 24.

The laser oscillator 44 used in the present embodiment emits laser beams LB of a constant oscillation wavelength at a predetermined timing and at a predetermined time width (pulse width) on the basis of a drive signal from the laser control device 40 (not shown in FIG. 3).

The beam deflector 46 is disposed with, for example, an AOD (acousto-optical device), and includes the function of scanning the laser beams LB using a deflection signal from the laser control device 40 in a direction orthogonal to the conveyance direction of the X-ray film 12. It should be noted that each scanned laser beam LB is focused into an image so that a predetermined spot diameter is formed on the X-ray film 12 by the condenser lens.

A pattern signal corresponding to the marking pattern (characters and symbols) to be recorded on the X-ray film 12 is inputted to the laser control device 40 from the winding control device 36. The laser control device 40 outputs the drive signal to the laser oscillator ($CO_2$ laser) 44 in response to the pattern signal while monitoring the conveyance length of the X-ray film 12 on the basis of the pulse signal outputted from the rotary encoder 38 in correspondence to the conveyance of the X-ray film 12, and outputs the deflection signal to the beam deflector 46.

Thus, the marking head 42 scans the laser beams LB onto the X-ray film 12 while the laser beams LB are turned on/off in accordance with a marking pattern MP.

At this time, as shown in FIG. 3, the marking head 42 scans and emits the laser beams LB onto the X-ray film 12, using the direction in which the laser beam LB is scanned by the beam deflector 46 as a main scanning direction and using the conveyance direction (the direction of the arrow in FIG. 3) of the X-ray film 12 as a subscanning direction, to thereby form the marking pattern (here, letters) MP on the X-ray film 12.

Figures 4A, 4B:
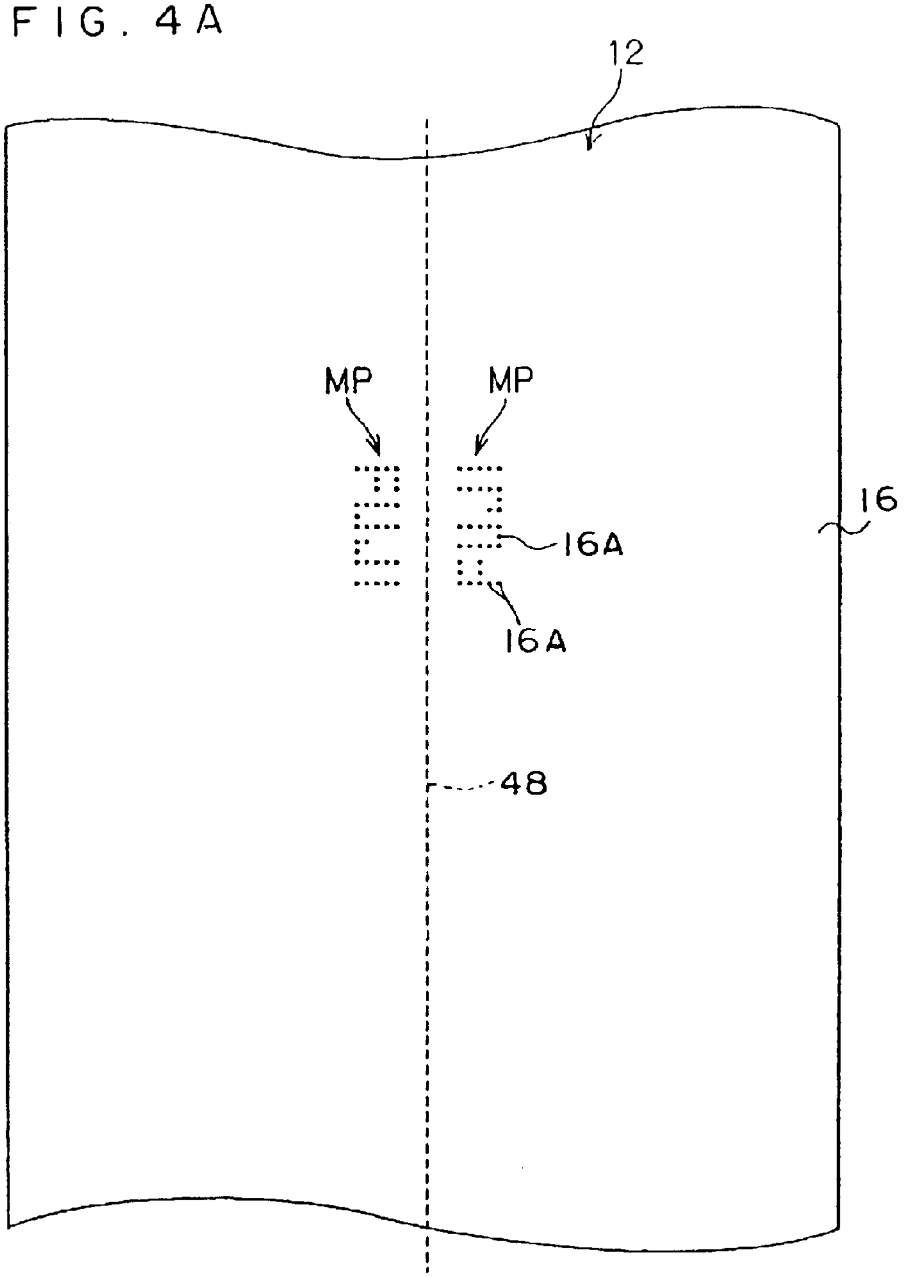
FIG. 4A is a plan diagram of an X-ray film having a cutting line in a conveyance direction.
FIG. 4B is a schematic diagram showing an example of a character row forming the marking pattern.

As shown in FIGS. 3, 4A and 4B, the marking pattern MP can be formed using characters, symbols and letters that are formed by a predetermined dot arrangement in which, for example, one character is 5×5 dots. As shown in FIG. 4B, the marking pattern MP can also be formed with an optional configuration using plural characters, numbers, and symbols formed by the dot arrangement.

As shown in FIGS. 3 and 4A, when the X-ray film 12 is to be cut (a cutting line 48 is represented by the dotted line) in a longitudinal direction and processed into sheets or a roll of a small width, it is also possible to form a marking pattern MP on both sides of the cutting line 48, in which the top/bottom orientations of the marking patterns MP are reversed.

As shown in FIGS. 1 and 3, when the X-ray film 12 is wound around the print roll 24, the marking head 42 is disposed so as to face the X-ray film 12 at a position slightly raised from a peripheral surface of the print roll 24. Thus, the laser beams LB that have been transmitted through the X-ray film 12 are prevented from heating dust adhering to the peripheral surface of the print roll 24 and generating fogging in the X-ray film 12.

As mentioned above, a $CO_2$ laser is used in the marking device 10 as one example, and a laser oscillating tube that oscillates a $CO_2$ laser of a predetermined wavelength at a predetermined output is used for the laser oscillator 44 of the marking head 42.

The action of the present embodiment will be described below.

In the marking device 10 configured in this manner, the pulling-out of the X-ray film 12 wound around the roll core 18 and the conveyance and winding toward the roll core 34 of the X-ray film 12 are initiated by the drive signal outputted from the winding control device 36.

The suction drum 32 is controlled by the winding control device 36 to begin rotating and initiate air suction, to thereby suck and retain the X-ray film 12 wound around the peripheral surface of the suction drum 32. Thus, the X-ray film 12 is sent out at a predetermined linear velocity while being pulled in. At this time, the suction drum 32 imparts a predetermined tension to the X-ray film 12 using its own weight or an urging force of urging means.

Here, because the roll diameters of the roll cores 18 and 34 continuously change, there are cases where it is difficult to maintain a constant linear velocity. As a result, the X-ray film 12 can sometimes become tight or slack during conveyance. However, because the suction drum 32 reliably retains the X-ray film 12 by air suction, there is no slippage of the X-ray film 12 at the suction drum 32.

Thus, the rotational speed (peripheral velocity) of the suction drum 32 is a linear velocity that serves as a standard for the conveyance system of the X-ray film 12, and the linear velocity of the X-ray film 12 on the print roll 24 is the same as the peripheral velocity of the suction drum 32.

The laser control device 40 detects the rotational state of the suction drum 32 using the rotary encoder 38.

When the pattern signal corresponding to the marking pattern MP to be recorded on the X-ray film is inputted to the laser control device 40 from the winding control device 36, the laser control device 40 monitors the conveyance length of the X-ray film 12 on the basis of the pulse signal outputted from the rotary encoder 38 so that, for example, when the conveyance length of the X-ray film reaches a preset length, the laser control device 40 outputs the drive signal to the laser oscillator ($CO_2$ laser) 44 on the basis of the pattern signal and outputs the deflection signal to the beam deflector 46.

Thus, the laser beams LB emitted from the laser oscillator 44 are scanned and irradiated onto the X-ray film 12 wound around the print roll 24, whereby the dot-like marking patterns MP corresponding to the pattern signal are formed on the X-ray film 12.

It should be noted that the description above relating to the first embodiment is also applicable to the second, third and fourth embodiments.

In order for the marking pattern MP represented by the dot pattern arrangement to be formed with high quality, it is necessary for the diameter (about 100 $\mu$m) of each dot pattern to be substantially constant and for the laser beam LB to be irradiated at a position at which the conveyance speed of the X-ray film 12 is maintained at a constant.

The distance between the marking head 42 and the X-ray film 12 is maintained at a constant by the X-ray film 12 being wound around the print roll 24. Moreover, the X-ray film 12 is sucked and retained by the suction drum 32, and irradiation of the laser beam LB is conducted at a position on the print roll 24, at which the conveyance speed of the X-ray film 12 matches the linear velocity of the suction drum 32.

Figure 2B:
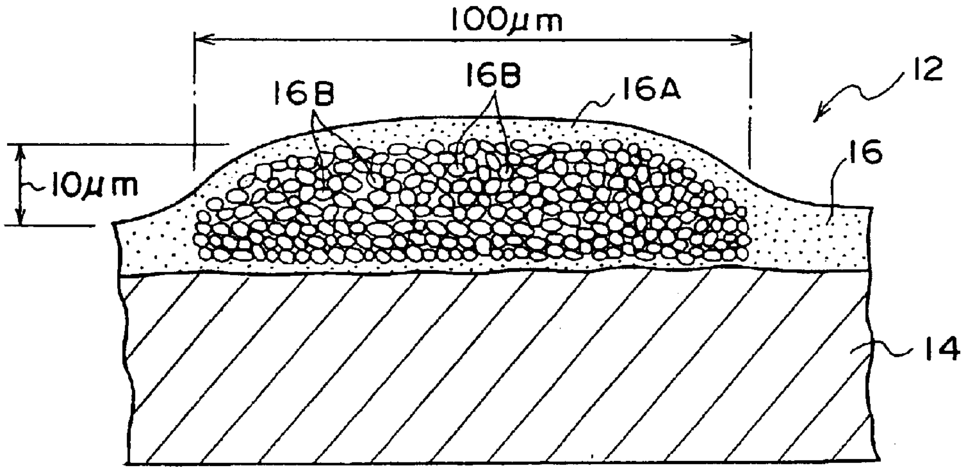
Figure 5:
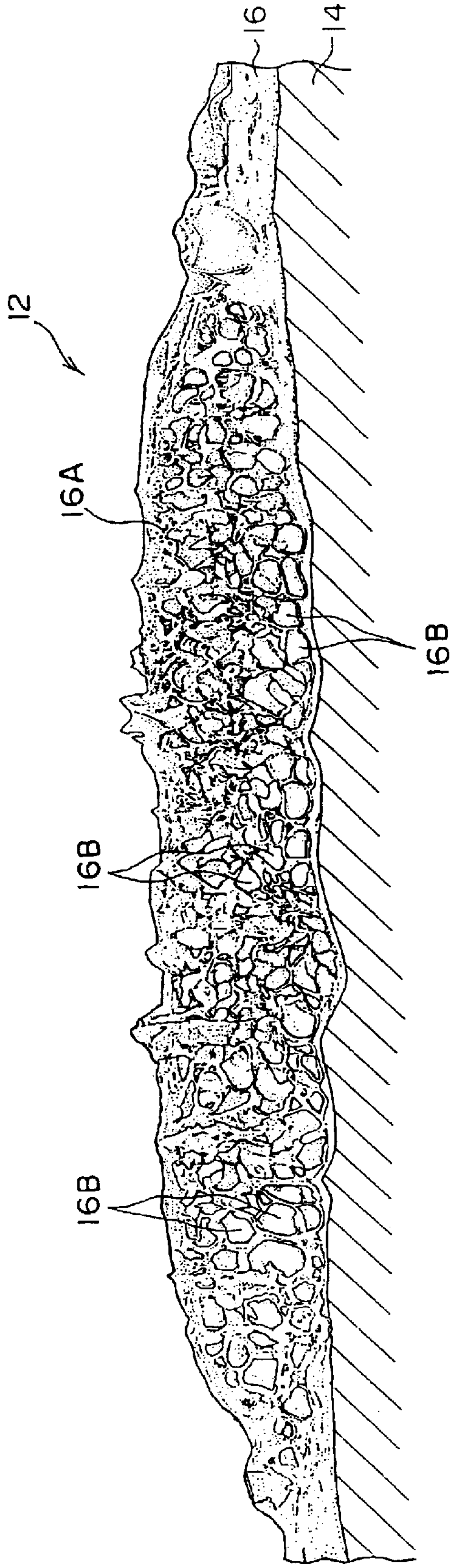
FIG. 5 is a cross-sectional diagram (microscopic diagram) of the dot pattern.

In the present embodiment, as shown in FIGS. 2B and 5, a dot pattern 16A is convexly formed with respect to the emulsion layer 16. Plural, minute air bubbles 16B are disposed in the expanded interior of the dot pattern 16A.

The degree of convexity of the dot pattern 16A and the sizes (diameters) of the air bubbles 16B are generated in a process in which the emulsion layer 16 is melted by thermal energy resulting from the laser beam LB being irradiated. In the present embodiment, the irradiation time of the laser beam is controlled so that the degree of convexity of the dot pattern 16A is 10 $\mu$m or less and the diameters of the air bubbles 16B are 1 to 5 $\mu$m.

Numerous boundary films are formed between the air bubbles 16B by the plural minute air bubbles 16B being formed, and because the diffuse reflection of light is promoted, the amount of reflected light varies greatly between the inside and the outside of the dot pattern 16A. For this reason, the visibility of the dot pattern 16A can be raised regardless of whether the X-ray film 12 is undeveloped or developed and regardless of the contrast in density.

The irradiation time of the laser beam in order for the plural minute air bubbles 16B to be disposed inside the convex dot pattern 16A is in the range of 1 $\mu$sec to 15 $\mu$sec (see FIG. 7), with the oscillation wavelength of the laser beam oscillator 44 being a 9 $\mu$m band (9.3 $\mu$m, 9.6 $\mu$m).

Although it is possible to form the convex dot pattern 16A of the above-described conditions in the range of 5 $\mu$sec to 8 $\mu$sec (see FIG. 7) when the oscillation wavelength of the laser oscillator 44 is 10.6 $\mu$m, a 9 $\mu$m waveband laser oscillator 44 is used in order to improve working efficiency.

In the present embodiment, it is preferable that the irradiation time of the laser beam is further controlled to the extent that a space S (see FIG. 7, which is described later) cannot be formed at the boundary between the base layer 14 and the emulsion layer 16. It should be noted that the space S is different from the minute air bubbles 16A formed in the convex dot pattern 16A.

When the space S is generated between the base layer 14 and the emulsion layer 16, visibility is high at the point in time when the laser beam is irradiated and the dot pattern 16A is formed, but the emulsion layer 16 positioned over the space S is scattered and opened by conducting post-processing such as development. This becomes a form that is the same as when the dot pattern 16A is formed (see FIG. 8, which is described later) when the set irradiation time (15 $\mu$sec for a 9 $\mu$m waveband and 18 $\mu$sec for a 10.6 $\mu$m wavelength) is exceeded. That is, by adding the condition that the space S should not be present, the range of the irradiation time narrows from 1 to 10 $\mu$sec for a 9 $\mu$m waveband and 5 to 8 $\mu$sec for a 10.6 $\mu$m wavelength, but it becomes possible to reduce differences between the evaluation of visibility at the manufacturing stage and the evaluation of visibility by a user. Although differences virtually disappear between a 9 $\mu$m waveband and the 10.6 $\mu$m wavelength with respect to the above-described irradiation times, the degree of convexity when the dot pattern 16A is formed by a 9 $\mu$m waveband becomes twice that when the dot pattern 16A is formed by the 10.6 $\mu$m wavelength with respect to an irradiation time of 6 to 8 $\mu$sec. From the standpoint of visibility, a 9 $\mu$m waveband is preferable.

The direction in which the laser beam LB is scanned by the laser deflector 46 is the main scanning direction, and the direction in which the X-ray film 12 is conveyed is the subscanning direction. Marking is accomplished with 5×5 dots.

In the present embodiment, the dot pattern configuring the marking pattern MP is convexly formed in the emulsion layer 16, and the plural minute air bubbles 16B are disposed in the expanded interior of the dot pattern 16A.

By making the dot pattern 16A convex, the formation region of the minute air bubbles 16B can be enlarged, and because the plural minute air bubbles 16B are formed, the diffuse reflection of light is promoted by the boundary films between the air bubbles 16B and a large difference in reflectance between the inside and the outside of the dot pattern 16A can be created. Thus, the visibility of the dot pattern 16A can be raised regardless of the contrast in density of the X-ray film 12.

In order for the plural minute air bubbles 16B to be disposed inside the convex dot pattern 16A, the irradiation time of the laser beam is in the range of 6 μsec to 15 μsec when the oscillation wavelength of the laser beam oscillator 44 is a 9 μm band (9.3 μm, 9.6 μm).

In the present embodiment, the irradiation time of the laser beam is controlled to the extent that the space S cannot be formed at the boundary between the base layer 14 and the emulsion layer 16. This is because, when the space S arises between the base layer 14 and the emulsion layer 16, visibility is high at the point in time when the laser beam is irradiated and the dot pattern 16A is formed, but the emulsion layer 16 positioned over the space S is scattered and opened by conducting post-processing such as development, whereby the base layer 14 becomes exposed. When the base layer 14 is exposed, visibility becomes extremely low.

By adding the condition that the space S should not be present, the range of the irradiation time narrows to 6 to 10 μsec for a 9 μm waveband, but it becomes possible to reduce differences between the evaluation of visibility at the manufacturing stage and the evaluation of visibility by a user.

EXPERIMENTAL EXAMPLE 1

Figure 6:
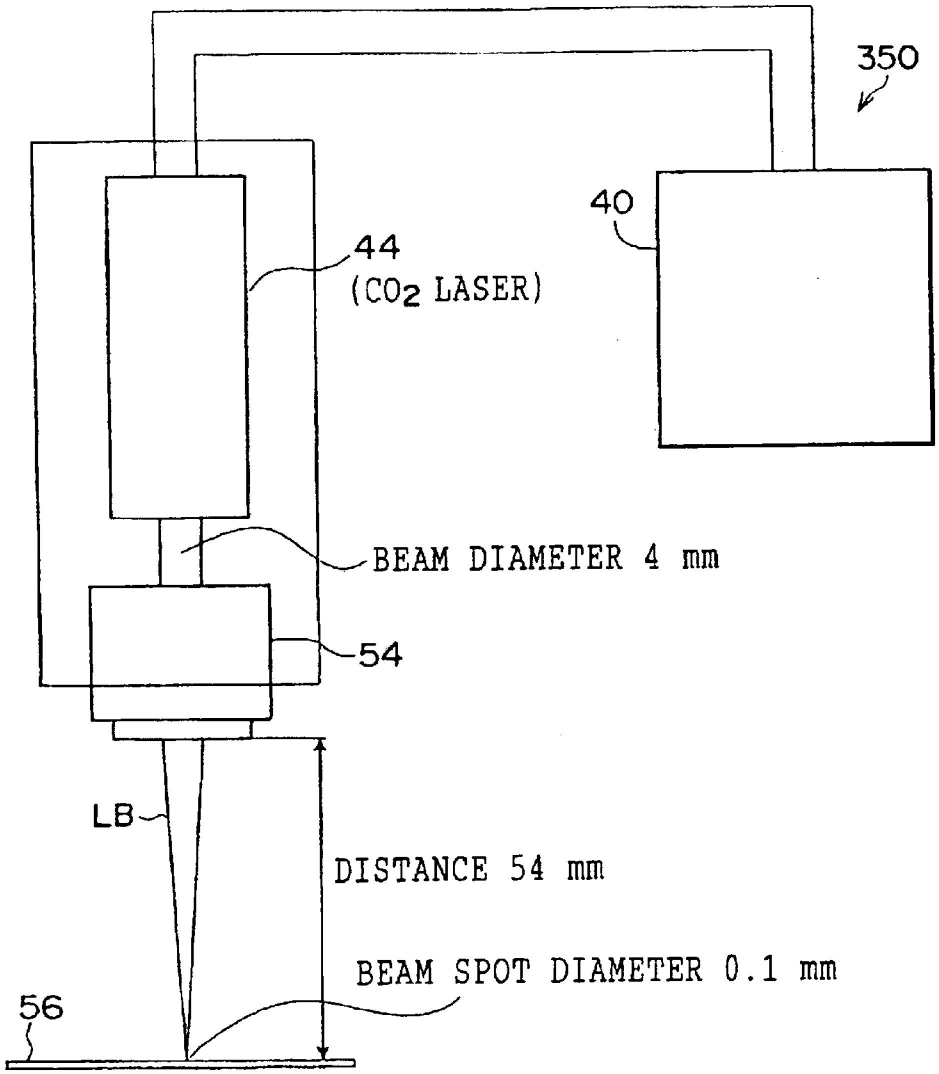
FIG. 6 is a schematic structural diagram of an experimental device in the first embodiment that is used for experimentally evaluating the relation between a marking form and irradiation energy using a $CO_2$ laser.

FIG. 6 shows an experimental device 350 for obtaining marking visibility when a $CO_2$ laser is used as the laser oscillator 44.

Because scanning of the laser LB was unnecessary in the experimental device 350, a condenser lens 54 was disposed at an emission end of the laser oscillator ($CO_2$ laser) 44 that was driven and controlled by the laser control device 40, evaluation samples 56 were substituted for the X-ray film 12 and flatly moved, and the marking forms formed on the evaluation samples 56 were observed.

The experiment was one in which visibility was observed for each of three types of $CO_2$ laser oscillation wavelengths, and the conditions were as follows.

Figure 7:
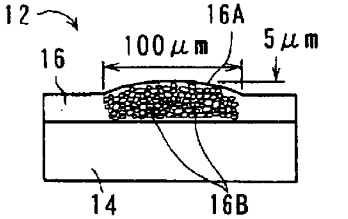
FIG. 7 is an evaluation chart showing forms of dot patterns immediately after dot pattern formation in Experimental Example 1.
Figure 7:
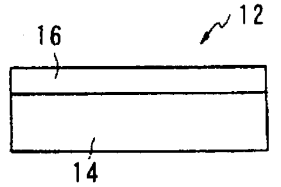
Figure 7:
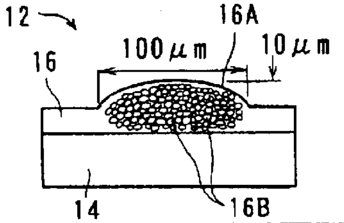
Figure 7:
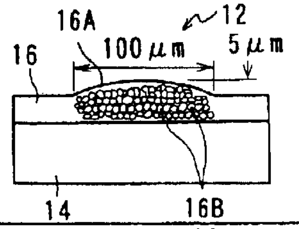
Figure 7:
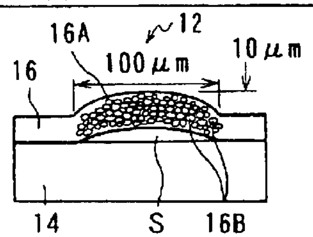
Figure 7:
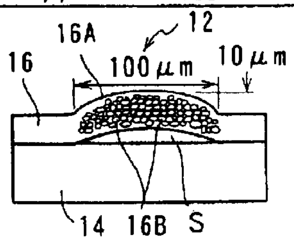
Figure 7:
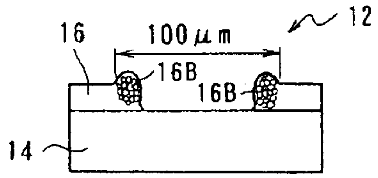
Figure 7:
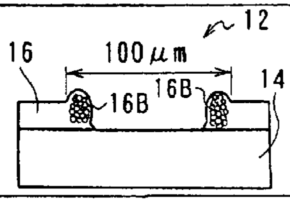
Figure 8:
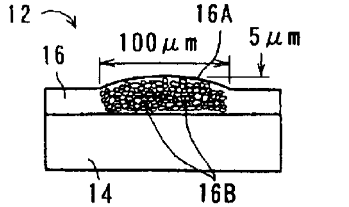
FIG. 8 is an evaluation chart showing forms of dot patterns in a case where post-processing (development) is conducted after dot pattern formation in Experimental Example 1.
Figure 8:
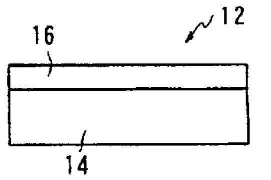
Figure 8:
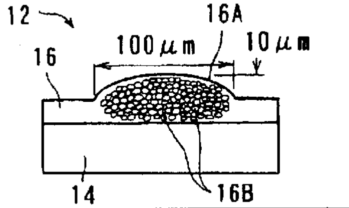
Figure 8:
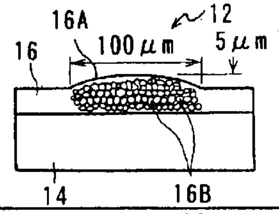
Figure 8:
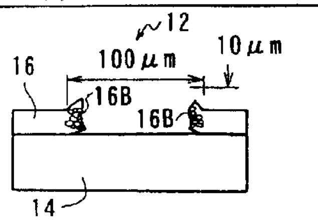
Figure 8:
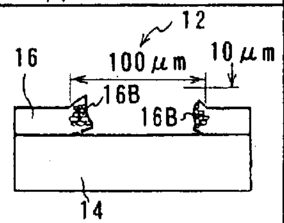
Figure 8:
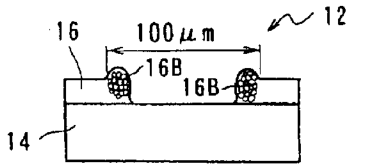
Figure 8:
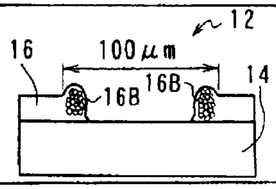

Nd: $CO_2$ laser
Irradiation time: 4 stages (see FIGS. 7 and 8)
Spot diameter: 0.1 mm
Test oscillation wavelengths: 9.3 μm, 9.6 μm, 10.6 μm
Evaluation samples: Emulsion layer of 2 to 5 μm disposed on a 175 μm-thick PET layer The evaluations in Experimental Example 1 are shown in FIGS. 7 and 8. With respect to the evaluations, FIG. 7 shows cases where nothing was done to the evaluation samples after laser beam irradiation, and FIG. 8 shows cases where the evaluation samples were developed after laser beam irradiation.

First, in FIG. 7, when only the facts that the degree of convexity was 10 μm or less and plural minute air bubbles 16B were formed were used as the evaluation items, the dot patterns 16A evaluated as being proper were formed with the 9 μm waveband with respect to the three stages of a 1 to 5 μsec irradiation time, a 6 to 10 μsec irradiation time, and a 11 to 15 μsec irradiation time.

The dot pattern 16A was evaluated as being proper when it was formed with the 10.6 μm wavelength with respect to the two stages of a 5 to 8 μsec irradiation time and a 9 to 18 μsec irradiation time.

When these are put together, it will be understood that the 9 μm waveband laser beams used a shorter irradiation time to obtain a degree of convexity of a maximum of 10 μm and, as a result, visibility was also improved in that it was possible to form numerous minute air bubbles 16B.

Next, in FIG. 8, when the fact that there was no separation (scattering) of the dot pattern 16A resulting from the presence of the space S between the base layer 14 and the emulsion layer 16 was added as an evaluation item in addition the facts that the degree of convexity was 10 μm or less and plural minute air bubbles 16B were formed, the dot patterns 16A were evaluated as being proper when they were formed with the 9 μm waveband with respect to the two stages of a 1 to 5 μsec irradiation time and a 6 to 10 μsec irradiation time.

The dot pattern 16A was evaluated as being proper when it was formed with the 10.6 μm wavelength with respect to the one stage of a 5 to 8 μsec irradiation time.

That is, it will be understood that, because the space S is generated and the emulsion layer 16 is scattered the longer the irradiation time becomes, it is best to form the dot pattern 16A so that the degree of convexity reaches the maximum of 10 μm in a short irradiation time. For this reason, by forming the dot pattern 16A in an irradiation time of 6 to 10 μsec with a 9 μm waveband, high visibility can always be obtained at the time of manufacture and at the time of use by a user, i.e., regardless of whether the X-ray film is undeveloped or developed, and regardless of the contrast in the density of the X-ray film.

As described above, the first embodiment of the invention has excellent effects in that visibility can be quantitatively judged, improvement of the original image quality of the photosensitive material is maintained, and dot pattern visibility can be improved.

In addition to these effects, there is also the effect that dot pattern forms that exert a large influence on visibility do not change between the time of dot pattern formation and processing thereafter.

Second Embodiment

A second embodiment of the invention will be described below with reference to the drawings. Description of matters that have already been described in regard to the first embodiment will be omitted.

Figure 9A:
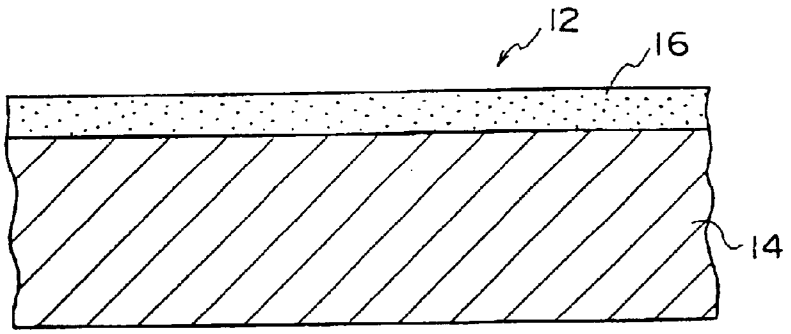
FIG. 9A is a schematic structural diagram of an X-ray film used in the embodiments.
Figure 9B:
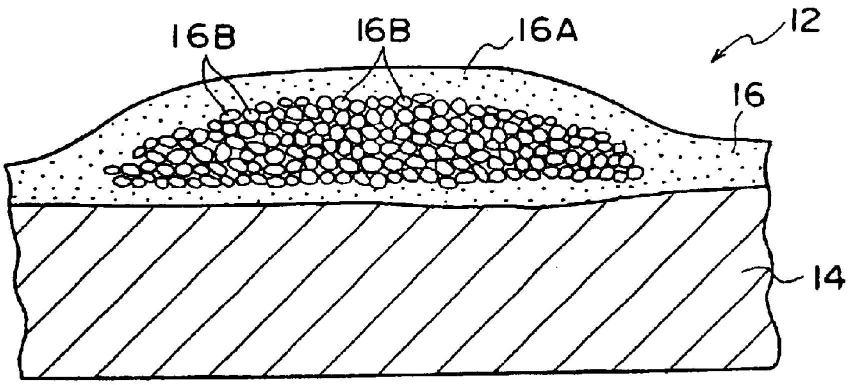
FIG. 9B is a schematic structural diagram of the X-ray film on which proper dots have been formed.

In the marking device 10 shown in FIG. 1, convex dots 16A are formed on the X-ray film 12, as shown in FIG. 9B, by the laser beam LB emitted from the marking head 42, and characters and symbols configuring the marking pattern MP are formed by the arrangement of the dots 16A (see FIGS. 3, 4A and 4B).

The minute air bubbles 16B are generated inside the X-ray film 12 in a process in which the emulsion layer 16 is melted by the thermal energy of the laser beam LB by the laser beam LB being irradiated onto the emulsion layer 16, whereby the surface of the X-ray film becomes convex due to the minute air bubbles 16B.

In the present embodiment, the amount of energy when the dots 16A are formed is set so that the diameter of the air bubbles 16B is about 1 to 5 μm, the degree of convexity of the dots 16A resulting from the minute air bubbles 16B is about 10 μm, and the diameter of the dots 16A is about 200 μm.

In the X-ray film 12, numerous boundary films are formed between the air bubbles 16B and the diffuse reflection of light is promoted by the numerous air bubbles 16B being generated in the emulsion layer 16. Thus, in the X-ray film 12, the amount of reflected light greatly varies between the inside and the outside of the dots 16A, and visibility of the dots 16A is improved regardless of whether the X-ray film 12 is undeveloped or developed and regardless of contrast in density.

The dots 16A formed in this manner on the X-ray film 12 become milky-white and reliably visible when seen from above the X-ray film 12 and even when the X-ray film 12 is tilted. That is, highly visible dots 16A are formed on the X-ray film 12.

Figure 9C:
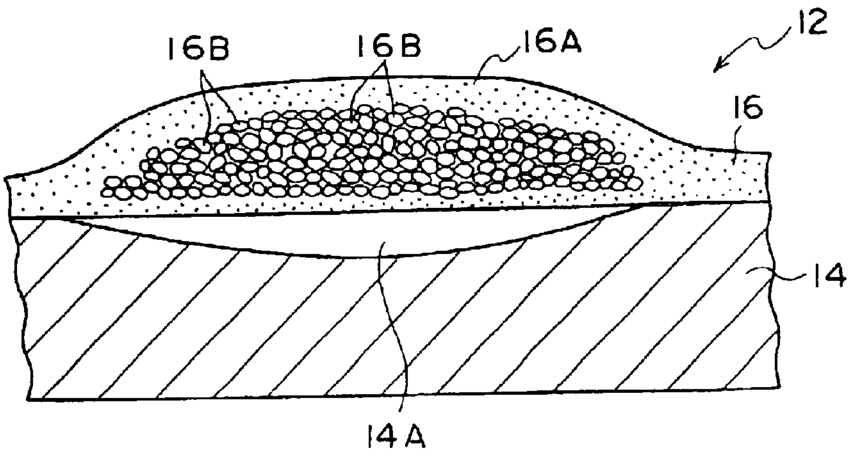
FIG. 9C is a schematic structural diagram of the X-ray film in which a space has been generated between a base layer and an emulsion layer.

As shown in FIG. 9C, in the X-ray film 12, a space 14A is generated between the base layer 16 and the emulsion layer 16 due to the irradiation time of the laser beam LB becoming longer. The space 14A is different from the air bubbles 16B generated in the emulsion layer 16 in that the space 14A is large. When the space 14A is generated in the X-ray film 12, the visibility of the dots 16A becomes higher in a state in which the X-ray film 12 is undeveloped, which is immediately after irradiation of the laser beam LB. However, when the X-ray film 12 is developed, the emulsion layer 16 above the space 14A scatters, separates, and opens, whereby the base layer 14 is exposed, the visibility of the dots 16A drops, and the dots 16A disappear.

Thus, in the marking device 10, a laser oscillator 44 that has a large output is used to impart a predetermined amount of energy in a short time to the X-ray film 12. That is, in the marking device 10, the laser oscillator 44, which has a large oscillation output, is used to impart energy capable of forming proper dots 16A in a short laser beam LB irradiation time.

For example, when a laser beam LB having an oscillation wavelength of 9.6 $\mu$m is used, the output of the laser oscillator 44 is set to 50 W or higher and the irradiation time of the laser beam LB is set to 14 $\mu$sec or lower in order to form proper dots 16A on the X-ray film 12 with 0.7 mJ of energy.

By shortening the time in which one dot 16A is formed, it becomes possible to form numerous dots 16A along the direction orthogonal to the conveyance direction of the X-ray film 12 using one marking head 42 (laser oscillator 44). Thus, in the marking device 10, laser beams LB emitted from one marking head 42 are scanned along the direction orthogonal to the conveyance direction of the X-ray film 12 to form plural marking patterns MP on the X-ray film 12.

Although it is possible to use a 9 $\mu$m band, such as 9.6 $\mu$m, or a 10 $\mu$m band, such as 10.6 $\mu$m, as the wavelength of the laser beam LB, when the same amount of energy is to be imparted at the same output to the X-ray film 12, the irradiation time becomes slightly longer when the oscillation wavelength becomes longer. Also, the degree of convexity of dots 16A that are formed using a 9 $\mu$m band laser beam LB is almost twice as much as the degree of convexity of dots 16A that are formed using a 10 $\mu$m band laser band LB, and visibility becomes higher.

Thus, it is preferable for the oscillation wavelength of the laser beam LB when the marking pattern MP is formed on the X-ray film 12 to be a 9 $\mu$m band.

The marking head 42 disposed in the marking device 10 imparts to the X-ray film 12 energy that is necessary for forming proper dots 16A in a short laser beam LB irradiation time using the relatively high output laser oscillator (laser oscillating tube) 44.

The emulsion layer 16 of the X-ray film 12 is melted by the laser beam LB being irradiated thereon. The numerous minute air bubbles 16B are generated in this process, the surface of the emulsion layer 16 projects convexly, and the dots 16A are formed. At this time, melting, evaporation, and scattering arises in the emulsion layer 16 when the energy of the laser beam irradiated onto the X-ray film 12 becomes large, but in the marking device 10, the irradiation time and the oscillation output of the laser oscillator 44 are set to impart energy necessary for forming proper dots 16A (e.g., 0.7 mJ when a laser beam LB having a 9.6 $\mu$m wavelength is used).

Thus, unnecessary melting, evaporation, and scattering do not arise in the emulsion layer 16 of the X-ray film 12.

Also, in the marking device 10, because scattering of the emulsion layer 16 is suppressed when the dots 16A are formed on the X-ray film 12, it is possible to prevent fogging from being generated in the X-ray film 12 due to scattered emulsion layer being burned by the laser beam LB that is subsequently irradiated onto the X-ray film 12, and to prevent the laser beam LB irradiated onto the X-ray film 12 from being obstructed.

Thus, the marking device 10 does not cause a drop in product quality resulting from fogging in the X-ray film 12, and can form a highly visible marking pattern MP.

Also, in the marking device 10, by shortening the time in which one dot 16A is formed, the laser beam LB is scanned in the width direction of the X-ray film 12 and plural dots 16A can be formed along the width direction of the X-ray film 12.

Thus, in the marking device 10, the marking pattern MP resulting from the dot arrangement can be formed on the X-ray film 12 without using numerous marking heads (laser oscillators 44).

In the marking device 10, by using the high output laser oscillator 44, the irradiation time of the laser beam LB when forming proper dots 16A is further shortened.

That is, when the time during which the laser beam LB is irradiated onto the X-ray film 12 becomes long, heat that is generated by the laser beam LB being irradiated is transmitted as far as the base layer 14 inside the X-ray film 12 and the space 14A is generated between the base layer 14 and the emulsion layer 16.

Although the space 14A improves the visibility of the dots 16A immediately after the dots 16A have been formed on the X-ray film 12, the emulsion layer 16 above the space 14A is separated from the base layer 14 by developing the X-ray film 12, and the base layer 14 is exposed at positions where there should be dots 16A. Thus, the visibility of the dots 16A is greatly lowered, and the dots 16A substantially disappear.

By using the laser oscillator 44 whose output is large in the marking device 10, the irradiation time of the laser beam LB is shortened, whereby the space 14A is prevented from being generated between the base layer 14 and the emulsion layer 16, dots 16A that are highly visible even after development are formed, and high visibility of the marking pattern MP formed by the dots 16B can be secured.

That is, differences in the evaluation of the visibility of the marking pattern MP between the stage of manufacturing the X-ray film 12 and the stage when the X-ray film 12 is used by a user can be reduced.

EXPERIMENTAL EXAMPLE 2

Here, results are shown of a test in which the forms of the dots 16A were evaluated when energy necessary for forming proper dots was imparted by controlling the irradiation time of laser beams LB using laser oscillators of different outputs.

Figure 10:
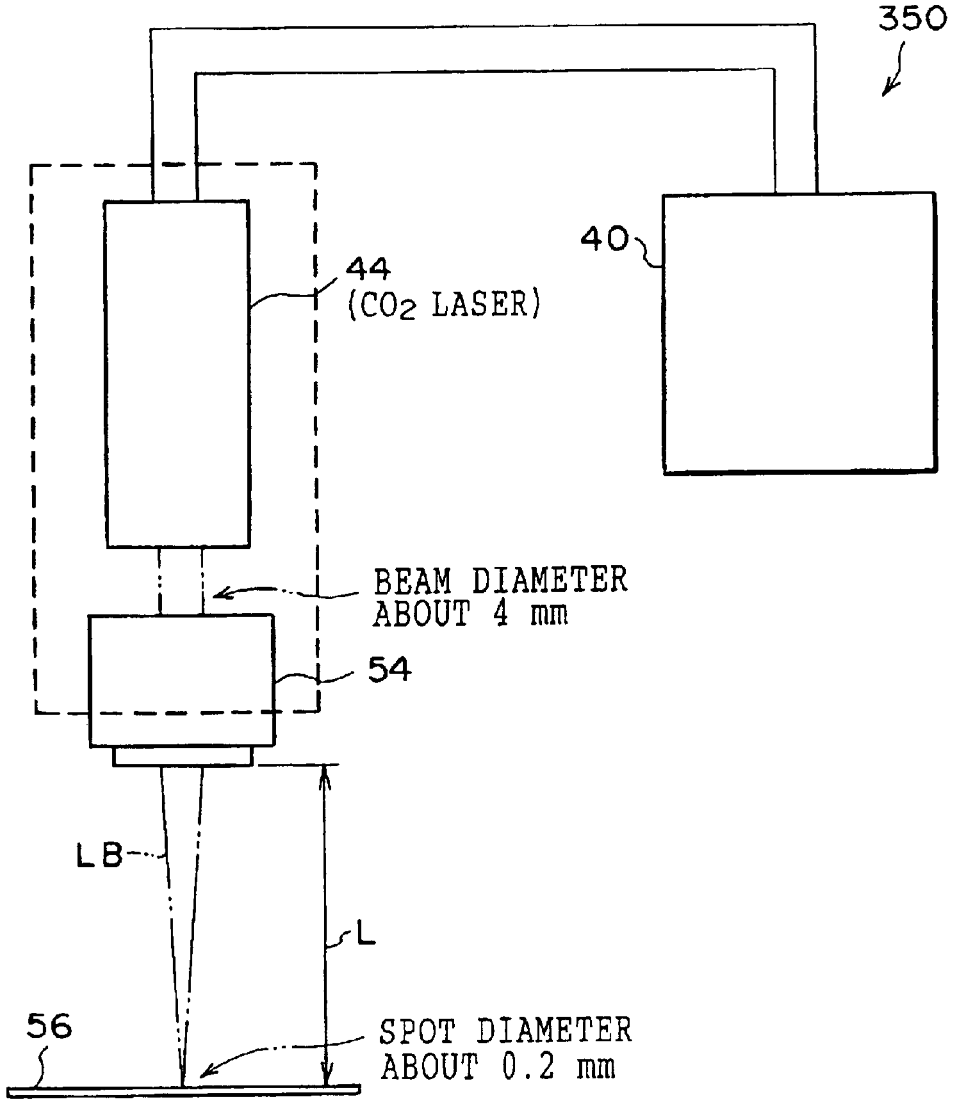
FIG. 10 is a schematic structural diagram showing an example of an experimental device used in Experimental Example 2 in the second embodiment.

FIG. 10 shows the schematic structure of the experimental device 350 for conducting marking using the laser oscillator 44 that oscillates a $CO_2$ laser.

Because scanning of the laser beam LB was unnecessary in this test, the condenser lens 54 was disposed at the emission end of the laser oscillator 44 driven by the laser control device 40, and the laser beam LB was irradiated towards photosensitive material samples 56 that were used in place of the X-ray film 12. It should be noted that, in the experimental device 350, the beam diameter of the laser beam LB emitted from the laser oscillator 40 was about 4 mm, the condenser lens 54 was disposed away from and above the sample 56 by a distance L of 75 mm, the spot diameter was about 0.2 mm, and the laser beam LB was condensed to be irradiated in a spot.

Here, the form evaluation test was conducted using, as the samples 56, a one-sided photosensitive material, in which the emulsion layer 16 was formed on one side of the base layer 14, a double-sided photosensitive material, in which the emulsion layer 16 was formed on both sides of the base layer 14, and a one-sided photosensitive material, in which the emulsion layer 16 was formed on one side of the base layer 14 and that was a thermally-developed photosensitive material in which a latent image formed by exposure is visualized by heating the emulsion layer 16. Each sample 56 comprised a 175 μm-thick PET base layer 14 on which an emulsion was coated to form a 2 to 5 μm-thick emulsion layer 16.

With respect to the samples 56, "S4M" (brand manufactured by Fuji Photo Film Co., Ltd.), which is an X-ray film coated on one side with an emulsion, was used for the one-sided photosensitive material, "CR9" (brand manufactured by Fuji Photo Film Co., Ltd.), which is an X-ray film coated on both sides with an emulsion, was used for the double-sided photosensitive material, and "AL5" (brand manufactured by Fuji Photo Film Co., Ltd.), which is a thermally-developed film coated on one side with an emulsion, was used as the thermally-developed photosensitive film.

Prior to the form evaluation experiment, the laser energy per wavelength necessary for forming proper dots 16A on each sample 56 was determined, and Table 1 shows the laser energy per wavelength for each sample 56.

TABLE 1

| Type | Representative Brand | 9.6 μm Wavelength | 10.6 μm Wavelength |
|---|---|---|---|
| Double-sided Photosensitive Material | S4M | 0.7 mJ | 1.8 mJ |
| One-sided Photosensitive Material | CR9 | 0.7 mJ | 1.8 mJ |
| Thermally-developed Photosensitive Material (One-sided) | AL5 | 1.0 mJ | 2.5 mJ |

The energy necessary for forming proper dots 16A on the photosensitive materials shown in Table 1 differed depending on the brand (mainly the emulsion layer 16). The energy also varied depending on the wavelength of the laser beam LB.

With respect to the test for evaluating the forms of the dots 16A using the experimental device 350, the dots 16A were formed on the samples 56 using laser oscillators 44 whose oscillation outputs were 1 W, 10 W, 25 W, 50 W, 75 W, and 100W for each of the oscillation wavelengths of 9.6 μm and 10.6 μm. It should be noted that, because the laser oscillators 44 generated a laser beams LB of a fixed wavelength, the laser oscillators 44 were changed when the wavelength was changed.

The pulse width of the drive pulse driving the laser oscillators 44 that is the irradiation time of the laser beam LB was set, per wavelength of the laser beam LB in regard to each sample 56, in accordance with the energy necessary for forming proper dots 16A and the outputs of the laser oscillators 44. That is, the irradiation time (pulse width of the drive pulse) of the laser beam LB was set per output of the laser oscillators 44 so that energy for forming proper dots 16A was imparted to each sample 56.

For example, because the energy necessary for forming proper dots 16A on the one-sided photosensitive material using the 9.6 μm wavelength laser beam LB was 0.7 mJ, when the oscillation outputs are 1 W, 10 W, 25 W, 50 W, 75 W, and 100W, the pulse widths that are the irradiation times of the laser beam LB in the outputs were 0.7 msec, 70 μsec, 28 μsec, 14 μsec, 9.3 μsec, and 7 μsec, so that the irradiation time became shorter the larger the output became.

Tables 2 to 4 show the results of evaluation of dot forms with respect to the outputs of the laser oscillators 44 when the dots 16A were formed using 9.6 μm and 10.6 μm wavelength laser beams LB per sample 56 (Table 2 refers to the one-sided photosensitive material, Table 3 refers to the double-sided photosensitive material, and Table 4 refers to the thermally-developed photosensitive material).

In the evaluations shown in Tables 2 to 4, the following symbols were used.

"○" indicates that only the emulsion layer became milky-white and expanded (foamed), and that dots with good visibility and whose presence could be recognized at a glance were formed.

"Δ" indicates that part of the base layer (support) was exposed, that there were portions that had become dark, and that dots with insufficient visibility were formed.

"x" indicates that the base layer was completely exposed, and that dots with poor visibility and whose presence could not be recognized at a glance were formed.

The evaluations were conducted after developing the samples 56 on which the dots 16A were formed.

TABLE 2

| | Laser Beam Wavelength | | | |
|---|---|---|---|---|
| | 9.6 μm Wavelength | | 10.6 μm Wavelength | |
| Output of Laser Oscillator | Pulse Width (Irradiation Time) | Form Evaluation | Pulse Width (Irradiation Time) | Form Evaluation |
| 100 | 7 μsec | ○ | 18 μsec | ○ |
| 75 | 9.3 μsec | ○ | 24 μsec | ○ |
| 50 | 14 μsec | ○ | 36 μsec | Δ |
| 25 | 28 μsec | Δ | 72 μsec | Δ |
| 10 | 70 μsec | x | 180 μsec | x |
| 1 | 0.7 msec | x | 1.8 msec | x |

TABLE 3

| | Laser Beam Wavelength | | | |
|---|---|---|---|---|
| | 9.6 μm Wavelength | | 10.6 μm Wavelength | |
| Output of Laser Oscillator | Pulse Width (Irradiation Time) | Form Evaluation | Pulse Width (Irradiation Time) | Form Evaluation |
| 100 | 7 μsec | ○ | 18 μsec | ○ |
| 75 | 9.3 μsec | ○ | 24 μsec | ○ |

TABLE 3-continued

| | Laser Beam Wavelength | | | |
|---|---|---|---|---|
| | 9.6 μm Wavelength | | 10.6 μm Wavelength | |
| Output of Laser Oscillator | Pulse Width (Irradiation Time) | Form Evaluation | Pulse Width (Irradiation Time) | Form Evaluation |
| 50 | 14 μsec | ○ | 36 μsec | Δ |
| 25 | 28 μsec | Δ | 72 μsec | Δ |
| 10 | 70 μsec | x | 180 μsec | x |
| 1 | 0.7 msec | x | 1.8 msec | x |

TABLE 4

| | Laser Beam Wavelength | | | |
|---|---|---|---|---|
| | 9.6 μm Wavelength | | 10.6 μm Wavelength | |
| Output of Laser Oscillator | Pulse Width (Irradiation Time) | Form Evaluation | Pulse Width (Irradiation Time) | Form Evaluation |
| 100 | 10 μsec | ○ | 25 μsec | ○ |
| 75 | 13 μsec | ○ | 33 μsec | ○ |
| 50 | 20 μsec | ○ | 50 μsec | Δ |
| 25 | 40 μsec | Δ | 100 μsec | Δ |
| 10 | 100 μsec | x | 250 μsec | x |
| 1 | 1 msec | x | 2.5 msec | x |

As shown, for example, in Table 2, proper dots 16A were formed on the one-sided photosensitive material with the 9.6 μm wavelength laser beam LB when the irradiation time was 14 μsec or less and with the 10.6 μm wavelength laser beam LB when the irradiation time was 24 μsec or less. However, when these irradiation times were exceeded, i.e., when the irradiation time became 28 μsec or more with the 9.6 μm wavelength laser beam LB and the irradiation time became 36 μsec or more with the 10.6 μm wavelength laser beam LB, the visibility of the dots 16A dropped.

As shown in Table 3, highly visible dots 16A were formed on the double-sided photosensitive material with the 9.6 μm wavelength laser beam LB when the irradiation time was 14 μsec or less and with the 10.6 μm wavelength laser beam LB when the irradiation time was 24 μsec or less. Additionally, as shown in Table 4, highly visible dots 16A were formed on the thermally-developed photosensitive material with the 9.6 μm wavelength laser beam LB when the irradiation time was 20 μsec or less and with the 10.6 μm wavelength laser beam LB when the irradiation time was 33 μsec or less. However, with respect to the double-sided photosensitive material, when the irradiation time became 28 μsec or more with the 9.6 μm wavelength laser beam LB and the irradiation time became 36 μsec or more with the 10.6 μm wavelength laser beam LB, the visibility of the dots 16A dropped. Moreover, with respect to the thermally-developed photosensitive material, when the irradiation time became 40 μsec or more with the 9.6 μm wavelength laser beam LB and the irradiation time became 50 μsec or more with the 10.6 μm wavelength laser beam LB, the visibility of the dots 16A dropped.

That is, even when energy that could form proper dots 16A was imparted to the samples 56, the emulsion layer 16 melted and evaporated due to the irradiation time of the laser beam LB becoming longer, and heat resulting from the energy of the laser beam LB was transmitted to the base layer 14 and generated the space 14A between the base layer 14 and the emulsion layer 16.

Thus, the visibility of the dots 16A dropped, and the visibility of the marking pattern MP forming the characters and symbols by the arrangement of the dots 16A also dropped. When the space 14A was generated between the base layer 14 and the emulsion layer 16, regardless of the fact that the visibility of the marking pattern MP and the dots 16A immediately after the marking pattern MP had been formed was relatively good, the visibility of the dots 16A and the visibility of the marking pattern MP formed by the dot arrangement dropped remarkably when the samples 56 were developed.

By using the laser oscillator 44 of an oscillation output in which the irradiation time of the laser beam LB necessary for imparting energy that could form proper dots 16A was 20 μsec or less in the case of the 9.6 μm wavelength laser beam LB and 25 μsec or less in the case of the 10.6 μm wavelength laser beam LB when the laser beam LB was irradiated onto the samples 56 including the X-ray film 12 to form the dots 16A and the marking pattern MP resulting from the arrangement of the dots 16A that had good visibility, it was possible to form the dots 16A and the marking pattern MP resulting from the dot arrangement that had high visibility and in which there was no drop in visibility after development.

That is, the laser beam LB whose oscillation output is high was used, the irradiation time of the laser beam LB was shortened, and energy that could form proper dots 16A was imparted to the photosensitive material such as the X-ray film 12 in a short time.

Thus, it was possible to form the dots 16A and the marking pattern MP resulting from the dot arrangement that had high visibility after the laser beam LB had been irradiated and also prior to and after development.

It should be noted that the above-described embodiment is not intended to limit the structure of the invention. For example, although an example was described in the embodiment in which mainly the X-ray film was used as the photosensitive material, the invention is not limited to the same. The invention can also be used in the formation of a marking pattern on a photosensitive material of an optional configuration.

As described above, according to the present embodiment, excellent effects are obtainable in that highly visible dots can be formed because proper dots are formed in a short time using laser oscillation means having a high oscillation output, and changes in the recognizability of the marking pattern resulting from the visibility of the dots dropping due to processing of the photosensitive material are prevented from arising, whereby high visibility can be secured.

Third Embodiment

A third embodiment of the invention will be described below with reference to the drawings. FIG. 1 shows the schematic structure of the marking device 10 which, similar to the embodiments that have already been described, is used also in the present embodiment. Thus, common description will be omitted.

In the present embodiment, the marking device 10 can record a barcode as the marking pattern.

Also, each scanned laser beam LB is condensed into a spot by the condenser lens and irradiated onto the X-ray film 12.

A $CO_2$ laser is used in the marking device 10 as one example, and a laser oscillating tube that outputs a $CO_2$ laser of a fixed wavelength such as, for example, a 9 μm band, such as 9.6 μm, or a 10 μm band, such as 10.6 μm, is used for the laser oscillator 44 of the marking head 42.

Figure 11A:
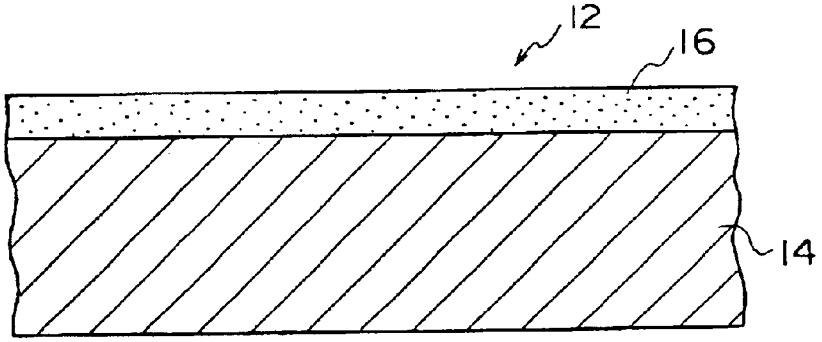
FIG. 11A is a schematic structural diagram of an X-ray film applied to the third embodiment.
Figure 11B:
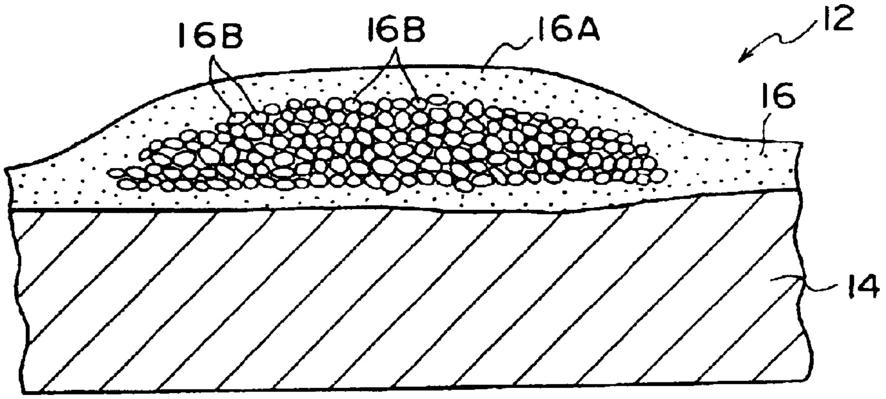
FIG. 11B is a schematic structural diagram of the X-ray film on which proper dots have been formed.

In the X-ray film 12, the minute air bubbles 16B having a diameter of about 1 to 5 μm are generated in the emulsion layer 16 in a process in which the emulsion layer 16 is melted by the energy (thermal energy) of the laser beam LB due to the laser beam LB that has been condensed into a spot being irradiated. The surface of the emulsion layer 16 becomes convex due to the air bubbles 16B and, as shown in FIG. 11B, the dots 16A are formed.

Numerous boundary films are formed between the air bubbles 16B by the numerous air bubbles 16B being generated in the emulsion layer 16 of the X-ray film 12, and the diffuse reflection of light is promoted by these boundary films. Thus, in the X-ray film 12, the amount of reflected light varies greatly between the inside and the outside of the dots 16A, and the visibility of the dots 16A is improved regardless of whether the X-ray film 12 is undeveloped or developed and regardless of the contrast in density.

Also, the dots 16A formed in this manner on the X-ray film 12 become milky-white and reliably visible when seen from above the X-ray film 12 and even when the X-ray film 12 is tilted. That is, highly visible dots 16A are formed on the X-ray film 12.

When the marking pattern MP is formed by the dot arrangement, the degree of convexity of the dots 16A is set to about 10 μm, the diameter of the dots 16A is set to about 200 μm, and the laser beam LB is irradiated at intervals at which the intervals between the dots 16A becomes appropriate. Thus, the highly visible dots 16A or the marking pattern MP resulting from the dot arrangement can be formed.

Figure 11C:
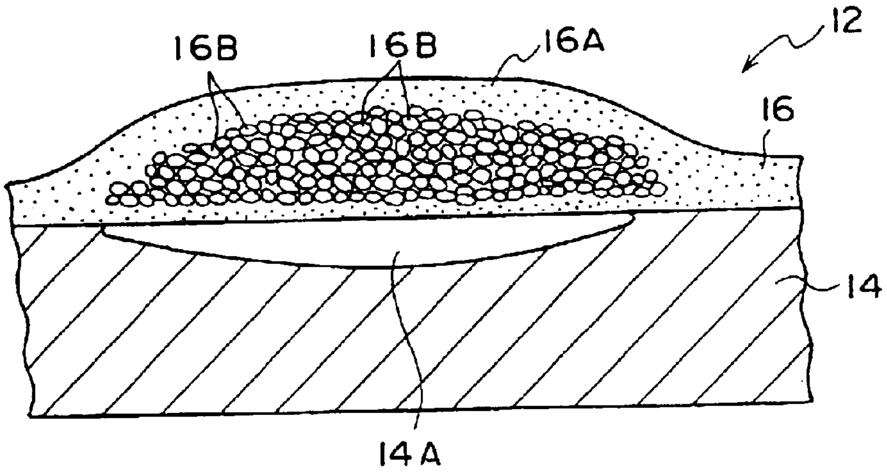
FIG. 11C is a schematic structural diagram of the X-ray film in which a space been generated between the base layer and the emulsion layer.

As shown in FIG. 11C, in the X-ray film 12, the space 14A is sometimes generated between the base layer 16 and the emulsion layer 16 due to the irradiation of the laser beam LB. The space 14A is different from the air bubbles 16B generated in the emulsion layer 16 in that the space 14A is large. When the space 14A is generated in the X-ray film 12, the visibility of the dots 16A becomes higher in a state in which the X-ray film 12 is undeveloped, which is immediately after irradiation of the laser beam LB. However, by developing the X-ray film 12, the emulsion layer 16 above the space 14A scatters, separates, and opens, whereby the base layer 14 is exposed. Thus, the visibility of the dots 16A of the marking pattern MP and the dots 16A formed on the X-ray film 12 drops, and the dots 16A disappear.

Figure 12:
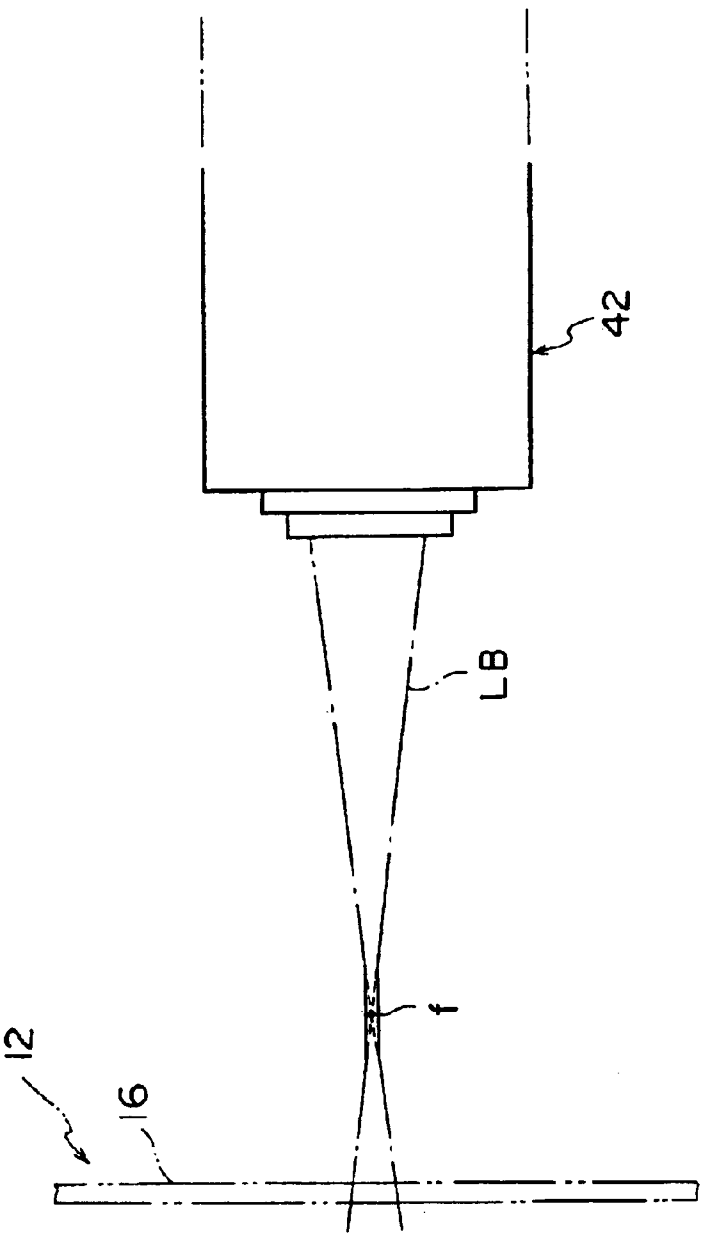
FIG. 12 is a schematic diagram showing relative positions of marking dots and the X-ray film in the third embodiment.

As shown in FIG. 12, in the marking device 10, the conveyance path of the X-ray film 12 is disposed at a position at which the X-ray film 12 is further distanced from the marking head 42 than a focal point f of the laser beam LB emitted from the marking head 42, and the laser beam LB is irradiated onto the X-ray film 12 that is conveyed on this conveyance path.

That is, in the marking device 10, the laser beam LB is defocused and irradiated onto the X-ray film 12.

A beam waist is generated when the laser beam LB is condensed using the condenser lens and the like. For this reason, the beam diameter becomes substantially the same when it is in a predetermined range near the focal point f. Thus, when a printed body is marked using the laser beam LB, the focal point f of the laser beam LB is positioned substantially on the surface of the printed body, the laser beam LB is irradiated onto the printed body, and the beam diameter of the laser beam LB irradiated onto the printed body becomes substantially constant even if the distance between the marking head 42 and the printed body changes slightly.

However, at the beam waist position of the laser beam LB, the energy of the laser beam LB becomes larger at a center portion of the spot than a peripheral portion of the spot. The beam diameter at the beam waist position of the laser beam LB becomes smaller than the dot diameter at which a predetermined visibility is obtained.

For this reason, when the X-ray film 12 is disposed at the beam waist position of the laser beam LB and the laser beam LB is irradiated so that dots 16A that have a larger diameter than the spot diameter of the laser beam are formed, sometimes the energy of the laser beam LB is transmitted as far as the interior of the X-ray film 12 at the center portion of the spot of the laser beam LB, whereby the space 14A is generated between the base layer 14 and the emulsion layer 16.

Thus, in the marking device 10, the laser beam LB is defocused and irradiated onto the X-ray film 12.

Thus, in the marking device 10, the energy that the X-ray film 12 receives becomes substantially even in the spot of the laser beam LB irradiated onto the X-ray film 12, so that when the dots 16A of a predetermined diameter are formed, the space 14A (see FIG. 11C) is prevented from being generated at the center portion of the spot of the laser beam LB.

Also, in the marking device 10, by defocusing and irradiating the laser beam LB onto the X-ray film 12 at a position at which the position of the X-ray film 12 is distanced from the focal point f of the laser beam LB, the diameter of the dots 16A is widened, and dots 16A that are adjacent along the scanning direction of the laser beam LB resulting from the beam deflector 46 are connected in a bar. It should be noted that, at this time, the dots 16A can also be connected in a bar even if they are made narrower than the intervals between the dots 16A (dot pitch) when the marking pattern MP (see FIG. 4) resulting from the dot arrangement is formed.

Also, in the marking device 10, the laser beam LB condensed in the spot is irradiated while the X-ray film is conveyed. Thus, substantially oval dots 16A that are long along the conveyance direction are formed on the X-ray film 12.

Accordingly, continuous dots 16A are formed in a bar on the X-ray film 12 with a width that is fatter than the spot diameter of the irradiated laser beam LB.

In the marking device 10, the marking pattern MP is formed on the X-ray film 12 using PostNet (POSTa1 Numeric Encoding Technique) or a custom barcode.

A barcode (one-dimensional barcode) is a combination of spaces and lines of different thickness that code information. Common barcodes include JAN (Japan Article Number), which has spread widely as an article barcode, and Codabar. Among PostNet (POSTa1 Numeric Encoding Technique) and custom barcodes, there are barcodes that code information mainly with a combination of lines (bars) of different lengths.

Figure 13A:
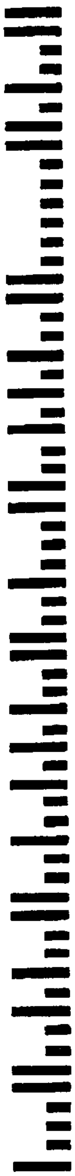
FIG. 13A is a schematic diagram showing a PostNet notation example that is an example of a barcode.

As shown in FIG. 13A, PostNet codes mainly numbers using full bars having lengths (heights) of 2.92 mm to 3.43 mm and half bars having lengths of 1.02 mm to 1.52 mm.

Figure 13B:
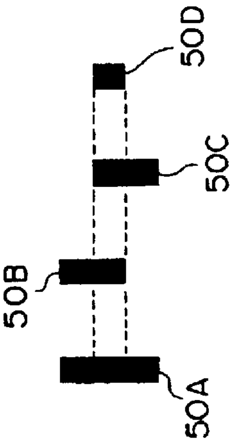
FIG. 13B is a schematic diagram showing the configuration of a bar used in a custom code that is an example of a barcode.
Figure 13C:
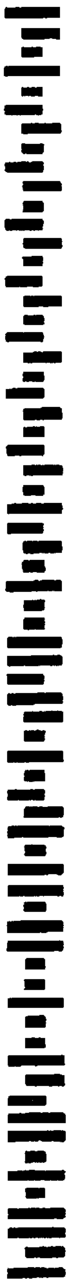
FIG. 13C is a schematic diagram showing a custom code notation example.

As shown in FIG. 13B, the custom barcode uses long bars 50A, two types (upper and lower) of semi-long bars 50B and 50C, and timing bars 50D. Three of these four forms—the long bars 50A, the semi-long bars 50B and 50C, and the timing bards 50D—are combined and used as a 4-taste 3-bar representing one character to code numbers and the like, as shown in FIG. 13C.

The numerous minute air bubbles 16A are generated in a process in which the emulsion layer 16 of the X-ray film 12 is melted by the laser beam LB that has been condensed in a spot being irradiated, whereby the surface of the emulsion layer 16 convexly projects. Thus, the dots 16A are formed on the X-ray film 12.

At this time, as shown in FIG. 12, in the marking device 10, the X-ray film 12 is distanced from the focal point f of the laser beam LB emitted from the marking head 42 and conveyed, and the laser beam LB is defocused and irradiated onto the X-ray film.

Thus, in the marking device 10, the energy within the spot when the laser beam LB is irradiated onto the X-ray film 12 becomes substantially even and the emulsion layer 16 of the X-ray film 12 expands (foams) evenly within this spot. Also, because the energy within the spot of the irradiated laser beam LB becomes substantially even, it is possible to suppress the emulsion layer in the X-ray film 12 from partially melting, and it is possible to prevent the energy of the laser beam LB from being transmitted to the interior of the X-ray film 12 and generating the space 14A, which is larger than the air bubbles 16B.

Also, in the marking device 10, because the energy can be evenly imparted to the X-ray film 12, melting, evaporation, and scattering of the emulsion layer 12 is suppressed and the marking pattern MP is formed using the laser beam LB. Thus, it is possible to prevent product quality from dropping as a result of fogging or the like.

In the marking device 10, highly visible dots 16A are formed in this manner, and there is no drop in the visibility of the dots 16A due to the emulsion layer 16 separating from the base layer 14 after development. That is, it is possible to reduce differences in the evaluation of visibility of the marking pattern between the stage of manufacturing the X-ray film 12 and the stage of use of the X-ray film 12 by a user.

In the marking device 10, the laser beam LB is scanned while the X-ray film 12 is conveyed at a predetermined speed. Thus, the dots 16A are formed in substantially oval shapes on the X-ray film 12, and the dots 16A can be formed at predetermined intervals along the conveyance direction.

Also, in the marking device 10, the spot diameter on the X-ray film 12 is made larger by defocusing and irradiating the laser beam LB onto the X-ray film 12, and dots 16A of a large diameter can be formed. Thus, the plural dots 16A can be formed in a bar in which they are connected along the direction in which the laser beam LB is scanned by the beam deflector 46.

Thus, in the marking device 10, a barcode such as a custom barcode or PostNet can be formed as the marking pattern MP. Thus, numerous information can be recorded in comparison to when simply characters and numbers are formed in a narrow space at the peripheral portion (non-image forming region) of the X-ray film that finally becomes the product.

Also, because a barcode can be used as the marking pattern MP, various kinds of information recorded as the marking pattern MP can be simply and reliably read out by a barcode reader or the like when various processing such as exposure and development is conducted with respect to the X-ray film 12. Thus, appropriate processing of the X-ray film 12 on the basis of this information becomes possible.

EXPERIMENTAL EXAMPLE 3

Figure 14:
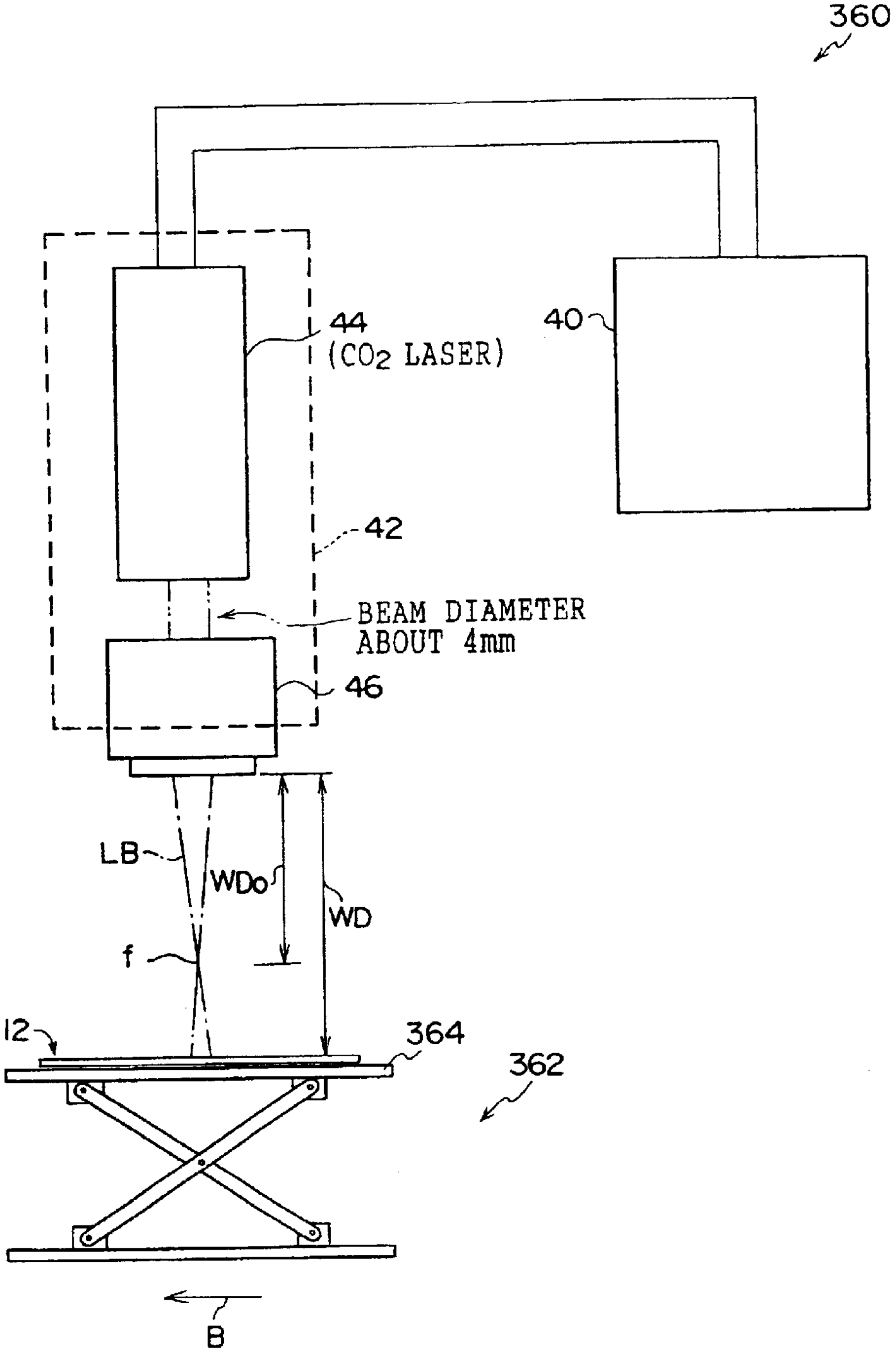
FIG. 14 is a schematic structural diagram showing an example of an experimental device used in Experimental Example 3 in the third embodiment.

FIG. 14 shows an experimental device 360 of dot forms corresponding to the position of the X-ray film 12 with respect to the focal point f of the laser beam LB using a $CO_2$ laser as the laser oscillator 44.

In the experimental device 360, the laser beam LB was irradiated onto the X-ray film 12 while the X-ray film 12 disposed on a stage 362 was moved at a predetermined speed using the marking head 42 and the laser control device 40. In Experimental Example 3, the dot forms formed on the X-ray film 12 on the stage 62 of the experimental device 360 was observed.

With respect to the stage 362, the table 364 on which the X-ray film 12 was disposed was a Z-axis table that could move in parallel with high precision in the vertical direction, which was the direction in which the stage 362 moved toward and away from the marking head 42. A distance WD between the emission aperture (lower end of the marking head 42) of the beam deflector 46 disposed with the condenser lens that condensed the laser beam LB and the X-ray film 12 on the table 364 was varied, and the forms of the dots 16A formed on the X-ray film 12 in correspondence to the distance WD was verified. At this time, the laser beam LB was scanned by the beam deflector 46 along a direction orthogonal to the traveling direction (the direction of arrow B) of the X-ray film 12 (stage 362), whereby the plural dots 16A were formed.

It should be noted that SE4 (brand name), which is an X-ray film for medical use manufactured by Fuji Photo Film Co., Ltd., was used as the X-ray film 12, that the thickness of the PET base layer 14 was about 0.175 mm (175 μm), and that the emulsion layer 16, which had a thickness of about 0.002 mm to 0.005 mm (2 μm to 5 μm), was formed by an emulsion that was coated on the base layer 14.

A $CO_2$ laser with an oscillation wavelength of 10.6 μm was irradiated for a predetermined time (constant time). At this time, the spot diameter of the laser beam LB was about 0.4 mm between the laser oscillator 44 and the beam deflector 46, and the focal point f (distance $WD_0$) was 0.2 mm.

Figure 15:
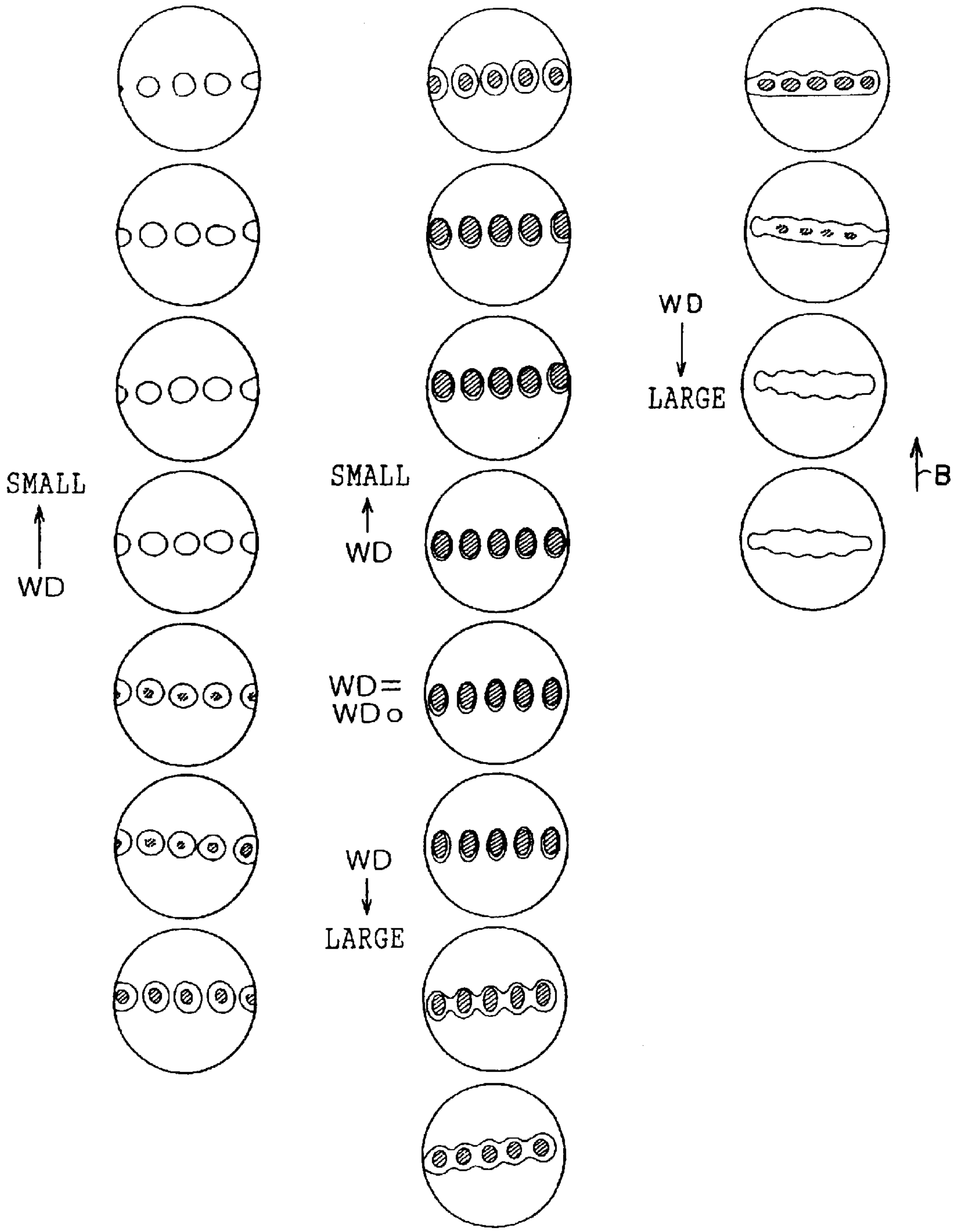
FIG. 15 is a schematic diagram showing evaluation samples of experimental results using the experimental device of FIG. 14.

FIG. 15 shows evaluation samples per distance WD of the dots 16A formed on the X-ray film 12. The evaluation samples were used to evaluate dot forms when the X-ray film 12 was developed after being irradiated with the laser beam LB.

In FIG. 15, the distance WD becomes smaller from $WD_0$ of the center row towards the top, the distance WD becomes smaller from the lower end of the left row towards the top, the distance WD becomes larger from $WD_0$ of the center row towards the bottom, and the distance WD becomes larger from the upper side of the right row towards the bottom. Arrow B in the FIG. 15 represents the traveling direction of the X-ray film 12 (stage 62) in the experimental device 360 with respect to each evaluation sample.

The dots 16A formed on the X-ray film 12 were long ovals along the traveling direction of the X-ray film 12 when the distance WD was in the vicinity of the focal point position (focal point f) of the laser beam LB (when distance $WD=WD_0$). Also, peripheral portions of the dots 16A turned milky-white due to the air bubbles 16B, but recesses generated by the emulsion layer 16 melting appeared in center portions of the dots 16A.

When the distance WD was made smaller than the distance $WD_0$ to the focal point f of the laser beam LB (when $WD<WD_0$), the milky-white portions in the dots 16A spread to the center portions and visibility was gradually raised. That is, this was so that the space 14A would not be generated in the dots 16A in order to make the energy in the spot of the laser beam LB even by defocusing the X-ray film 12 with respect to the laser beam LB.

Moreover, the inside of the dots 16A became milky-white by making the distance WD smaller, but their outer diameters gradually became smaller, whereby visibility dropped.

In contrast, when the X-ray film 12 was distanced from the marking head 42 and the distance WD was made larger, recesses in the dots 16A became smaller, the milky-white portions of the dots 16A spread to the periphery, and mutually adjacent dots 16A connected to form a bar.

Figures 16A, 16B, 16C, 16D, 16E, 16F:
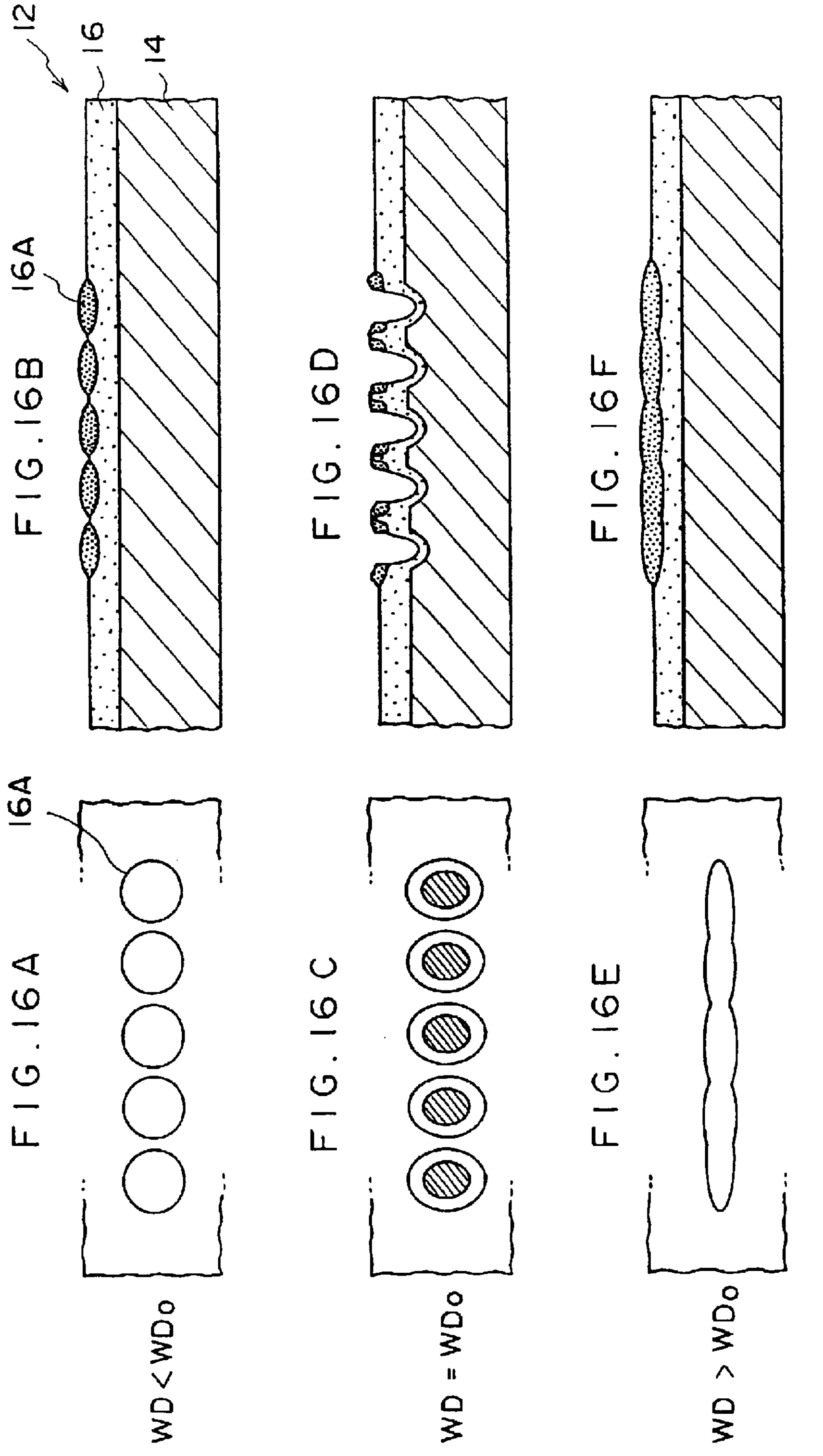
FIGS. 16A to 16F show outlines of dots formed on the X-ray film, with FIG. 16A being a schematic diagram of defocused dots shorter than a focal point position, FIG. 16B being a schematic cross-sectional diagram of FIG. 16A, FIG. 16C being a schematic diagram of dots at the focal point position, FIG. 16D being a cross-sectional diagram of FIG. 16C, FIG. 16E being a schematic diagram of defocused dots longer than the focal point position, and FIG. 16F being a schematic cross-sectional diagram of FIG. 16E.

That is, as shown in FIGS. 16C and 16D, when the distance WD was the focal point position ($WD=WD_0$) of the laser beam LB, melting of the emulsion layer 16 was generated in the center portion of the spot of the laser beam LB, and recesses were generated in the center portions of the dots 16A formed on the X-ray film 12.

In contrast, as shown in FIGS. 16A and 16B, when the distance WD was made shorter than the focal distance (when $WD<WD_0$), no space (space 14A) was generated between the base layer 14 and the emulsion layer 16, and proper dots 16A, in which no recesses resulting from the melting of the emulsion layer 16 were generated, could be formed.

Also, as shown in FIGS. 16E and 16F, when the distance WD was made longer than the focal distance (when $WD>WD_0$), no space (space 14A) was generated between the base layer 14 and the emulsion layer 16, no recesses resulting from the melting of the emulsion layer 16 were generated, and the plural dots 16A were formed continuously in a bar.

Accordingly, by defocusing and irradiating the layer beam LB onto the X-ray film 12, dots 16A could be formed in which visibility was high and in which there were no changes in visibility even when post-processing steps such as a developing step were conducted.

Also, because the dots 16A could be formed in a continuous bar by defocusing the X-ray film 12 in a direction further removed from the marking head 42 than the focal point f of the laser beam LB, a barcode such as a custom code and PostNet could be formed on the X-ray film 12 as the marking pattern MP. Thus, a large amount of information can be given to the marking pattern MP in comparison with a case where simply characters and symbols are formed, and this information can be reliably read using a barcode reader in various steps in which processing of the X-ray film 12 is conducted.

It should be noted that the above-described embodiment is not intended to limit the configuration of the invention. For example, although description was given of an example in which X-ray film was mainly used as the photosensitive material, the X-ray film may, of course, be a one-sided photosensitive material, a double-sided photosensitive material in which the emulsion layer 16 is formed on both sides of the base layer 14, or a dry film in which an image is visualized by thermal development, and is not limited to these. Use in the formation of a marking pattern on a photosensitive material of an optical configuration is possible.

As described above, according to this embodiment of the invention, it is possible to form high quality dots, in which there is no reduction in visibility even after processing steps such as development, or a marking pattern resulting from the dot arrangement. Also, according to the invention, excellent effects can be obtained in that, because the dots can be formed continuously in a bar, a barcode can be formed as the marking pattern on a photosensitive material.

Fourth Embodiment

A fourth embodiment of the invention will be described below with reference to the drawings.

Figure 17:
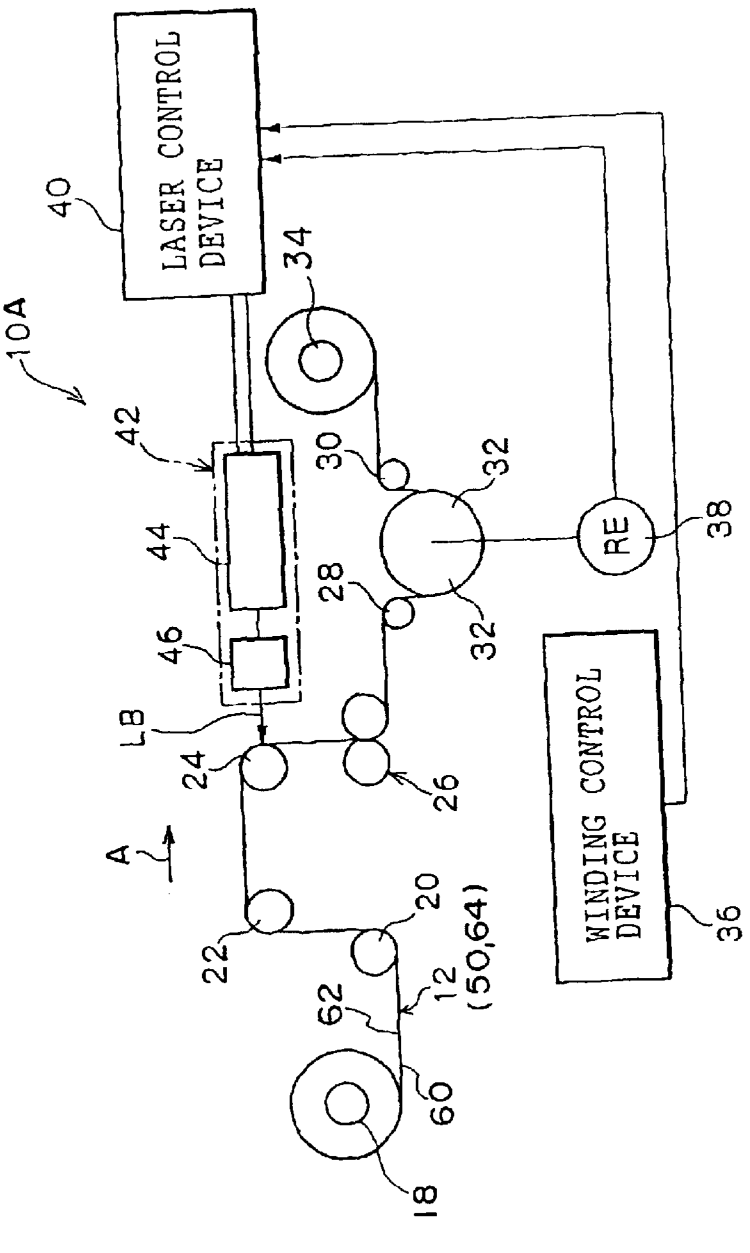
FIG. 17 is a schematic structural diagram of a marking device used in a fourth embodiment.

FIG. 17 shows the schematic structure of a marking device 10A used in the present embodiment. In the marking device 10A of FIG. 17, the X-ray film 12 is wound in a roll around the roll core 18 with a surface layer 60 of the X-ray film 12 facing outward. The marking device 10A adopts a configuration that is the same as that of the marking device 10 of FIG. 1 with the exception that the disposition of the roll core 34 is different from the case of the marking device 10. Therefore, description that is shared in common with the marking device 10 in regard to configuration and operation will be omitted.

In the marking device 10A, a long photosensitive material that is wound in a roll is used as a printed body, and in a process in which the photosensitive material is conveyed, the laser beam LB is irradiated in a spot by the condenser lens to form a marking pattern such as characters and symbols resulting from the dot arrangement.

In the present embodiment, a marking pattern is formed on the X-ray film 12, which is a one-sided photosensitive film serving as the long photosensitive material. It is also possible to use, as the X-ray film 12 in this case, either a wet film that is developed using a processing fluid such as a developing fluid or a dry film that is thermally developed.

Figure 18A:
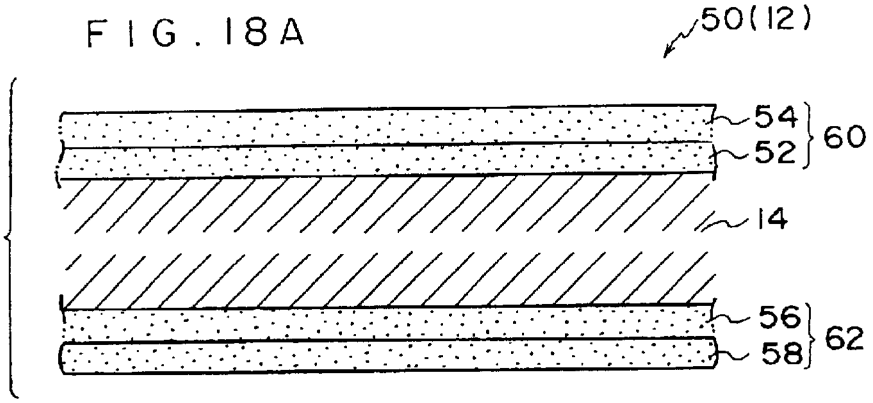
FIG. 18A is a schematic structural diagram showing an example of a wet film used as a photosensitive film.

As shown in FIG. 18A, using PET (polyethylene terephthalate) for the base layer 14, which is a support, a wet film 50 includes an Em layer 52, which is formed by coating an emulsion prepared using gelatin, a silver halide, a sensitizing dye, a hardener and the like, and an OC layer 54, which is prepared using gelatin, a charge regulator, a mat agent and the like and which protects the surface of the Em layer 52. The Em layer 52 and the OC layer 54 are formed on one side of the base layer 14.

A BC layer 56, which is prepared by gelatin, a dye and the like, and a BPC layer 58, which is prepared by gelatin, a charge regulator, a mat agent and the like, are formed on the other side of the base layer 14 of the wet film 50.

Below, the Em layer 52 and the OC layer 54 will be collectively referred to as the surface layer 60, and the BC layer 56 and the BPC layer 58 will be collectively referred to as an undersurface layer 62. That is, the surface layer 60 is formed on one side of the base layer 14 by the Em layer 52 and the OC layer 54, and the undersurface layer 62 is formed on the other surface by the BC layer 56 and the BPC layer 58.

In the wet film 50, the thicknesses of the base layer 14, the surface layer 60, and the undersurface layer 62 are, for example, about 175 $\mu$m, about 4 $\mu$m, and about 3 $\mu$m, respectively.

Figure 18B:
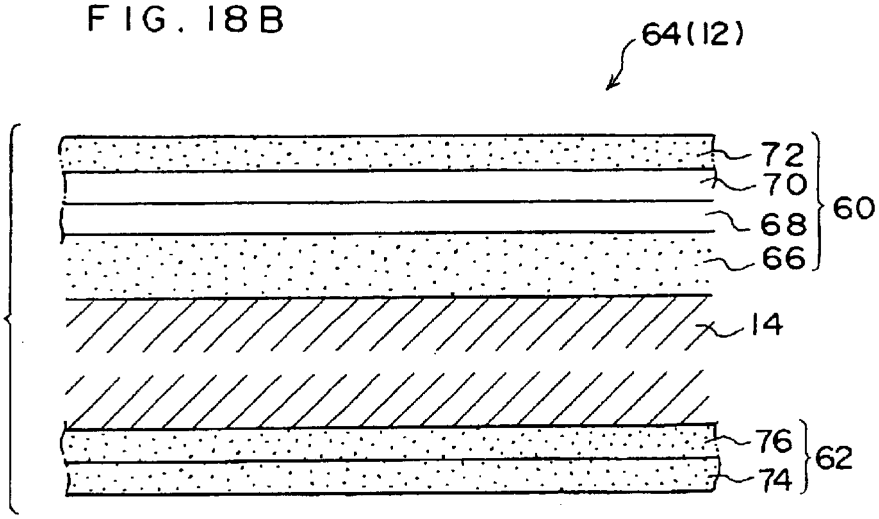
FIG. 18B is a schematic structural diagram showing an example of a dry film used as the photosensitive film.

As shown in FIG. 18B, a dry film 64 includes an Em layer 66, which is prepared by SBR (styrene-butadiene rubber), a silver halide, organic silver, a reducing agent, a dye, an image stabilizer, a hardener and the like, an MC layer 68, which is prepared by PVA (polyvinyl alcohol), a polymer latex and the like, a PC layer 70, which is prepared by a gelatin polymer latex and the like, and an OC layer 72, which is prepared by gelatin, a charge regulator, a mat agent and the like. The Em layer 66, the MC layer 68, the PC layer 70, and the OC layer 72 are formed on one side of the base layer 14.

A BPC layer 74, which is prepared by gelatin, a charge regulator and a mat agent, and a BC layer 76, which is prepared using a decolorizer in addition to gelatin and a dye, are formed on the other side of the base layer 14 of the dry film 64.

Below, the Em layer 66, the MC layer 68, the PC layer 70, and the OC layer 72 will be collectively referred to as the surface layer 60, and the BPC layer 74 and the BC layer 76 will be collectively referred to as the undersurface layer 62. That is, the dry film 64 is a film in which the surface layer 60 is formed on one side of the base layer 14 by the Em layer 66, the MC layer 68, the PC layer 70, and the OC layer 72, and the undersurface layer 62 is formed on the other side by the BPC layer 74 and the BC layer 76.

In the dry film 64, the thicknesses of the base layer 14, the surface layer 60, and the undersurface layer 62 are, for example, about 175 μm, about 21 μm, and about 3.5 μm, respectively.

The X-ray film 12 used in the present embodiment is a common one-sided photosensitive material in which the surface layer 60 is formed on one side of the base layer 14 and the undersurface layer 62 is formed on the other side of the base layer 14. By disposing the undersurface 62 (mainly the BC layer 56 or the BC layer 76) including gelatin, diffuse reflection of light to which the surface layer 60 is exposed is prevented.

As shown in FIG. 17, the X-ray film 12 is wound around the roll core 18 with the surface layer 60 facing outward, and the marking device 10A pulls the X-ray film 12 out from the outermost layer. At this time, in the marking device 10A, the X-ray film 12 is pulled out so that the surface layer 60 faces downward and the undersurface layer 62 faces upward.

The X-ray film 12 that is sent from the rolls 26 is conveyed in a substantial U shape between the pair of small rolls 28 and 30, sent from the small roll 30, and wound around the roll core 34 so that the surface layer 60 faces outward.

The beam deflector 46 includes, for example, an AOD (acousto-optical device), and includes the function of scanning the laser beam LB in a direction orthogonal to the conveyance direction of the X-ray film 12 using the deflection signal from the laser control device 40. It should be noted that each scanned laser beam LB is condensed in a spot by the condenser lens and irradiated onto the X-ray film 12.

With regard to other configurations and operations of the marking device 10A, reference should be made to the description in regard to the marking device 10 of FIG. 1.

As shown in FIGS. 17 and 3, when the X-ray film 12 is wound around the print roll 24, the marking head 42 is disposed so as to face the X-ray film 12 at a position slightly raised from the peripheral surface of the print roll 24. Thus, the laser beams LB that have been transmitted through the X-ray film 12 are prevented from heating dust adhering to the peripheral surface of the print roll 24 and generating fogging in the X-ray film 12.

A $CO_2$ laser is used as an example in the marking device 10A, and a laser oscillating tube that outputs a $CO_2$ laser of a fixed wavelength, such as a 9 μm band, such as 9.6 μm, or a 10 μm band, such as 10.6 μm, is used for the laser oscillator 44 of the marking head 42.

In the marking device 10A, the undersurface layer 62 of the X-ray film 12 faces the marking head 42, whereby the laser beams LB condensed in a spot are irradiated towards the undersurface layer 62 of the X-ray film 12 to form dots in the undersurface layer 62.

Figure 20:
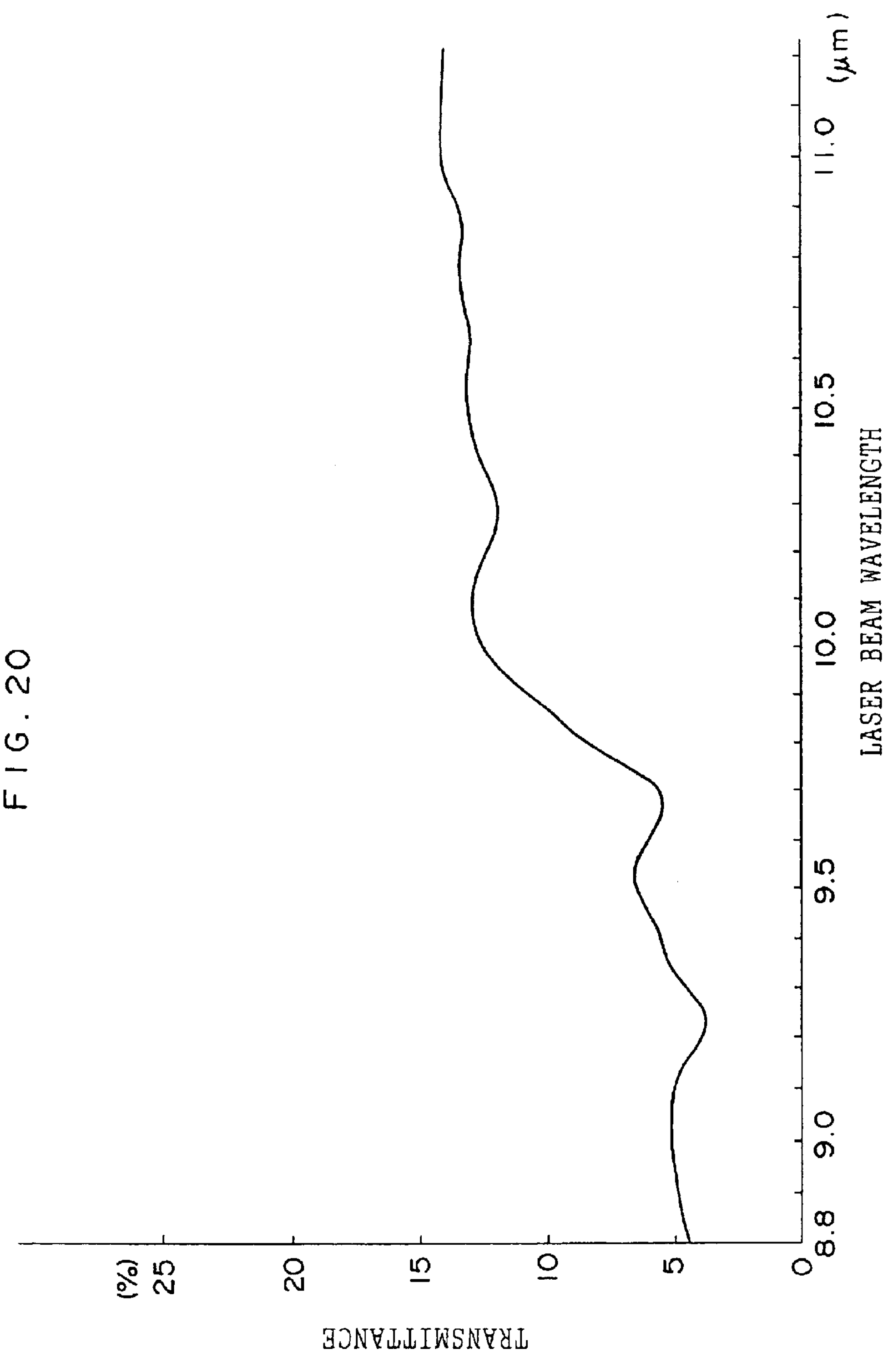
FIG. 20 is a line diagram showing changes in transmittance, with respect to a laser beam wavelength, of a BPC layer forming the undersurface layer.

FIG. 20 shows the transmittance corresponding to the wavelength of the laser beams LB of the BPC layers 58 and 74 formed in the undersurface layer 62. The transmittance of the laser beams LB in the BPC layers 58 and 74 disposed in the undersurface layer 62 of the X-ray film 12, such as the wet film 50 or the dry film 64, is, similar to that of the OC layers 54 and 72, relatively low.

Thus, when the laser beams LB are irradiated onto the undersurface layer 62, the energy of the laser beams LB is absorbed mainly by the undersurface layer 62, whereby melting and evaporation is generated in the undersurface layer 62.

Numerous air bubbles are generated in the undersurface layer 62 of the X-ray film 12 in a process in which the undersurface layer 62 is melted by the laser beams LB being irradiated. The numerous minute air bubbles are visible as dots due to the fact that the directions in which the light is reflected are varied by the boundary films. In the X-ray film 12, the dots generated in the undersurface layer 62 are visible not only from the undersurface layer 62 but also from the surface layer 60.

In the BPC layers 58 and 74 of the undersurface layer 62, the transmittance of laser beams having a wavelength in the 9 μm band, such as 9.2 μm, 9.3 μm, and 9.6 μm, is lower than the transmittance of laser beams having a wavelength in the 10 μm band, such as 10.6 μm. Thus, when the irradiation time of the laser beam LB is shortened and highly visible milky-white dots are formed, it is preferable to use a laser beam LB of a 9 μm band wavelength rather than a laser beam LB of a 10 μm band wavelength.

In the marking device 10A, the laser beams LB are irradiated onto the undersurface 62 of the X-ray film 12 to form mirror images, such as characters and symbols, which become the marking patterns MP. That is, the laser control device 40 controls the laser oscillator 44 and the beam deflector 46 by the pattern signal on the basis of the mirror images of the marking patterns MP to be formed on the X-ray film 12.

Figure 19A:
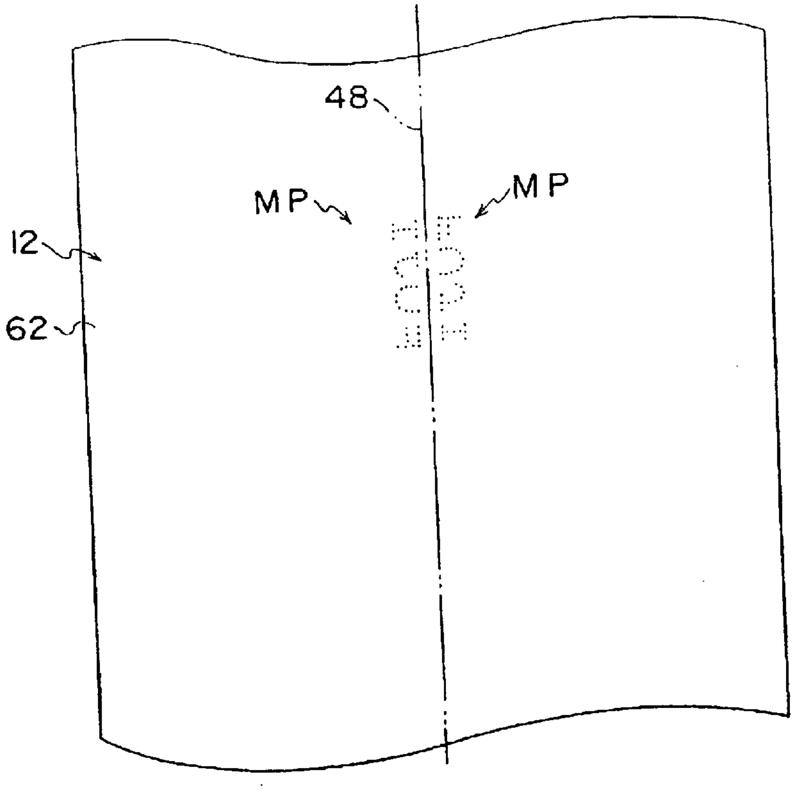
FIG. 19A is a schematic diagram in which dots formed by the marking device are seen from an undersurface layer of the X-ray film.
Figure 19B:
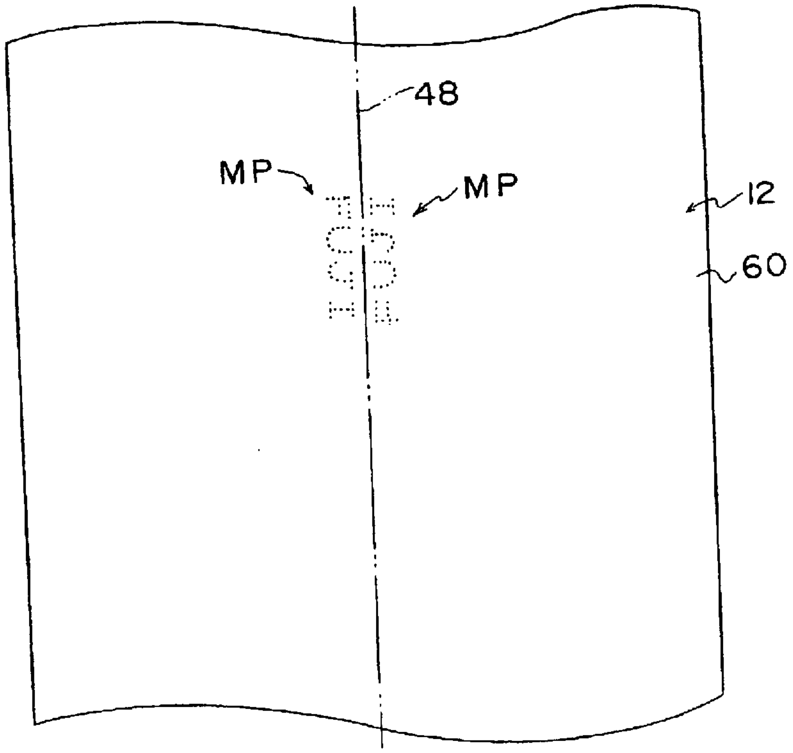
FIG. 19B is a schematic diagram in which the dots formed by the marking device are seen from a surface layer of the X-ray film.

Thus, as shown in FIG. 19A, mirror images of the marking patterns MP are formed on the undersurface layer 62 of the X-ray film 12. Also, as shown in FIG. 19B, when the marking patterns MP are seen from the surface layer 60, they appear as normal images, and it is clear that the surface on which the normal images are seen is the side of the X-ray film 12 disposed with the surface layer 60.

In the marking device 10A, the irradiation time of the laser beams LB when each dot is formed is appropriately controlled, the laser beams LB are irradiated so that the diameter of the dots is about 0.2 mm or more and the intervals between the dots is appropriate, and highly visible dots or the marking patterns MP resulting from the dot arrangements are formed.

In the marking device 10A, the X-ray film 12 is conveyed so that the undersurface layer 62 faces the marking head 42, and the laser beams LB are irradiated towards the undersurface layer 62 of the X-ray film 12.

As shown in FIG. 20, the energy of the laser beams LB is absorbed mainly by the undersurface layer 62 because the transmittance with respect to the laser beams LB of the BPC layers 58 and 74 forming the undersurface layer 62 of the X-ray film 12, such as the wet film 50 and the dry film 64, is low. Thus, numerous air bubbles are generated in a process in which melting is generated in the undersurface layer 62. In the X-ray film 12, the amount of reflected light varies greatly inside and outside due to the numerous air bubbles, and visible dots whose interiors have become milky-white due to the numerous air bubbles are formed. High visibility of these dots is obtained regardless of whether the X-ray film 12 is undeveloped or developed and regardless of the contrast in density.

Because the X-ray film 12 has light transmittance, the dots formed in this manner on the undersurface layer 62 of the X-ray film 62 are also visible from the surface layer 60 of the X-ray film 12.

The laser control device 40 controls the irradiation of the laser beams LB so that mirror images of the marking patterns MP are formed on the undersurface layer 62 of the X-ray film 12.

Thus, as shown in FIG. 19A, the marking patterns MP formed by the dot arrangements appear as mirror images when seen from the undersurface layer 62 of the X-ray film 12.

Also, in the X-ray film 12, the dots formed on the undersurface layer 62 are also visible from the surface layer 60 in which the Em layer 52 or the Em layer 66 is formed. Thus, as shown in FIG. 19B, in the X-ray film 12, the marking patterns MP formed on the undersurface layer 62 are visible as normal images when seen from the surface layer 60.

Accordingly, it becomes possible to accurately discern, due to whether the marking patterns MP formed on the X-ray film 12 are normal images or mirror images, which side of the X-ray film 12 is the side disposed with the surface layer 60 for which image-exposure is to be conducted.

In the present embodiment, when the marking patterns are formed on the X-ray film 12, the laser beams LB are irradiated onto the undersurface layer 62 and not onto the surface layer 60 in which the Em layer 52 or the Em 66 is formed, whereby the dots are formed in the undersurface layer 62.

Thus, emulsion waste is not generated by the X-ray film 12 receiving the energy of the laser beam LB, and white spots resulting from emulsion waste adhering to the surface of the surface layer 60 are not generated when the exposed image is developed.

Also, in the marking device 10A, because dust and emulsion waste in the air or adhering to the surface of the X-ray film 12 does not receive the heat of the laser beams LB and burn in the surface of the surface layer 60 of the X-ray film 12, a drop in final image quality, such as fogging resulting from the burning of dust and emulsion waste, is not generated.

Accordingly, in the marking device 10A, highly visible marking patterns can be formed using the laser beams LB, without causing the product quality of the X-ray film to drop.

Also, because emulsion waste and processing waste generated at the time of processing do not adhere to the surface of the surface layer 60 of the dry film 64 when the dry film 64, whose surface easily sustains damage, is used as the X-ray film 12, it is possible to prevent the surface from being damaged by processing waste when the dry film 64 is marked.

EXPERIMENTAL EXAMPLE 4

Figure 21:
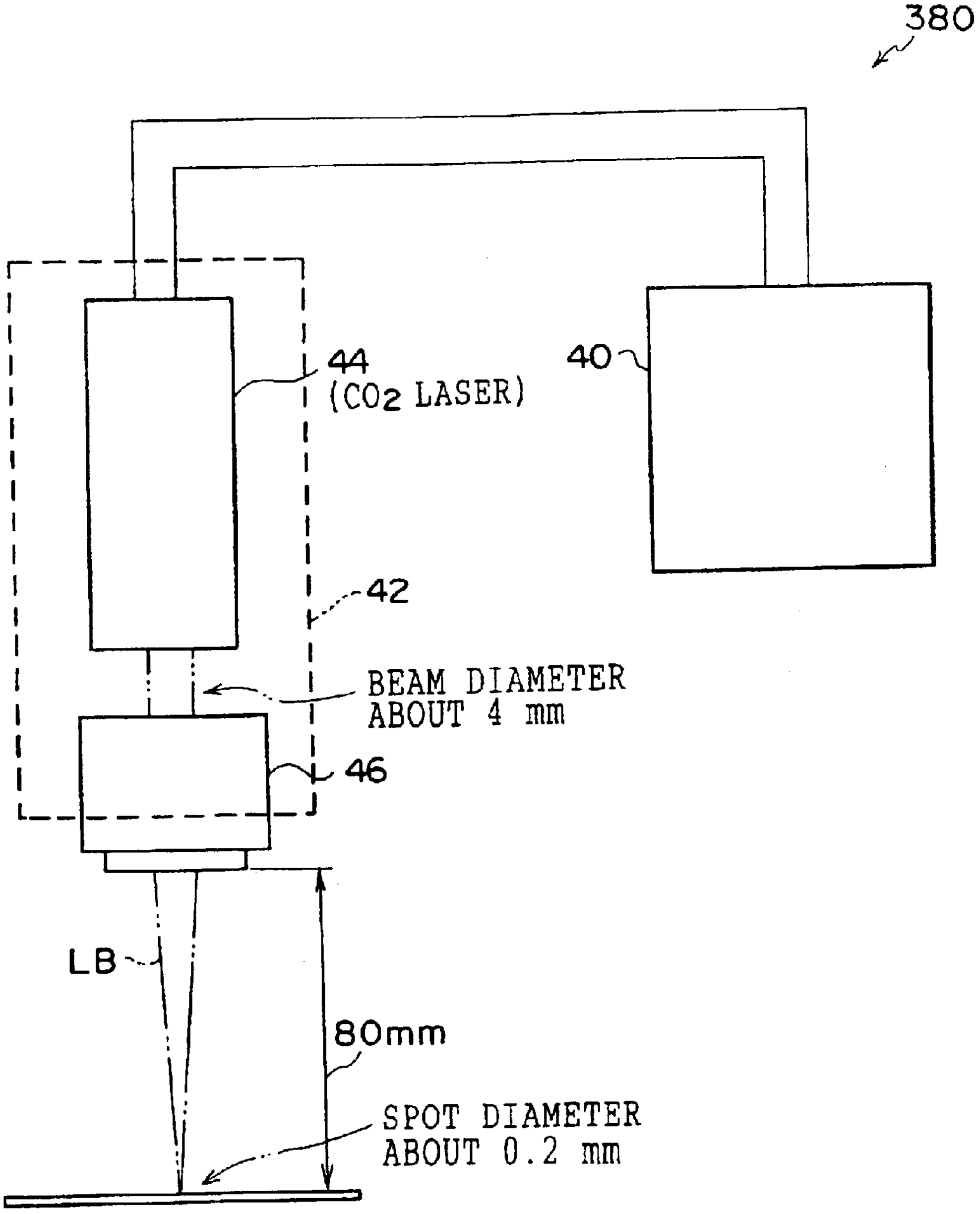
FIG. 21 is a schematic structural diagram of an experimental device used in the evaluation of dot forms in the fourth embodiment.

FIG. 21 shows an experimental device 380 that forms dots on the X-ray film 12 using a $CO_2$ laser as the laser oscillator 44.

In the experimental device 380, the laser beam LB was irradiated onto the X-ray film 12, which was used as an evaluation sample, using the marking head 42 and the laser control device 40, and the forms of the dots formed on the X-ray film 12 were observed.

At this time, in the experimental device 380, the distance between the lower end of an unillustrated condenser lens and the X-ray film 12 serving as the evaluation sample was 80 mm, and the focal point of the laser beam LB was disposed on the X-ray film 12. Also, the spot diameter of the laser beam LB was about 0.4 mm between the laser oscillator 44 and the beam deflector 46 and 0.2 mm on the X-ray film 12 serving as the focal position.

Here, in a first evaluation experiment, the laser beam LB was irradiated onto the surface layer 60 and the undersurface layer 62 of evaluation samples using the laser oscillator 44 having an oscillation wavelength of 10.6 μm, and the forms of the dots that were formed were evaluated. At this time, AL5 (brand name), which is a dry film (thermally-developed photosensitive material) for X-ray use manufactured by Fuji Photo Film Co., Ltd., was used as the dry film 64 (see FIG. 18B) for the evaluation samples, and the irradiation time of the laser beam LB was 30 μsec.

As a result, dots of a visibility that was the same as those of the surface layer 60 could be formed on the undersurface layer 62 of the evaluation samples.

In photosensitive materials such as the X-ray film 12, the thickness, layer configuration, components, and component ratio of the undersurface layer 60 differs depending on the brand. For this reason, it was necessary to change the irradiation time and oscillation wavelength of the laser beam LB according to the brand in order to form appropriate visible dots on the surface layer 60.

In contrast, the basis configuration of the undersurface layer 62 was substantially the same. For this reason, proper dots could be formed without changing the irradiation time and oscillation wavelength of the laser beam LB when the marking pattern MP was formed on X-ray films 12 of different brands.

That is, by irradiating the laser beam onto the undersurface layer 62 to form the dots, marking was possible with the same irradiation time using the same marking head 42 even if the brand of X-ray film 12 was different.

Next, a second evaluation experiment using the experimental device 380 will be described. In the second evaluation experiment, using four types of laser oscillators 44, in which the oscillation wavelengths thereof were 9.2 μm, 9.3 μm, 9.6 μm, and 10.6 μm, the irradiation time of the laser beam LB was varied for each wavelength, dots were formed on the undersurface layer 62 of the X-ray film 12 used as the evaluation samples, and the evaluation experiment was conducted when the dot forms were seen from the surface layer 60.

It should be noted that the AL5 (brand name) thermally-developed photosensitive material manufactured by Fuji Photo Film Co., Ltd., which is one type of dry film 64 (see FIG. 18B), was used as the X-ray film 12 serving as the evaluation samples.

In the evaluations, the following symbols were used.

"○" indicates that milky-white dots were formed, and that the dots were also visible from the emulsion layer (surface layer 60).

"Δ" indicates that melting proceeded to the interior of the film, there were few remnants of milky-white portions, and the dots were visible from the back surface (undersurface layer), but the dots were difficult to see (read) from the emulsion surface (surface layer).

"x" indicates that only color changed slightly, traces of processing could not be seen, and it was difficult to see the dots even from the undersurface layer.

Table 5 shows the results of evaluation of the dot forms for each wavelength when the irradiation time of the laser beam LB was varied in fourteen stages between 3 μsec and 65 μsec.

TABLE 5

| Irradiation | Irradiation Wavelength (Laser Beam Wavelength: μm) | | | |
|---|---|---|---|---|
| Time (μsec) | 9.2 | 9.3 | 9.6 | 10.6 |
| 3 | x | x | x | x |
| 5 | ○ | ○ | ○ | x |
| 10 | ○ | ○ | ○ | x |

TABLE 5-continued

| Irradiation | Irradiation Wavelength (Laser Beam Wavelength: μm) | | | |
|---|---|---|---|---|
| Time (μsec) | 9.2 | 9.3 | 9.6 | 10.6 |
| 15 | ○ | ○ | ○ | x |
| 20 | ○ | ○ | ○ | x |
| 25 | Δ | Δ | Δ | ○ |
| 30 | Δ | Δ | Δ | ○ |
| 35 | Δ | Δ | Δ | Δ |
| 40 | Δ | Δ | Δ | Δ |
| 45 | Δ | Δ | Δ | Δ |
| 50 | Δ | Δ | Δ | Δ |
| 55 | Δ | Δ | Δ | Δ |
| 60 | Δ | Δ | Δ | Δ |
| 65 | Δ | Δ | Δ | Δ |

As is clear from the evaluation results of Table 5, by using the 10.6 μm wavelength laser beam LB, whose transmittance at the undersurface layer 62 (BPC layers 58 and 74) was high in comparison to the 9 μm band, proper dots could be formed by setting the irradiation time of the laser beam LB to be 30 μsec to 35 μsec.

It was also possible to form proper dots in the relatively short irradiation time of 5 μsec to 25 μsec with respect to the 9.2 μm, 9.3 μm, and 9.6 μm wavelength laser beams LB, whose transmittance at the undersurface layer 62 was low.

Thus, when the laser beam LB was irradiated onto the undersurface layer 62 to form the marking pattern MP, proper dots could be formed by irradiating the laser beam LB for a short time by using a laser beam LB of a wavelength whose transmittance at the undersurface layer 62 (mainly the BPC layers 58 and 74) was low.

It should be noted that the above-described embodiment is not intended to limit the configuration of the invention. For example, although description was given in the embodiment of an example in which the X-ray film 12, which is a film for medical use, was used as the photosensitive film, the invention is not limited thereto. Use in the formation of a marking pattern on a photosensitive material of an optional configuration, in which a surface layer including an emulsion layer is formed on one side of a light-transmitting support such as PET or PEN, such as color photographic film, black-and-white photographic film, and lithographic film, is possible.

Also, although description was given in the embodiment of an example in which the marking device 10A was used, the configuration with which the photosensitive film is marked is not limited thereto. A processing device of an optional configuration can also be used as long as it includes marking means that marks the photosensitive film by irradiating a laser beam onto the photosensitive film.

As described above, according to the fourth embodiment of the invention, excellent effects can be obtained in that, when a laser beam is irradiated onto a one-sided photosensitive film, in which a surface layer including an emulsion layer is formed on one side of a support and an undersurface layer that serves as a layer to prevent diffuse reflection of light and as a protective layer is formed on the other side of the support, to form dots and a marking pattern resulting from the dot arrangement, the laser beam is irradiated onto the undersurface layer of the photosensitive film and dots are formed on the undersurface layer, whereby a drop in finished product quality, such as fogging in the emulsion layer forming the surface layer, can be prevented.

Also, because the mirror images are visible as normal images from the surface layer of the photosensitive film by forming the mirror images on the undersurface layer, it becomes possible to reliably discern which side of the photosensitive film is the side on which the surface layer disposed with the emulsion layer is formed.

Fifth Embodiment

Figure 22:
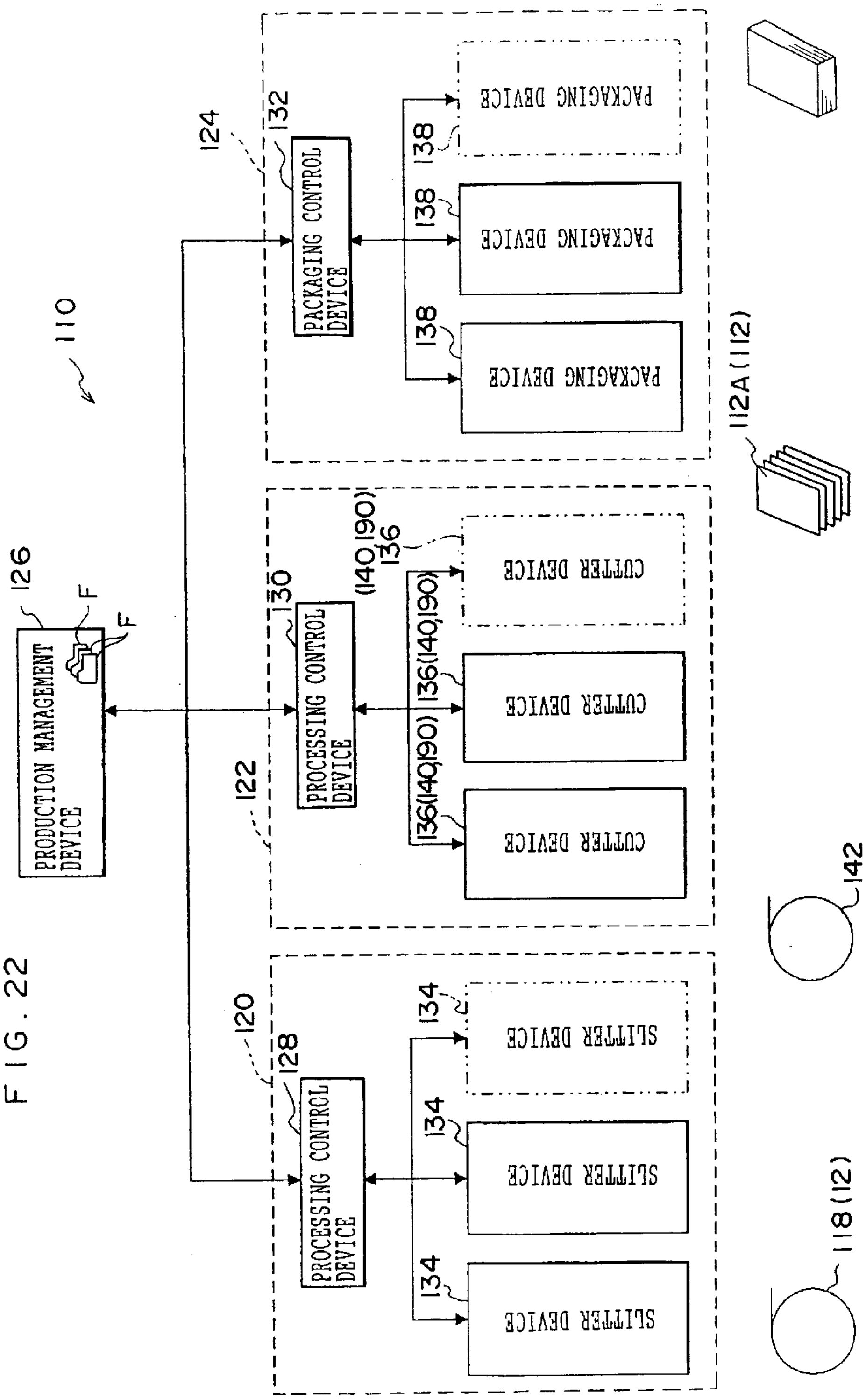
FIG. 22 is a schematic structural diagram of a photosensitive material processing system used in a fifth embodiment of the invention.

FIG. 22 shows the schematic configuration of a photosensitive material processing system 110 used in fifth and sixth embodiments of the invention. The photosensitive material processing system 110 processes and packages X-ray film 112 that is used as the photosensitive material.

Figure 23:
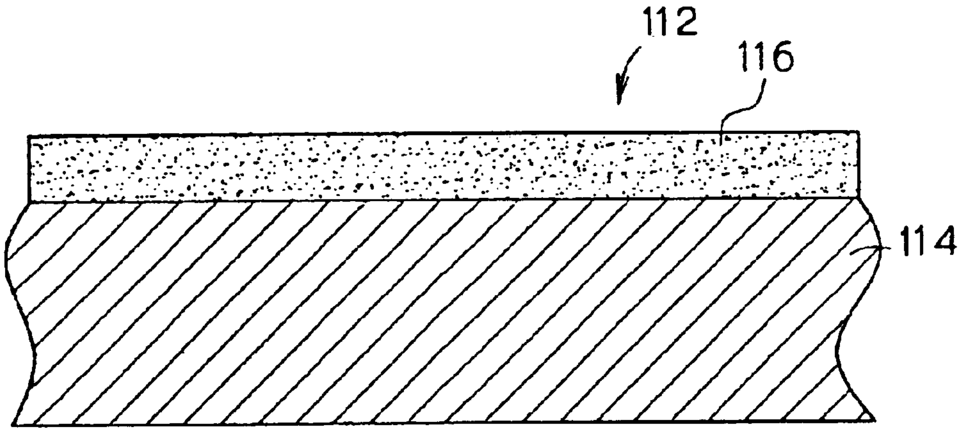
FIG. 23 is a schematic structural diagram of an X-ray film used as a photosensitive material in the fifth embodiment of the invention.

As shown in FIG. 23, the X-ray film 112 includes, as a base layer 114, a support that is formed using PET (polyethylene terephthalate) and an emulsion layer 116 that is formed on at least one side of the base layer 114.

As shown in FIG. 22, an X-ray film 112 processing line is formed in the photosensitive material processing system and includes: a slitting step 120, in which the X-ray film 112 is pulled out from a roll 118, in which the long X-ray film 112 is wound in a roll, slit into a predetermined width, and wound into a roll; a cutting step 122, in which the X-ray film 112 that has been processed in the slitting step 120 is cut into predetermined lengths and processed into sheets, which is the final mode of the X-ray film 112; and a packaging step 124, in which the X-ray film 112 that has been formed into sheets in the cutting step 122 and stacked (hereinafter referred to as "X-ray film 112A") is packaged.

The photosensitive material processing system 110 may include a packaging system having a conventionally well-known optional configuration for shipping, as a product, the X-ray film 112A that has been processed into its final mode by accommodating the X-ray film 112A into magazines and packaging the X-ray film 112A in the packaging step 124. Also, in the photosensitive material processing system 110, it is also possible to cut the roll 118 in the cutting step 122 without conducting slitting.

A production management device 126 is disposed in the photosensitive material processing system 110. Also, processing control devices 128 and 130 and a packaging control device 132 are respectively disposed for the slitting step 120, the cutting step 122, and the packaging step 124.

In the photosensitive material processing device 110, a lot number of the X-ray film 112 to be processed, a production size that is the final mode of the X-ray film 112, a slitting pattern for when the X-ray film 112 is cut into the production size, and a scheduled production line are set on the basis of a preset production program and inputted to the production management device 126 as processing information. Also, an emulsion number, a roll number, brand, and coating roll length of the roll 118 to be processed are inputted to the production management device 126 as photosensitive material information.

When the photosensitive material information and the processing information are inputted to the production management device 126, the production management device 126 sets a processing order, sets a slitting pattern when the X-ray film 112 is to be processed, a palette number used in the conveyance of the X-ray film 112, and a magazine number on the basis of the photosensitive material information and the processing information, and sets processing conditions that are work descriptions in each of the slitting step 120, the cutting step 122, and the packaging step 124 on the basis of these settings. It should be noted that these processing conditions may also be created by the production program and inputted to the production management device 126 as processing information.

Due to the processing information such as the final mode and the photosensitive material information of the roll 118 being inputted to the production management device 126, the production management device 126 creates a lot information file F with respect to the X-ray film 112 of the roll 118.

At least one, and preferably several, slitter device 134, cutter device 136, and packaging device 138 are disposed for the slitting step 120, the cutting step 122, and the packaging step 124.

The processing control devices 128 and 130 and the packaging control device 132 read the processing conditions for each step stored in the lot information file F from the production management device 126, select the slitter device 134, the cutter device 136, and the packaging device 138 according to the settings of the processing line (scheduled processing line), and conduct processing with respect to the X-ray film 112. Also, when the processing with respect to the X-ray film 112 ends, the processing control devices 128 and 130 and the packaging control device 132 output the processing status to the production management device 126.

The production management device 126 stores the processing status inputted from the processing control devices 128 and 130 and the packaging control device 132 in the lot information file F with respect to the X-ray film 112, and adds this to a processing history with respect to the X-ray film 112.

Thus, respective data with respect to the X-ray film 112 (X-ray film 112A) that has been made into a product, such as photosensitive material information such as the lot number of the roll 118, the emulsion number, the roll number, brand, and coating roll length, processing conditions such as the production size (processing size), processing line, and slitting pattern, and processing history information such as the slit record length, the processing status, the palette number, the magazine number, the sheet yield, and the packaged product yield, are finally stored in the lot information file F.

As described above, in the photosensitive material processing system 110, a predetermined marking pattern is formed on each X-ray film 112A that is the final mode. Although it is possible to form the marking pattern on the X-ray film 112 with the slitter device 134 disposed for the slitting step 120, in the fifth and sixth embodiments, the marking pattern is formed with the cutter device 136 disposed for the cutting step 122.

Here, the cutter device 136 usable in the photosensitive material processing system 110 and the formation of the marking pattern on the X-ray film 112 (112A) will be described.

Figure 24:
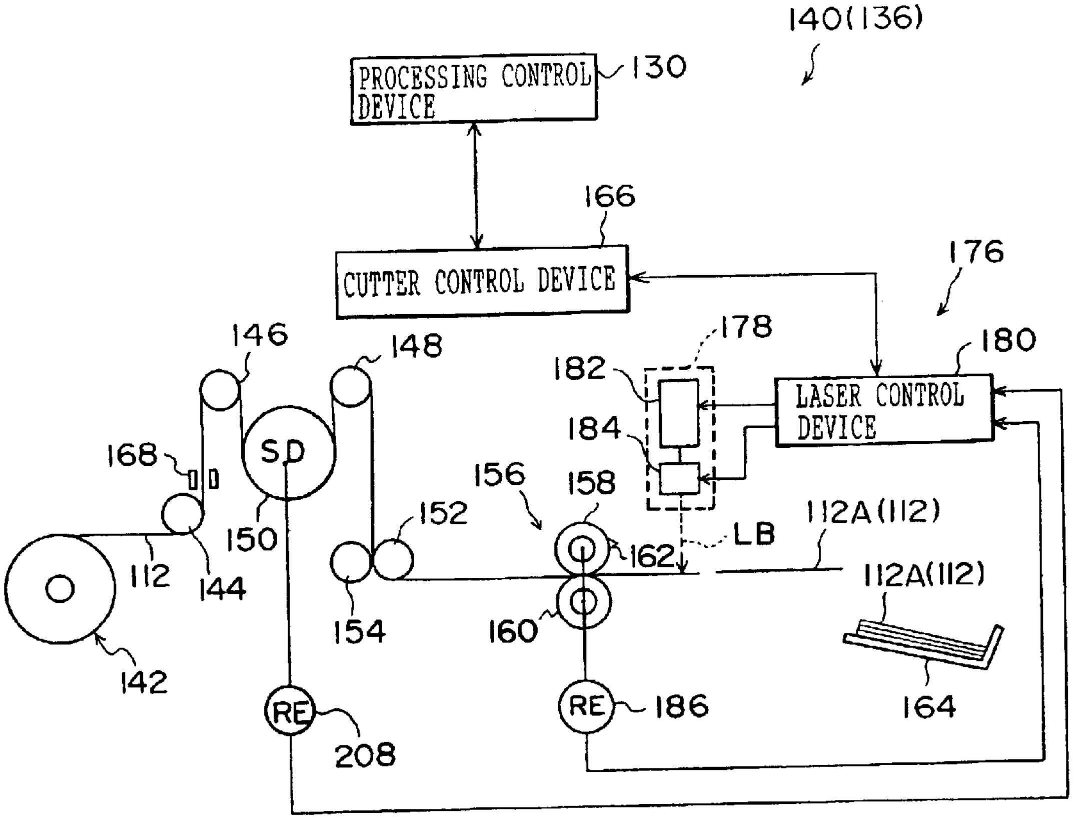
FIG. 24 is a schematic structural diagram of a cutter device applied to the fifth embodiment.

FIG. 24 shows the schematic configuration of an example of the cutter device 136 (referred to below as a "cutter device 140" in order to distinguish it from a device that conducts ordinary cutting) disposed for the cutting step 122 in the fifth embodiment. X-ray film 112 (roll 142) that has been wound in a roll after being pulled out from the roll 118 and slit to a predetermined width by the slit device 134 is loaded in the cutter device 140. It should be noted that the roll 118 may be loaded in place of the roll 142 when the roll 118 is to be cut without slitting it to another width.

A pass roll 144 is disposed near the roll 142 in the cutter device 140. The X-ray film 112 that has been pulled out from an outer peripheral end of the roll 142 is wound around the pass roll 144, whereby it is sent upward (upward with respect to the page of FIG. 24).

Small rolls 146 and 148 are disposed as a pair above the pass roll 144, and a suction drum 150 is disposed between the small rolls 146 and 148. Thus, a substantially U-shaped conveyance path is formed between the small rolls 146 and 148.

Unillustrated plural small holes are formed in an outer peripheral surface of the suction drum 150, and the X-ray film 112 wound around the outer peripheral surface is sucked and retained by air suction from the small holes. Also, the suction drum 150 can be moved downward (with respect to the page of FIG. 24) by its own weight or by an urging force of unillustrated urging means. A predetermined tension is imparted to the X-ray film 112 in accompaniment with this movement.

Thus, due to the suction drum 150 being rotatingly driven by a drive force of unillustrated drive means, the X-ray film 112 is sent from the suction drum 150 at a constant tension while being pulled out from the roll 142.

Rolls 152 and 154 are disposed as a pair below the small roll 148, and the X-ray film 112 is wound around the roll 152 and sent in a horizontal direction therefrom.

A cutter 156 is disposed downstream of the roll 154 (downstream in the conveyance direction of the X-ray film 112). The cutter 156 nips and sends the X-ray film 112 between an upper blade roll 158 and a lower blade roll 160. The cutter 156 also includes a cutting blade 162. The X-ray film 112 is cut along a width direction orthogonal to the conveyance direction by the cutter 156 operating the cutting blade 162.

Thus, the X-ray film 112 is processed into sheets. The X-ray film 112 that has been processed into sheets is successively accommodated in a stacking tray 164, whereby it is layered and stacked.

A cutter control device 166 is disposed in the cutter device 140. The cutter control device 166 controls a drive of an unillustrated drive source, whereby the suction drum 150 is rotatingly driven at a constant speed and the X-ray film 112 is conveyed and sent to the cutter 156.

The cutter control device 166 also rotatingly drives the upper blade roll 158 and the lower blade roll 160 of the cutter 156 and, when the X-ray film 112 of a predetermined amount is sent, operates the cutting blade 162 to cut the X-ray film 112.

A web edge control sensor 168 is disposed near the pass roll 144 in the cutter device 140. The cutter control device 166 controls an axial-direction position of a roll core of the roll 142 so that a width-direction end portion of the X-ray film 112 detected by the web edge control sensor 168 passes a constant position and the X-ray film 112 does not become horizontally displaced.

The cutter control device 166 is connected to the processing control device 130 disposed for the cutting step 122. The processing conditions in the lot information file F of the production management device 126 are inputted to the cutter control device 166 from the processing control device 130, whereby the cutter control device 166 processes (cuts) the X-ray film 112 on the basis of these processing conditions.

Figure 25:
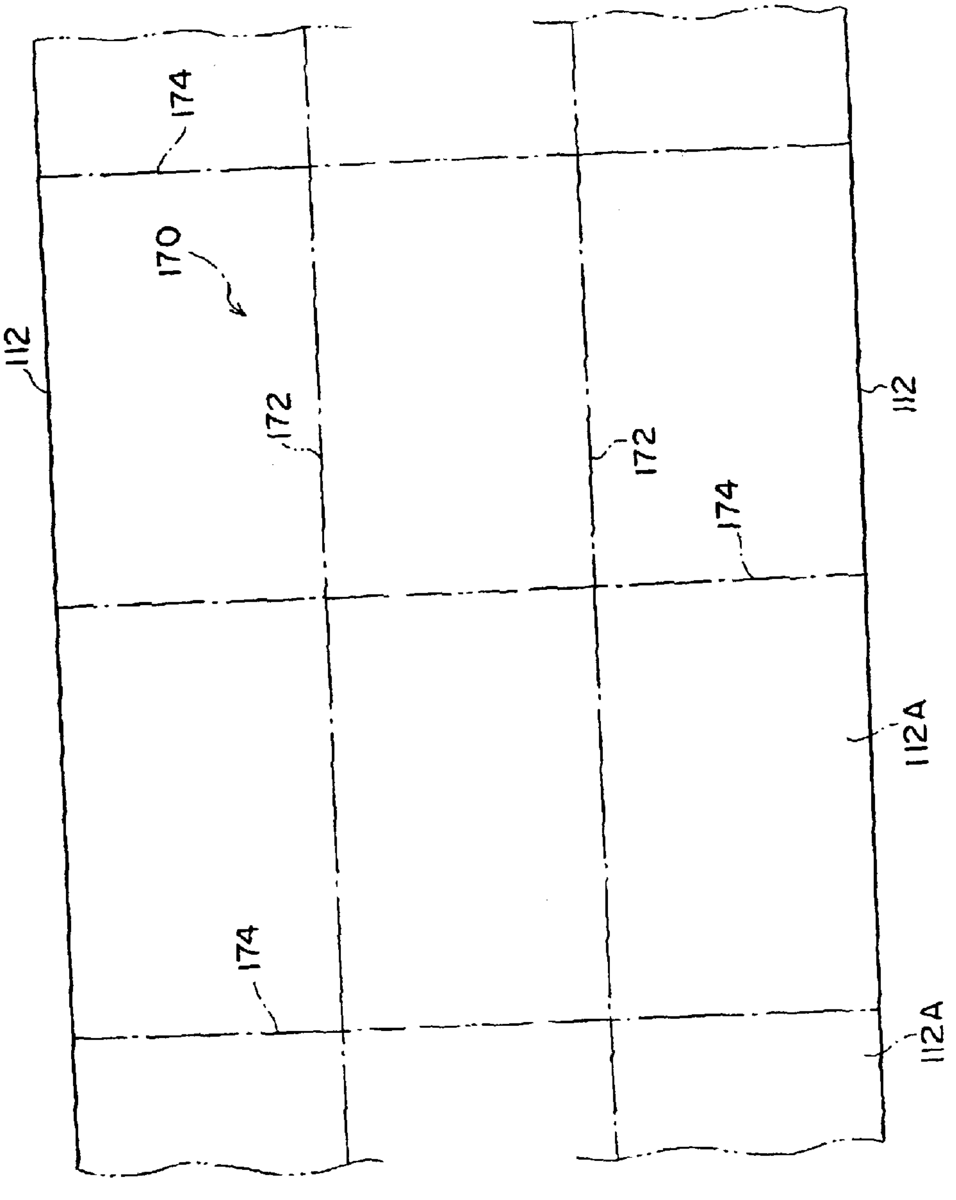
FIG. 25 is a schematic diagram showing an example of a slitting pattern when X-ray film processing is conducted.

That is, as shown in FIG. 25, a slitting pattern 170 for processing the X-ray film 112 pulled out from the roll 118 into the final mode size is set by the production management device 126. Slitting lines 172 when the X-ray film 112 is slit in the slitting step 120 (slitter device 134) and cutting lines 174 when the X-ray film 112 is cut in the cutting step 122 are set as the slitting pattern 170. In the photosensitive material processing system 110, sheets of the X-ray film 112A are obtained by slitting and cutting the X-ray film 112 along the slitting lines 172 and the cutting lines 174.

In the cutter device 140, while the X-ray film 112 that has been slit along the slitting lines 172 and formed to a predetermined width (a width corresponding to, for example, the final mode) is conveyed, the cutting blade 162 is operated each time a conveyance length of the X-ray film 112 conveyed by the upper blade roll 158 and the lower blade roll 160 reaches a length corresponding to the interval between the cutting lines 174. Thus, the X-ray film 112A that is the final mode is stacked in the stacking tray 164.

As shown in FIG. 24, a barcode marker 176 is disposed in the cutter device 140 as marking means. The barcode marker 176 includes a marking head 178, which emits the laser beam LB towards the X-ray film 112, and a laser control device 180, which controls the operation of the marking head 178.

Figure 26:
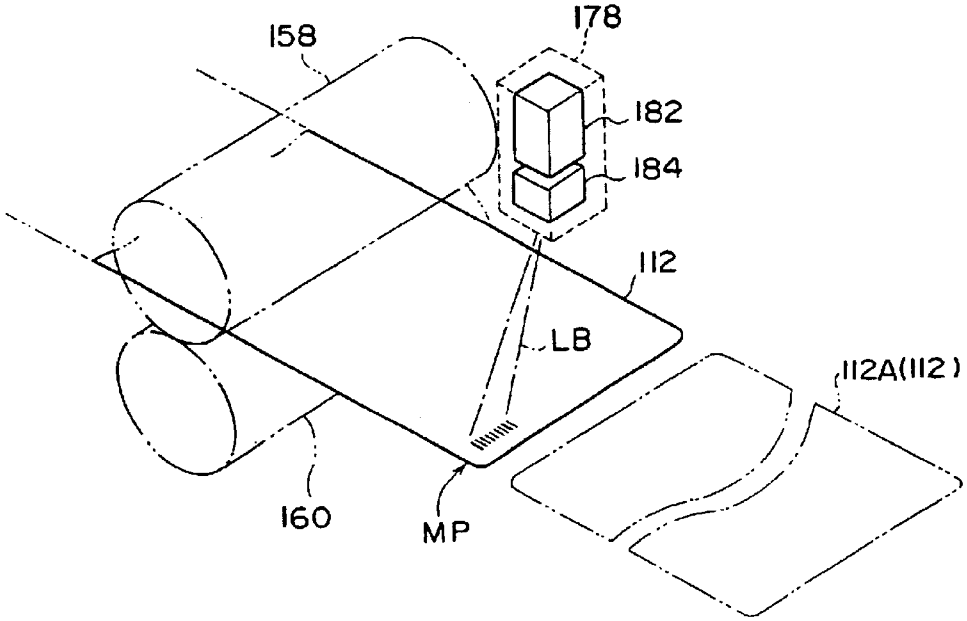
FIG. 26 is a main parts perspective diagram showing an outline of dispositions of a marking head and the X-ray film.

As shown in FIGS. 24 and 26, the marking head 178 includes a laser oscillator 182 and a beam deflector 184 that includes an unillustrated condenser lens. The marking head 78 is disposed so that it faces the X-ray film 112 when a constant amount of the X-ray film 112 is sent from the cutter 156 (the upper blade roll 158 and the lower blade roll 160).

Although description will be given below of an example in which the marking head 178 is disposed so as to face the X-ray film 112 downstream of the cutter 156, the invention is not limited thereto. The marking head 178 may also be disposed facing the X-ray film 112 upstream of the cutter 156.

The laser oscillator 182 used in the present embodiment is a $CO_2$ laser and emits a laser beam LB of a constant oscillation wavelength on the basis of a drive signal inputted from the laser control device 180.

The beam deflector 184 includes, for example, an AOD (acousto-optical device), and scans and irradiates the laser beam LB along the width direction, which is a direction orthogonal to the conveyance direction of the X-ray film 112, on the basis of a deflection signal inputted from the laser control device 180. That is, the barcode marker 176 scans and irradiates the laser beam LB using the width direction of the X-ray film 112 as a main scanning direction and the conveyance direction of the X-ray film 112 as a subscanning direction. It should be noted that the laser beam LB is imaged so that focal points of a predetermined spot diameter are joined on the X-ray film 112 by the unillustrated condenser lens.

The emulsion layer 116 of the X-ray film 112 is melted by the laser beam LB being irradiated thereon, and convex dots are formed with respect to the emulsion layer 116. Thus, it is possible to form characters and symbols of an optional dot arrangement on the X-ray film 112.

By forming these dots tightly (with extremely small interval therebetween) so that they are substantially continuous, it is possible to form an optional pattern (referred to below as "marking pattern MP") from irradiation traces of the laser beam LB.

FIGS. 27A to 27D show applied examples of the marking pattern MP. In a marking pattern MPa shown in FIG. 27A, characters and symbols are formed by the arrangement of the dots. It should be noted that, in FIG. 27A, letters, numbers, and katakana are formed by, for example, a 5×5 dot arrangement.

As shown in FIG. 27B, it is also possible to use, as the marking pattern MP, a marking pattern MPb that is formed so that the dots are continuous. It should be noted that FIG. 27B shows letters and numbers as an example.

Moreover, as shown in FIGS. 27C and 27D, the marking pattern MP may also be a marking pattern MPc or MPd using a symbol such as a barcode, characters, and marks. The marking pattern MPc shown in FIG. 27C uses a one-dimensional barcode, and the marking pattern MPd shown in FIG. 27D uses a two-dimensional barcode.

Description will be given below of an example in which the marking pattern MPc, which uses the one-dimensional barcode and is shown in FIG. 27C, is used as the marking pattern MP. However, the marking pattern MP formed in the X-ray film 112 is not limited thereto, and may use optionally set pictographs and characters.

Although it is not shown in the drawings, plural minute air bubbles are generated within expanded interiors of the dots in a process in which the emulsion layer 116 of the X-ray film 112 is melted by thermal energy of the laser beam LB. In the present embodiment, the degree of convexity of the dots formed in the emulsion layer 116 at this time is 10 μm or less, and the size (diameter) of each air bubble is 1 to 5 μm.

Numerous boundary films between the air bubbles are formed by the plural minute air bubbles being formed in the emulsion layer 116 of the X-ray film 112, and diffuse reflection of light is promoted. Thus, in the present embodiment, because the amount of reflected light varies greatly inside and outside of the dots, visual recognition of the dots becomes possible, regardless of whether the X-ray film 112 is undeveloped or developed and regardless of the contrast in density, and the visibility of the dots is improved.

The irradiation time of the laser beam LB for forming the dots is in the range of 1 μsec to 15 μsec, with the oscillation wavelength of the laser beam oscillator 182 (wavelength of the laser beam LB) being a 9 μm band (e.g., a wavelength of 9.3 μm or 9.6 μm). Although it is possible to form the dots by setting the irradiation time of the laser beam LB to 5 μsec to 8 μsec when the oscillation wavelength of the laser oscillator 182 is a 10 μm band (e.g., 10.6 μm), in the present embodiment, a laser oscillator that oscillates a laser beam LB of a 9 μm waveband is used as the laser oscillator 182 in order to improve working efficiency.

Also, it is preferable for the irradiation time of the laser beam to be further controlled so that a space cannot be formed at the interface between the base layer 114 and the emulsion layer 116 of the X-ray film 112. This space is different from the air bubbles that are generated in the emulsion layer 116 when the dots are formed. When the space is generated between the base layer 114 and the emulsion layer 116, visibility of the dots becomes high at the point in time when the laser beam LB is irradiated and the dots are formed, but the emulsion layer 16 above the space is scattered and opened by developing the X-ray film 112, whereby the state becomes the same as when the dots are formed when the above-described irradiation times (15 μsec for a 9 μm band and 18 μsec for a 10 μm band) are exceeded.

That is, by controlling the irradiation time of the laser beam LB to be in the narrow ranges of 1 μsec to 10 μsec when the oscillation wavelength is a 9 μm band and 5 μsec to 8 μsec when the oscillation wavelength is a 10 μm band, so that a space is not generated between the base layer 114 and the emulsion layer 116 of the X-ray film 112, it becomes possible to reduce differences between the evaluation of visibility at the manufacturing stage and the evaluation of visibility by a user.

Although there are virtually no differences in the irradiation time of the laser beam LB at this time between the 9 μm band and the 10 μm band (10.6 μm), the degree of convexity of dots formed by a laser beam LB whose wavelength is a 10 μm band is about twice the degree of convexity of dots formed by a laser beam LB whose wavelength is a 9 μm band. It is therefore preferable from the standpoint of the visibility of the dots to use a laser beam LB of a 9 μm band wavelength.

The time that the laser beam LB is irradiated onto the X-ray film 112 may be controlled by a pulse width, using the drive signal that drives the laser oscillator 182 as a pulse signal, or by the deflection signal outputted to the beam deflector 184.

In the photosensitive material processing system 110, the barcode (one-dimensional barcode) that serves as the marking pattern MP is set from the data corresponding to the processing history, the processing information, and the photosensitive material information in the lot information file F. Thus, it becomes possible to specify the brand of the X-ray film 112A from the marking pattern MP formed on the X-ray film 112A.

In the present embodiment, the marking pattern MP is set on the basis of at least the brand name of the X-ray film 112A, the slit number, and a cutting number that is the cutting order when the X-ray film 112 is cut to form the X-ray film 112A. Also, in the present embodiment, a characteristic symbol (character, number, symbol, etc.) that is preset in accordance with a predetermined rule between the photosensitive material and a developing device that develops the image-exposed X-ray film 112A is included in the marking pattern MP formed on each X-ray film 112A.

In the present embodiment, this information is barcoded (one-dimensional barcode) and serves as the marking pattern MP.

The production management device 126 stores the barcode serving as the marking pattern MP in the lot information file F. Additionally, the position (marking position) of the marking pattern MP on the X-ray film 112 that is the final mode is set and stored in the lot information file F in the production management device 126.

The marking pattern MP and the marking position may also be set based on the production program and inputted to the production management device 126. Because the marking pattern MP will be different for each X-ray film 112A in a case where the marking pattern MP includes the cutting order of the X-ray film 112A, information necessary to set the marking pattern MP may be read from the lot information file F, the cutting order may be added to this information, and the marking pattern MP (barcode) may be set in the cutting step 122 (processing control device 130) or at the cutting device 140 (cutter control device 166).

As shown in FIG. 24, the laser control device 180 is connected to the processing control device 130 via the cutter control device 166. Thus, the processing conditions of the X-ray film 112 at the cutter device 140, the marking pattern MP (or pattern signal corresponding to the marking pattern) stored in the lot information file F of the production management device 126 or set in the processing control device 130 or the cutter control device 166, and the marking pattern position are inputted to the laser control device 180.

The laser control device 180 outputs the drive signal to the laser oscillator 182 and outputs the deflection signal to the beam deflector 184 in accordance with the pattern signal based on the marking pattern MP. Thus, the laser beam LB deflected in accordance with the marking pattern MP is irradiated onto the X-ray film 112, and the marking pattern MP is formed on the X-ray film 112.

At this time, the laser control device 180 outputs to the beam deflector 184 the deflection signal based on the marking position along the width direction of the X-ray film 112, whereby the marking position along the width direction of the X-ray film 112 becomes the marking position stored in the lot information file F.

A rotary encoder 186 is disposed at, for example, the upper blade roll 158 of the cutter 156 in the cutter device 140. The rotary encoder 186 outputs to the laser control device 180 a pulse signal corresponding to the rotation angle of the upper blade roll 158 sending the X-ray film 112 or the rotation angle of the cutting blade 162.

Thus, it becomes possible for the laser control device 180 to detect the timing at which the X-ray film 112 is cut. That is, the pulse signal inputted from the rotary encoder 186 to the laser control device 180 is read as a cutting completion signal of the X-ray film 112.

A rotary encoder 208 is disposed at the suction drum 150 in the cutter device 140. The rotary encoder 208 outputs a pulse signal corresponding to the rotation angle of the suction drum 150.

The pulse signal that the rotary encoder 208 outputs is inputted to the laser control device 180, and the laser control device 180 monitors, from this pulse signal, the conveyance length of the X-ray film 112, which is the amount of the X-ray film 112 that is sent by the suction drum 150.

The distance between the position at which the X-ray film 112 is cut by the cutting blade 162 of the cutter 156 and the position at which the laser beam LB is irradiated onto the X-ray film 112 by the marking head 178 is predetermined and inputted to the laser control device 180. The laser control device 180 drives the marking head 178 at a timing based on a cutting completion timing inputted from the rotary encoder 186, the conveyance length of the X-ray film 112 and the marking position on the X-ray film 112.

At this time, the laser control device 180 operates the cutting blade 162, monitors the conveyance length of the X-ray film 112 after the X-ray film 112 has been cut, and drives the marking head 178 at a timing at which the position at which the marking pattern MP is formed along the conveyance direction on the X-ray film 112A that is the final mode reaches a position facing the marking head 178.

Figure 28A:
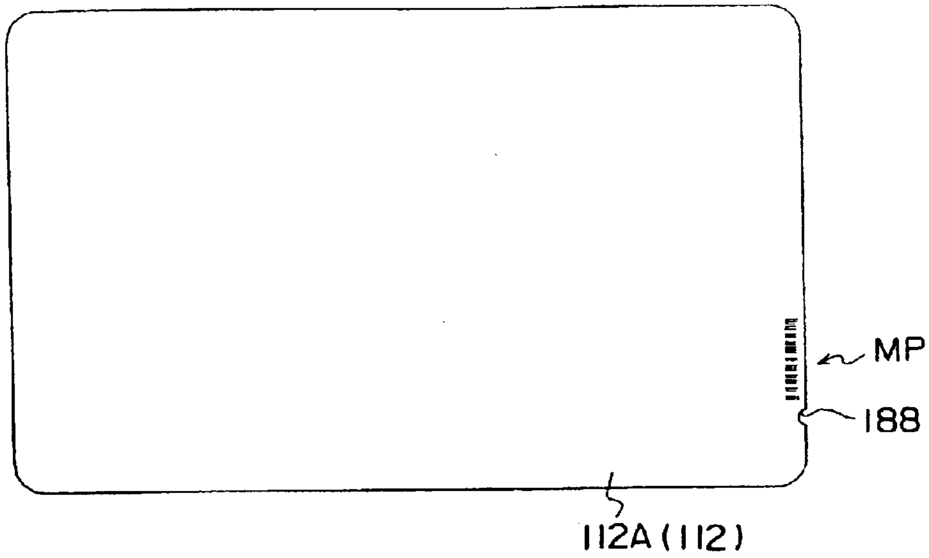
FIGS. 28A and 28B are schematic diagrams showing examples of final X-ray films, with FIG. 28A showing an example in which a marking pattern is formed at a longitudinal-direction end of the X-ray film, and FIG. 28B showing an example in which a marking pattern is formed at a width-direction end of the X-ray film.
Figure 28B:
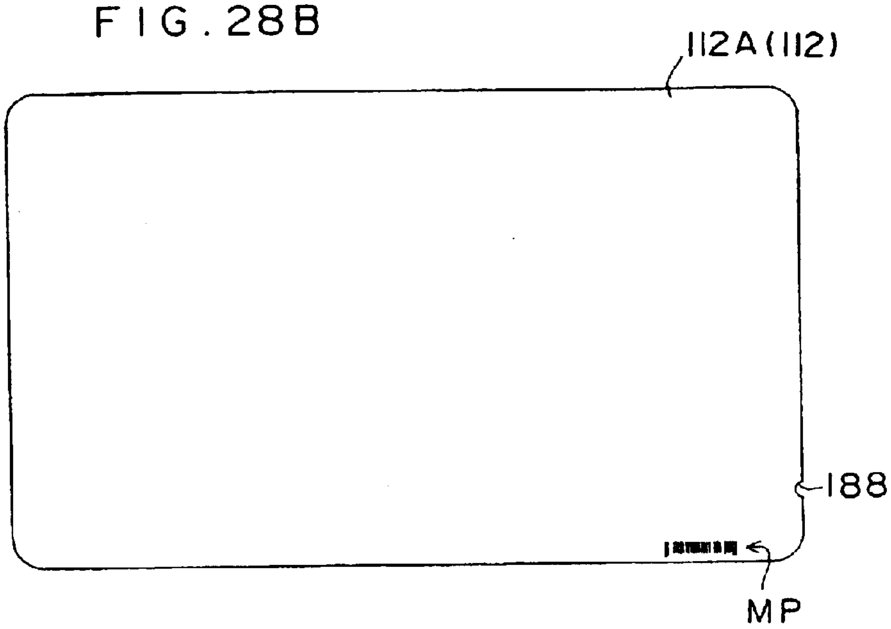

Thus, with respect to the barcode marker 176, when the X-ray film 112 is cut by the cutting blade 162 and processed into the final mode X-ray film 112A, the marking pattern MP is, as shown in FIGS. 28A and 28B, formed at a position on the X-ray film 112A based on the marking position in the lot information file F.

FIGS. 28A and 28B show X-ray films 112A formed in sheets by both longitudinal-direction (left-right direction with respect to the page of FIGS. 28A and 28B) end portions thereof being cut by the cutter device 140. At this time, in the cutter device 140, a cutout (cut mark) 188 is formed, as a positioning reference when image exposure is conducted, at a predetermined position in the final mode X-ray films 112A using the cutting position as a reference. The marking position is a constant position with respect to the cutout 188.

FIG. 28A shows an example in which the marking pattern MP is formed along a short edge at a peripheral portion of the X-ray film 112A, and FIG. 28B shows an example in which the marking pattern MP is formed along a long edge at a peripheral portion of the X-ray film 112.

In the photosensitive material processing system 110 in which the cutter device 140 configured in this manner is disposed, the production management device 126 creates the lot information file F when the photosensitive material information and the processing information, or the photosensitive material information, the processing information, and the processing conditions are inputted to the production management device 126 on the basis of the production program.

Thereafter, the roll 118 of the X-ray film 112 corresponding to the data (roll lot number) within the lot information file F is conveyed in the slitting step 120 and loaded into the slitter device 134 in the processing line disposed with respect to the X-ray film 112, whereby processing with respect to the X-ray film 112 begins.

The slitter device 134 disposed for the slitting step 120 slits the X-ray film 12 along the slitting lines 172 of the slitting pattern 170, whereby the roll 142 of the X-ray film 112 of a predetermined width is formed.

The roll 142 of the X-ray film 112 formed by the slitter device 134 is loaded into the cutter device 140 in the cutting step 122, whereby cutting is conducted by the cutter device 140.

In the cutter device 140, when the leading end portion of the X-ray film 112 that has been pulled out from the roll 142 is wound around the suction drum 150, the suction drum 150 is rotatingly driven. Thus, the X-ray film 112 is conveyed towards the cutter 156 as the X-ray film 112 is pulled out from the roll 142. It should be noted that, in the cutter device 140, the X-ray film 112 is pulled out from the roll 142 in a state in which the emulsion layer 116 faces upward so that the emulsion layer 116 of the X-ray film 112 faces the marking head 178.

The cutter device 140 operates the cutting blade 162 to cut the X-ray film 112 each time the conveyance length of the X-ray film 112 reaches the length (interval between the cutting lines 174, which is a length matching the size of the final mode) set in the processing conditions. The cut X-ray film 112 is successively accommodated and stacked in the stacking tray 164 and sent to the packaging step 124.

Thus, in the packaging step 124, the X-ray film 112A stacked in the stacking tray 164 is made into a product by the packaging device 138 carrying out predetermined packaging.

In the photosensitive material processing system 110, the marking pattern MP and the marking position at which the marking pattern MP is formed are set on the basis of data in the lot information file F. Thus, in the photosensitive material processing system 110, it becomes possible to specify various information with respect to the X-ray film 112 by the marking pattern MP.

The barcode marker 176 is disposed in the cutter device 140. When the laser control device 180 of the barcode marker 176 reads, as marking information, the slitting pattern 170 (interval between the cutting lines 174), the marking position, and the marking pattern MP in the lot information file F at a predetermined timing, the marking head 178 is driven by the pattern signal corresponding to the marking pattern MP, and the marking pattern MP is formed on the X-ray film 112.

At this time, the laser control device 180 monitors the conveyance length of the X-ray film 112 on the basis of the pulse signal corresponding to the rotation angle of the suction drum 150 outputted from the rotary encoder 208. The cutting blade 162 is operated in the cutter 156 to cut the X-ray film 112, whereby the cutting completion pulse is inputted to the laser control device 180 from the rotary encoder 186 and, when the conveyance length (feed amount) of the X-ray film 112 reaches an amount based on the distance from the marking position to the position at which the X-ray film 112 is cut by the cutting blade 162 and the length of the X-ray film 112, the laser control device 180 drives the marking head 178.

Thus, the barcode marker 176 can form the marking pattern MP at a constant position on the X-ray film 112A processed by the cutter device 140.

That is, in the barcode marker 176, after the cutting blade 162 is operated and the X-ray film 112 is cut, the conveyance length of the X-ray film 112 is monitored on the basis of the pulse signal outputted from the rotary encoder 208. When the conveyance length reaches a length that is set on the basis of a length along the conveyance direction of the final mode X-ray film 112, the distance from the position at which the X-ray film 112 is cut by the cutter 156 to the marking position, and the distance along the conveyance path of the X-ray film 112 from the cutting position of the X-ray film 112 in the cutter device 140 to the position facing the marking head 178, the marking head 178 is driven and marking is conducted.

Thus, the marking pattern MP can be formed on the X-ray film 112 so that the marking pattern MP is formed at a constant position along the conveyance direction (the left-right direction with respect to the page of FIGS. 28A and 28B) of the X-ray film 112.

Also, in the cutter device 140, horizontal displacement is prevented using the web edge control sensor 168, the width-direction end portion of the X-ray film 112 passes the constant position, and the position of the marking pattern MP along the direction orthogonal to the conveyance direction of the X-ray film 112A can be formed at a constant position that corresponds to the marking position set in the lot information file F.

Thus, the marking pattern MP is formed at a constant position on each X-ray film 112A in the package packaged by the packaging device 138.

In the photosensitive material processing system 110, the barcode is used as the marking pattern MP formed on each X-ray film 112A. The barcode includes at least the brand of the X-ray film 112A, the slit number, and the cutting order, and it becomes possible to specify the lot information file F from the slit number.

Thus, it becomes possible to precisely grasp the photosensitive material information such as the brand, emulsion number, and roll number of the roll 118 serving as the source for processing the X-ray film 112A included in the lot information file F, the processing history such as the processing line and the processing status, and product class.

Also, the barcode used as the marking pattern MP can be read using the barcode reader. Also, by forming the marking pattern MP at a constant position on each X-ray film 112A, it is possible to automatize the reading of the marking pattern MP from the X-ray film 112A.

Thus, when X-ray photography (image exposure of the X-ray film 112) is conducted using the X-ray film 112, it is possible to automatically and smoothly verify whether the brand is suitable for use (X-ray photography) by reading the marking pattern of the X-ray film 112.

Also, because the marking pattern MP is formed on each X-ray film 112A within a package, it is possible to easily and reliably verify the brand even if it is in use. It is also possible to reliably specify the brand of the X-ray film 112 even when a package contains several brands of the X-ray film 112A.

Moreover, the cutting order becomes clear by adding the cutting order number when the marking pattern MP (barcode) is set, and it is possible to precisely grasp the use amount and remaining amount of the X-ray film 112A, even when the X-ray film 112A is in use, by the X-ray film 112 being stacked in the cutting order.

Also, in the present embodiment, the marking pattern is set and given a characteristic symbol that is preset between the photosensitive material and the developing device, whereby the characteristic symbol included in the barcode (marking pattern MP) is read when the shot X-ray film 112A is developed. Thus, it is possible to conduct appropriate development with respect to the X-ray film 112A. Thus, it is possible to prevent finishing flaws resulting from development being conducted with erroneous, improper processing conditions when the X-ray film 112A is developed.

Because the processing history of the X-ray film 112 can be judged by including the processing history such as the scheduled processing line or the information corresponding to the processing history when the barcode serving as the marking pattern MP is set, even if problems arise in the finishing of the X-ray film 112, the cause of those problems can be easily investigated.

In this manner, various information can be included in the marking pattern MP or the barcode forming the marking pattern MP, and by forming the marking pattern MP at a constant position on each X-ray film 112 processed into a sheet, appropriate, smooth processing of the X-ray film 112 using the marking pattern MP becomes possible.

Because the marking pattern MP or the barcode forming the marking pattern MP can be formed with a small number of characters (number of symbols), even when a large amount of information is included, by coding the information included in the marking pattern MP and compressing the data, the marking pattern MP or the barcode forming the marking pattern MP can be formed in a narrow space that does not effect use of the X-ray film 112. That is, a large amount of information can be added in a limited space on the X-ray film 112A.

Also, various information can be encrypted and formed as the marking pattern MP, whereby it also becomes possible to add special information. Conventionally well known encryption methods of an optional configuration can be used for the encryption in this instance. For example, it becomes possible to limit a shooting device when conducting image shooting using the X-ray film 112A or a developing device when developing X-ray film 112A that has been image-shot, and it becomes possible to restrict more appropriate processing of the X-ray film 112, such as image shooting and development.

Sixth Embodiment

A sixth embodiment of the invention will be described below. The basic configuration of the sixth embodiment is the same as that of the fifth embodiment, and parts that are the same as those in the fifth embodiment will be given the same reference numerals and description of the parts will be omitted.

Figure 29:
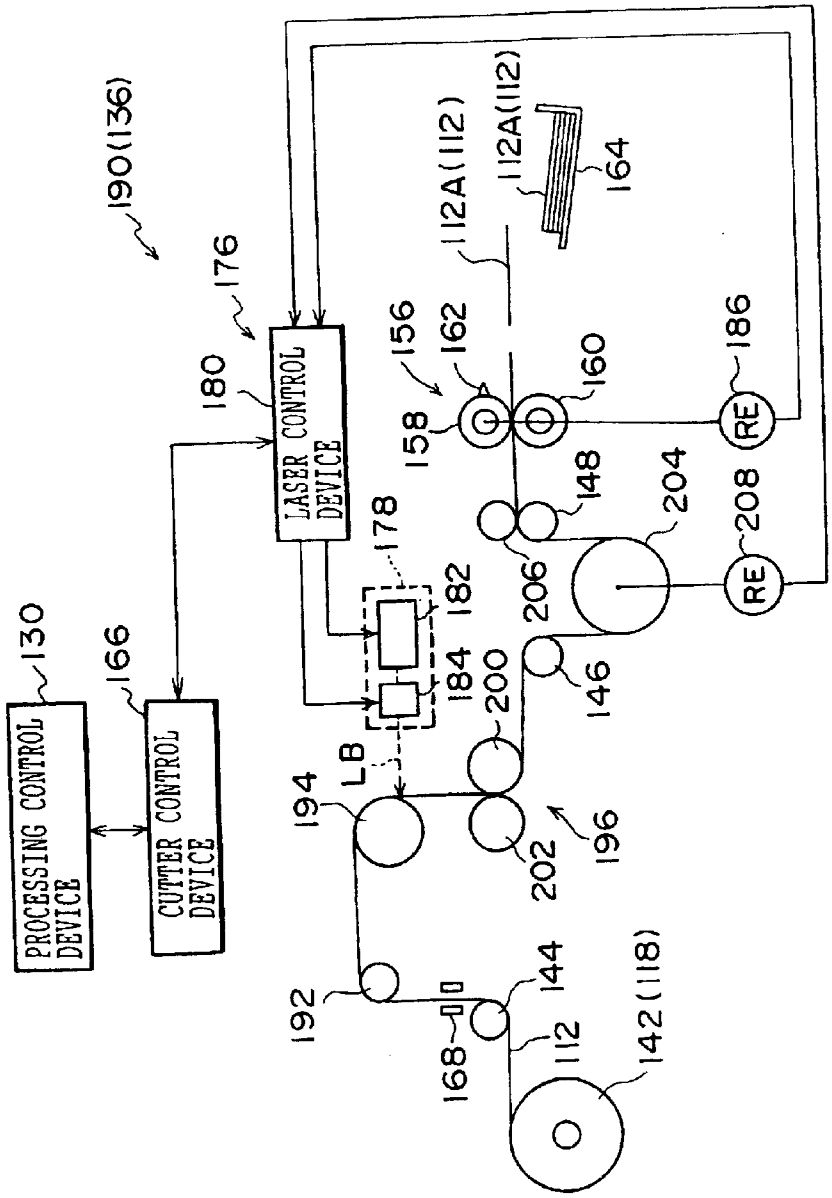
FIG. 29 is a schematic structural diagram of a cutter device used in a sixth embodiment.

FIG. 29 shows the schematic configuration of the cutter device 136 (referred to below as "cutter device 190") used in the sixth embodiment. The cutter device 190 includes a slitter function in addition to the barcode marker 176. Thus, the cutter device 190 doubles as the slitter device 134 disposed for the slitting step 120 and includes the function of the cutter device 136 of the cutting step 122, and also slits the X-ray film 112 slit in the slitting step 120 so that it is also possible to form a small-sized X-ray film 112A.

A pass roll 192 is disposed above the pass roll 144 in the cutter device 190, and the X-ray film 112 is oriented in the horizontal direction by the X-ray film 112 being wound around the pass roll 192.

A print roll 194 is disposed downstream of the pass roll 192, and the marking head 178 of the barcode marker 176 is disposed facing the X-ray film 112 wound around the print roll 194.

Thus, in the cutter device 190, the laser beam LB is irradiated towards the X-ray film wound around the print roll 194 to form the marking pattern MP.

A slitter 196 is disposed below the print roll 194. The slitter 196 includes slitting blades 200 and 202, which are disposed as a pair. When the X-ray film 112 is wound around the slitting blade 200 and sent towards the small roll 146, the X-ray film is slit at a predetermined position in the width direction along the slitting lines 172 of the slitting pattern 170 by the slitting blades 200 and 202.

A suction drum 204 is disposed between the small rolls 146 and 148 in the cutter device 190. The X-ray film 112 is sucked and retained by being wound around the suction drum 204, and sent at a conveyance speed corresponding to the rotational speed of the suction drum 204.

A roll 206 is disposed facing the small roll 148. The X-ray film 112 is nipped between the small roll 148 and the roll 206 and sent towards the cutter 156. The cutter 156 operates the cutting blade 162 to cut the X-ray film 112 each time an amount of the X-ray film 112 sent by the upper blade roll 158 and the lower blade roll 160 reaches a predetermined amount.

The cutter control device 166 disposed in the cutter device 190 controls the cutting of the X-ray film 112 along the cutting lines 174 and controls the slitting of the X-ray film 112 along the slitting lines 172 of the slitting pattern 170.

The rotary encoder 208 is disposed at the suction drum 204 in the cutter device 190, and a pulse signal corresponding to the rotation angle of the suction drum 204 is inputted to the laser control device 180.

The laser control device 180 disposed in the cutter device 190 uses the pulse signal inputted from the rotary encoder 208 to monitor the conveyance length of the X-ray film 112. Each time the conveyance length reaches a predetermined length, the laser control device 180 drives the marking head 178 to form the marking pattern MP on the X-ray film 112.

At this time, in the laser control device 180, the cutter 156 operates the cutting blade 162 to cut the X-ray film 112. When the cutting completion pulse outputted from the rotary encoder 186 at that timing is detected, the marking head 178 is driven each time the conveyance length of the X-ray film 112 after the cutting completion pulse has been detected reaches the predetermined length, whereby the marking pattern MP is formed on the X-ray film 112 before it is slit by the slitter 196.

At this time, the barcode marker 176 scans the laser beam emitted from the marking head 178 along the width direction of the X-ray film 112, whereby the marking pattern MP is formed at both sides of the slitting line 172 along which the X-ray film 112 is slit by the slitter 196.

Figure 30A:
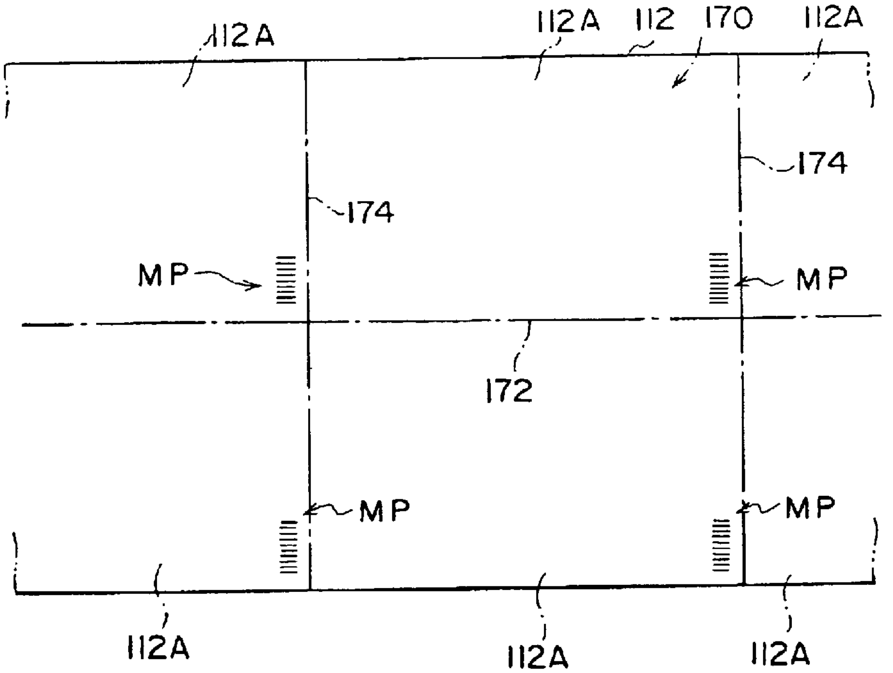
FIGS. 30A and 30B are schematic diagrams of an X-ray film 112 showing examples of marking patterns formed in the sixth embodiment.
Figure 30B:
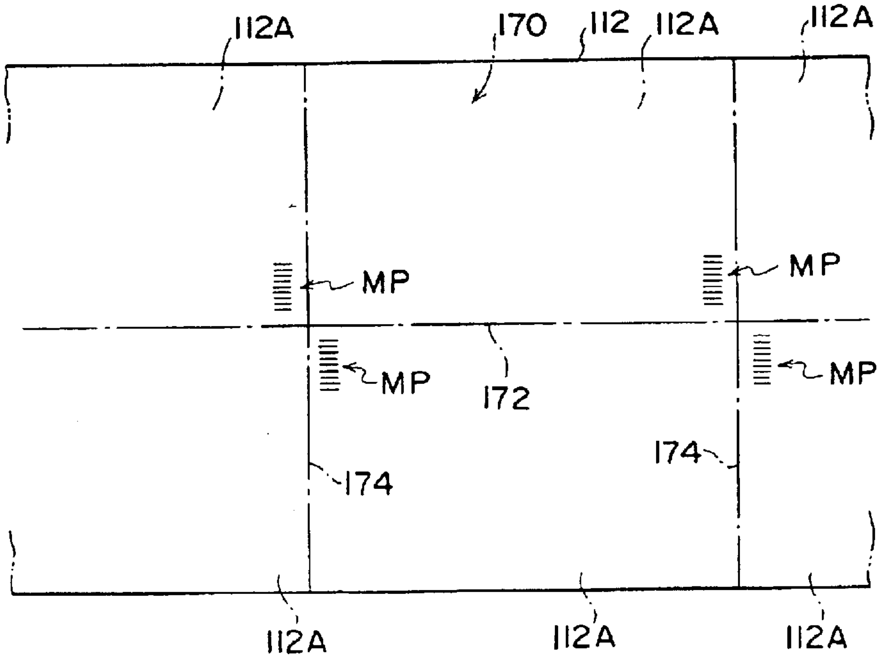

Thus, as shown in FIGS. 30A and 30B, the marking patterns MP are formed at predetermined positions along the width direction of the X-ray film 112 in each region enclosed by the slitting line 172 and the cutting lines 174. It should be noted that FIGS. 30A and 30B show the slitting pattern 170 when the X-ray film 112 is divided along the slitting line 172.

The marking patterns MP formed at the X-ray film 112 in the cutter device 190 may, as shown in FIG. 30A, be formed with the same orientation at the predetermined positions on both sides of the slitting line 172 or may, as shown in FIG. 30B, be formed in a staggered manner with the slitting line 172 sandwiched therebetween. As shown in FIG. 30B, when the marking patterns MP are formed in a staggered manner with the slitting line 172 sandwiched therebetween, the marking patterns MP rotated by 180° are alternatingly formed at both sides of the slitting line 172.

In the cutter device 190 configured in this manner, when the roll 142 is loaded and the processing conditions with respect to the roll 142 (X-ray film 112) are read, set-up changing (setting of the slitting position and cutting position, etc.) is conducted on the basis of the processing conditions.

In the cutter device 190, the X-ray film 112 is conveyed while being pulled out from the roll 142 by rotatingly driving the suction drum 204, and when the X-ray film 112 passes the slitter 196, the X-ray film 112 is slit by the slitting blades 200 and 202.

Thereafter, in the cutter device 190, when the X-ray film 112 sent by the suction drum 204 passes the cutter 156, the X-ray film 112 is processed into sheets by the X-ray film 112 being cut at intervals corresponding to the cutting lines 174.

The laser control device 180 of the barcode marker 176 monitors the conveyance length of the X-ray film 112 from the pulse signal outputted from the rotary encoder 208 disposed at the suction drum 204. The marking head 178 is driven on the basis of the cutting completion pulse outputted from the rotary encoder 186 each time the conveyance length of the X-ray film 112 after the cutting blade 162 of the cutter 156 is operated reaches the predetermined length, and the marking patterns MP are formed on the X-ray film 112.

At this time, using the length along the conveyance direction of the final mode X-ray film 112 (cutting line 174 intervals), the length of the conveyance path of the X-ray film 112 from the position at which the X-ray film is cut by the cutter 156 to the position at which the X-ray film is marked by the marking head 178, and the conveyance-direction end portion resulting from the X-ray film 112A being cut by the cutter 156 (cutting blade 162) as references, the laser control device 180 drives the marking head 178 when the conveyance length of the X-ray film 112 reaches the conveyance length set on the basis of the interval from the end portion to the marking position.

That is, the barcode marker 176 uses the conveyance-direction end portion of the X-ray film 112 cut by the cutter 156 as a reference to form the marking pattern MP.

Thus, similar to the cutter device 140, the marking pattern MP can be formed on the X-ray film 112 prior to cutting, so that the X-ray film 112A having the marking pattern MP formed at a constant position is also obtained in the cutter device 190.

In this manner, the marking pattern MP can be formed at the constant position on the X-ray film 112A by forming the marking pattern MP when the conveyance length after the X-ray film 112 is cut reaches a length set on the basis of the conveyance-direction length of the final X-ray film 112, the length of the conveyance path of the X-ray film 112 from the position at which the X-ray film 112 is cut by the cutter 156 to the position at which the X-ray film 112 is marked by the marking head 178, and the marking position with respect to the end portion along the conveyance direction of the X-ray film 112A, while the conveyance length of the X-ray film 112A is appropriately monitored when the X-ray film 112 is cut to form the sheets of X-ray film 112A.

Thus, automatization of the processing of the X-ray film 112A on the basis of the marking pattern MP formed on the X-ray film 112A becomes possible.

It should be noted that the above-described embodiment is not intended to limit the configuration of the invention. For example, although description was given of an example in which the cutter devices 140 and 190 were used in the cutting step 122 of the photosensitive material processing system 110 disposed with the cutting step 122, the slitting step 120, and the packaging step 124, the invention can be used in an optional cutter device as long as the device forms the marking pattern MP on the X-ray film 112 when the rolled X-ray film 112 is cut.

Although a barcode (one-dimensional barcode) was used as the marking pattern MP in the present embodiment, the invention is not limited thereto. A two-dimensional barcode, or characters, numbers, and symbols coded and set on the basis of a preset optional coding method can be used. Moreover, the marking pattern MP may be one that is formed by encrypting by a conventionally well-known optional method.

Also, although the present embodiment was described using the X-ray film 112 as the photosensitive material, the photosensitive material to which the invention is applied is not limited to the X-ray film 112. Photographic film of an optional configuration using PET or the like as a support may also be used. Additionally, the invention can also be applied to other photographic photosensitive material of an optional configuration in which an emulsion layer is formed on a support, such as printing paper, and to a processing device of an optional configuration that conveys, cuts, and processes into sheets the photographic photosensitive material.

As described above, according to the present embodiment, a marking pattern that allows each sheet of the photosensitive material to be specified can be formed at a constant position on each final mode photosensitive material. With this photosensitive material formed with the marking pattern, there are excellent effects in that it becomes possible to recognize, at an optional timing, various information recorded by the marking pattern from the marking pattern of the processed final mode photosensitive material, and proper use of the photosensitive material becomes possible.

What is claimed is:

1. A laser marking method for forming a visible marking pattern on a photosensitive material, the method comprising the steps of:

supplying a photosensitive material comprising a base layer having formed on a first and second surface thereof an emulsion layer;

irradiating a laser beam onto the emulsion layer to thereby generate air bubbles inside the emulsion layer; and stopping the irradiation of the laser beam at a point in time when the emulsion layer has become convex due to the generation of the air bubbles, whereby a convex dot pattern including plural minute air bubbles inside the emulsion layer is formed on the photosensitive material.

2. A laser marking method for forming a visible marking pattern on a photosensitive material, the method comprising the steps of:

supplying a photosensitive material comprising a base layer having formed on a surface thereof an emulsion layer;

irradiating a laser beam onto the emulsion layer to thereby generate air bubbles inside the emulsion layer; and stopping the irradiation of the laser beam at a point in time when the emulsion layer has become convex due to the generation of the air bubbles, whereby a convex dot pattern including plural minute air bubbles inside the emulsion layer is formed on the photosensitive material, wherein an irradiation time of the laser beam is controlled so that a height of the convex dot pattern formed on the surface of the emulsion layer of the photosensitive material is 10 $\mu$m or less from the surface and the minute air bubbles numerously formed inside the convex dot pattern have a diameter of 1 to 5 $\mu$m.

3. The laser marking method of claim 1, wherein the irradiation of the laser beam is conducted so that a space is not generated at a boundary between the base layer and the emulsion layer.

4. A laser marking method for forming a visible marking pattern on a photosensitive material, the method comprising the steps of:

supplying a photosensitive material comprising a base layer having formed on a surface thereof an emulsion layer;

irradiating a laser beam onto the emulsion layer to thereby generate air bubbles inside the emulsion layer; and stopping the irradiation of the laser beam at a point in time when the emulsion layer has become convex due to the generation of the air bubbles, whereby a convex dot pattern including plural minute air bubbles inside the emulsion layer is formed on the photosensitive material, wherein an oscillation wavelength of the laser beam is set to be from 9.2 $\mu$m to 9.8 $\mu$m.

5. A photosensitive material including a base layer and an emulsion layer disposed on a surface of the base layer, wherein a visible dot pattern is formed on the emulsion layer by irradiating a laser beam onto the emulsion layer, the dot pattern being convexly formed with a height of 10 $\mu$m or less from a surface of the emulsion layer and minute air bubbles having a diameter of 1 to 5 $\mu$m being numerously formed therein.

6. The photosensitive material of claim 5, wherein a space is not included at a boundary between the base layer and the emulsion layer.

7. A laser marking method for forming a visible marking pattern comprising a dot arrangement on a photosensitive material, the method comprising the steps of;

supplying a photosensitive material comprising a support having formed on at least one side thereof an emulsion layer;

setting a laser oscillator so that it is capable of irradiating a laser beam onto the emulsion layer;

using the laser oscillator to irradiate the laser beam in a spot onto the emulsion layer to impart a predetermined amount of energy to the photosensitive material, wherein numerous air bubbles are generated inside the emulsion layer by the predetermined amount of energy being imparted within a predetermined time, to thereby form visible dots.

8. The laser marking method of claim 7, wherein the predetermined time is set on the basis of the photosensitive material and the wavelength of the laser beam irradiated by the laser oscillator.

9. The laser marking method of claim 7, further including the step of developing the photosensitive material, wherein the predetermined time is short to the extent that separation is not generated between the support and the emulsion layer after development.

10. The laser marking method of claim 7, wherein the predetermined amount energy is imparted to the photosensitive material and the dots are formed in a state in which the laser beam scans a surface of the emulsion layer.

11. A laser marking method for forming a marking pattern on a photosensitive material by irradiating a laser beam onto the photosensitive material, the method comprising the steps of:

conveying a photosensitive material in a predetermined conveyance direction;

disposing a laser oscillator and a condenser so as to condense a laser beam emitted from the laser oscillator into a spot on a surface of the conveyed photosensitive material; and irradiating the laser beam through the condenser onto the photosensitive material so that the surface of the photosensitive material is positioned further away from the laser oscillator than a focal point of the laser beam converged by the condenser, whereby the marking pattern is formed on the photosensitive material.

12. The laser marking method of claim 11, wherein the laser beam is irradiated while scanning the surface in a direction substantially orthogonal to the predetermined conveyance direction.

13. The laser marking method of claim 11, wherein the laser beam is irradiated onto the surface of the photosensitive material at predetermined intervals with respect to the predetermined conveyance direction of the photosensitive material.

14. The laser marking method of claim 11, wherein the photosensitive material includes a support layer and an emulsion layer formed on the support layer.

15. A laser marking method for forming a marking pattern on a photosensitive material, the method comprising the steps of:

supplying a photosensitive material comprising a support, a surface layer including an emulsion layer formed on one side of the support, and an undersurface layer formed on another side of the support to prevent diffuse reflection of light transmitted through the emulsion layer; and irradiating a laser beam in a sport onto the undersurface layer of the photosensitive material to generate air bubbles in the undersurface layer, whereby the marking pattern is formed on the undersurface layer of the photosensitive material.

16. The laser marking method of claim 15, wherein the marking pattern formed on the undersurface layer is a mirror image of an intended pattern.

17. The laser marking method of claim 15, wherein the marking pattern formed on the undersurface layer is visible from the surface layer.

18. The laser marking method of claim 15, wherein the undersurface layer is a layer that includes gelatin.

19. A photosensitive material processing method for cutting a photosensitive material wound in a roll into a predetermined size to make sheets, the method comprising the steps of:

pulling the photosensitive material out from a roll of the photosensitive material and conveying the photosensitive material along a predetermined path;

irradiating a laser beam onto a recording position that is a predetermined distance from a position at which the conveyed photosensitive material is to be cut, to thereby form, on the photosensitive material, a marking pattern including identification information specifying the photosensitive material; and cutting the photosensitive material to a predetermined length along the conveyance path.

20. The photosensitive material processing method of claim 19, wherein the photosensitive material is cut per conveyance of a predetermined length along the conveyance path.

21. The photosensitive material processing method of claim 19, further including the step of slitting the photosensitive material to a predetermined width with respect to a width direction orthogonal to a conveyance direction.

22. The photosensitive material processing method of claim 21, wherein another recording position is a predetermined distance from a position at which the photosensitive material is to be slit in the width direction.

23. The photosensitive material processing method of claim 19, further including the step of measuring a conveyance amount of the photosensitive material, wherein the recording position is determined on the basis of the measurement result.

24. A photosensitive material processing device for cutting a photosensitive material wound in a roll into a predetermined size to make sheets, the device comprising:

a conveyance mechanism for pulling the photosensitive material out from a roll of the photosensitive material and conveying the photosensitive material along a predetermined path;

a laser beam oscillator for irradiating a laser beam onto the photosensitive material, the laser beam oscillator being disposed at a predetermined position on the conveyance path and forming, on the photosensitive material, a marking pattern including identification information specifying the photosensitive material by irradiating the laser beam onto a recording position that is a predetermined distance from a position at which the conveyed photosensitive material is to be cut; and a cutter for cutting the photosensitive material to a predetermined length along the conveyance path.

25. The photosensitive material processing device of claim 24, further including a slitter for slitting the photosensitive material to a predetermined width with respect to a width direction orthogonal to a conveyance direction.

26. The photosensitive material processing device of claim 25, wherein another recording position is a predetermined distance from a position at which the photosensitive material is to be slit in the width direction.

27. The photosensitive material processing device of claim 24, further including a measuring instrument for measuring a conveyance amount of the photosensitive material, wherein the recording position is determined on the basis of the measurement result.

28. A photosensitive material, in which a photosensitive material wound in a roll is cut into a predetermined size and processed into sheets, the photosensitive material including a marking pattern formed by a laser beam being irradiated onto a constant position at a peripheral portion of the sheet, the marking pattern including identification information with which the photosensitive material can be specified.

29. A laser marking method for forming a visible marking pattern on a photosensitive material, the method comprising the steps of:

supplying a photosensitive material comprising a base layer having formed on a surface thereof an emulsion layer, wherein said emulsion comprises gelatin;

irradiating a laser beam onto the emulsion layer to thereby generate air bubbles inside the emulsion layer; and stopping the irradiation of the laser beam at a point in time when the emulsion layer has become convex due to the generation of the air bubbles, whereby a convex dot pattern including plural minute air bubbles inside the emulsion layer is formed on the photosensitive material.

* * * * *